(12) United States Patent
Kim et al.

(10) Patent No.: US 11,869,415 B2
(45) Date of Patent: Jan. 9, 2024

(54) SWEEP SIGNAL DRIVER AND DISPLAY DEVICE INCLUDING THE SAME

(71) Applicant: Samsung Display Co., LTD., Yongin-si (KR)

(72) Inventors: Hyun Joon Kim, Hwaseong-si (KR); Jung Hwan Hwang, Seongnam-si (KR); Kyung Hoon Chung, Yongin-si (KR); Jun Ki Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/719,930

(22) Filed: Apr. 13, 2022

(65) Prior Publication Data

US 2023/0107775 A1    Apr. 6, 2023

(30) Foreign Application Priority Data

Sep. 24, 2021    (KR) .......................... 10-2021-0126468

(51) Int. Cl.
*G09G 3/32*    (2016.01)
*H03K 17/687*    (2006.01)

(52) U.S. Cl.
CPC ........... *G09G 3/32* (2013.01); *H03K 17/6871* (2013.01); *G09G 2310/0286* (2013.01); *G09G 2310/08* (2013.01); *G09G 2320/064* (2013.01)

(58) Field of Classification Search
CPC ............. G09G 3/32; G09G 2310/0286; G09G 2310/08; G09G 2320/064
See application file for complete search history.

(56) References Cited

U.S. PATENT DOCUMENTS

| | | | | |
|---|---|---|---|---|
| 10,950,157 B1* | 3/2021 | Kim | ....................... | G11C 19/28 |
| 11,056,047 B2* | 7/2021 | Shigeta | ................ | G09G 3/3233 |
| 11,100,840 B2* | 8/2021 | Kim | .................... | G09G 3/2014 |
| 11,164,532 B2* | 11/2021 | Kwon | ................. | G09G 3/3266 |
| 11,222,573 B2* | 1/2022 | Kim | ..................... | G09G 3/3266 |
| 11,263,962 B2* | 3/2022 | Park | ..................... | G09G 3/3266 |
| 11,443,675 B2* | 9/2022 | Chang | ..................... | G09G 3/32 |
| 11,495,171 B2* | 11/2022 | Kim | ........................ | G09G 3/32 |
| 11,508,287 B2* | 11/2022 | Kim | .................... | G09G 3/2081 |

(Continued)

FOREIGN PATENT DOCUMENTS

| | | |
|---|---|---|
| KR | 10-2006-0020502 A | 3/2006 |
| KR | 10-2006-0099597 A | 9/2006 |
| KR | 10-2021-0087873 A | 7/2021 |

*Primary Examiner* — Michael J Jansen, II
(74) *Attorney, Agent, or Firm* — Lewis Roca Rothgerber Christie LLP

(57) ABSTRACT

A sweep signal driver includes: a kth stage to output a kth emission signal to a kth emission line, and a kth sweep signal to a kth sweep signal line, the kth stage including: first, second, and third pull-up nodes; a node connection circuit between the first pull-up node and the second pull-up node, and between the first pull-up node and the third pull-up node; a first output circuit to output a sweep clock signal of a sweep clock terminal to a first output terminal connected to the kth sweep signal line when the third pull-up node has a gate-on voltage; and a second output circuit to output a gate-on voltage to a second output terminal connected to the kth emission line when the second pull-up node has a gate-on voltage. A pulse of the kth sweep signal linearly changes from a gate-off voltage to the gate-on voltage.

20 Claims, 22 Drawing Sheets

(56) References Cited

U.S. PATENT DOCUMENTS

| | | | |
|---|---|---|---|
| 11,521,539 B2* | 12/2022 | Li | G11C 19/28 |
| 11,551,605 B2* | 1/2023 | Kim | G09G 3/2014 |
| 2019/0066604 A1* | 2/2019 | Kong | G09G 3/3291 |
| 2020/0265777 A1* | 8/2020 | Shigeta | G09G 3/2081 |
| 2020/0312216 A1* | 10/2020 | Kim | G09G 3/32 |
| 2020/0394953 A1* | 12/2020 | Kim | G09G 3/32 |
| 2020/0394968 A1* | 12/2020 | Kwon | G09G 3/3291 |
| 2021/0118347 A1* | 4/2021 | Wang | G09G 3/3266 |
| 2021/0210002 A1* | 7/2021 | Kim | G09G 3/2014 |
| 2021/0287585 A1* | 9/2021 | Kim | G11C 19/28 |
| 2021/0366358 A1* | 11/2021 | Li | G09G 3/2092 |
| 2021/0366408 A1* | 11/2021 | In | G09G 3/3266 |
| 2021/0375185 A1* | 12/2021 | Kim | G09G 3/32 |
| 2021/0407381 A1* | 12/2021 | Park | G09G 3/3233 |
| 2022/0114938 A1* | 4/2022 | Feng | G09G 3/20 |
| 2022/0130313 A1* | 4/2022 | Kim | G09G 3/3266 |
| 2022/0148511 A1* | 5/2022 | Kim | G09G 3/3233 |
| 2022/0208107 A1* | 6/2022 | Kim | G09G 3/20 |
| 2022/0223085 A1* | 7/2022 | Chang | G09G 3/20 |
| 2022/0277688 A1* | 9/2022 | Park | G09G 3/3233 |

* cited by examiner

SWEEP SIGNAL DRIVER AND DISPLAY DEVICE INCLUDING THE SAME

CROSS-REFERENCE TO RELATED APPLICATION

This application claims priority to, and the benefit of, Korean Patent Application No. 10-2021-0126468, filed on Sep. 24, 2021 in the Korean Intellectual Property Office (KIPO), the entire content of which is incorporated by reference herein.

BACKGROUND

1. Field

Aspects of one or more embodiments of the present disclosure relate to a sweep signal driver, and a display device including the same.

2. Description of the Related Art

As information society develops, the demand for display devices for displaying images has increased and diversified. The display devices may be flat panel display devices, such as liquid crystal displays (LCDs), field emission displays (FEDs), and light emitting displays (LEDs).

A light emitting display device may include an organic light emitting display device including an organic light emitting diode element as a light emitting element, or a light emitting diode display device including an inorganic light emitting diode element such as a light emitting diode (LED) as a light emitting element. In a case of the organic light emitting display device, luminance or gray levels of light of the organic light emitting diode element may be adjusted by adjusting a magnitude of a driving current applied to the organic light emitting diode element. However, because a wavelength of light emitted from the inorganic light emitting diode element may change depending on a driving current, when the inorganic light emitting diode element is driven in the same manner as that of the organic light emitting diode element, quality of an image may be deteriorated.

The above information disclosed in this Background section is for enhancement of understanding of the background of the present disclosure, and therefore, it may contain information that does not constitute prior art.

SUMMARY

Aspects of some embodiments of the present disclosure are directed to a display device capable of decreasing or preventing deterioration of the quality of an image due to a change in a wavelength of light emitted from an inorganic light emitting diode element depending on a driving current applied to the inorganic light emitting diode element.

However, the present disclosure is not limited to the aspects and features set forth above. The above and other aspects and features of the present disclosure will become more apparent to those having ordinary skill in the art to which the present disclosure pertains by referring to the detailed description of the present disclosure given below with reference to the figures.

According to one or more embodiments of the present disclosure, a sweep signal driver includes: a plurality of stages configured to sequentially output emission signals to emission lines, and sequentially output sweep signals to sweep signal lines, the plurality of stages including a kth stage configured to output a kth emission signal to a kth emission line, and output a kth sweep signal to a kth sweep signal line, where k is a natural number. The kth stage includes: a first pull-up node; a second pull-up node; a third pull-up node; a node connection circuit between the first pull-up node and the second pull-up node, and between the first pull-up node and the third pull-up node; a first output circuit configured to output a sweep clock signal of a sweep clock terminal to a first output terminal connected to the kth sweep signal line when the third pull-up node has a gate-on voltage; and a second output circuit configured to output a gate-on voltage to a second output terminal connected to the kth emission line when the second pull-up node has a gate-on voltage. A pulse of the kth sweep signal linearly changes from a gate-off voltage to the gate-on voltage.

In an embodiment, a pulse width of the kth emission signal may be greater than a pulse width of the kth sweep signal.

In an embodiment, the kth stage may further include a pull-down node electrically disconnected from the first pull-up node, the second pull-up node, and the third pull-up node, and each of the first output circuit and the second output circuit may be configured to output a gate-off voltage when the pull-down node has a gate-on voltage.

In an embodiment, the first output circuit may include: a first pull-up transistor including a gate electrode connected to the third pull-up node, a first electrode connected to the first output terminal, and a second electrode connected to the sweep clock terminal; a first pull-down transistor including a gate electrode connected to the pull-down node, a first electrode connected to a gate-off voltage terminal configured to receive the gate-off voltage, and a second electrode connected to the first output terminal; and a first capacitor between the third pull-up node and the first output terminal.

In an embodiment, the second output circuit may include: a second pull-up transistor including a gate electrode connected to the second pull-up node, a first electrode connected to the second output terminal, and a second electrode connected to a gate-on voltage terminal configured to receive the gate-on voltage; and a second pull-down transistor including a gate electrode connected to the pull-down node, a first electrode connected to a gate-off voltage terminal configured to receive the gate-off voltage, and a second electrode connected to the second output terminal.

In an embodiment, the kth stage may further include a pull-up node control circuit configured to supply a start signal or a carry signal of a start terminal to the first pull-up node according to a first emission clock signal input to a first emission clock terminal.

In an embodiment, the pull-up node control circuit may include a first transistor including a gate electrode connected to the first emission clock terminal, a first electrode connected to the first pull-up node, and a second electrode connected to the start terminal.

In an embodiment, the kth stage may further include a first control node control circuit configured to supply the gate-on voltage to a first control node according to the first emission clock signal, and supply a gate-off voltage of the first emission clock signal to the first control node according to a voltage of the first pull-up node.

In an embodiment, the first control node control circuit may include: a second transistor including a gate electrode connected to the first emission clock terminal, a first electrode connected to the first control node, and a second electrode connected to a gate-on voltage line configured to receive the gate-on voltage; a third transistor including a gate electrode connected to the first pull-up node, a first electrode connected to the first emission clock terminal, and a second electrode; and a fourth transistor including a gate electrode connected to the first pull-up node, a first electrode connected to the second electrode of the third transistor, and a second electrode connected to the first control node.

In an embodiment, the kth stage may further include a second control node control circuit configured to supply a gate-off voltage to a second control node when the first control node has a gate-on voltage, and supply a second emission clock signal of a second emission clock terminal to the second control node when the second pull-up node has a gate-on voltage.

In an embodiment, the second control node control circuit may include: a fifth transistor including a gate electrode connected to the first control node, a first electrode connected to a gate-off voltage terminal configured to receive the gate-off voltage, and a second electrode connected to the second control node; a sixth transistor including a gate electrode connected to the second pull-up node, a first electrode connected to the second control node, and a second electrode connected to the second emission clock terminal; and a second capacitor between the second pull-up node and the second control node.

In an embodiment, the node connection circuit may be located between the first control node and a third control node, and the kth stage may further include a pull-down node control circuit configured to supply a gate-on voltage of the second emission clock signal to the pull-down node when the third control node has a gate-on voltage and the second emission clock signal of the second emission clock terminal has the gate-on voltage.

In an embodiment, the pull-down node control circuit may be configured to supply a gate-off voltage to the pull-down node when the first pull-up node has a gate-on voltage.

In an embodiment, the pull-down node control circuit may include: a seventh transistor including a gate electrode connected to the third control node, a first electrode connected to the second emission clock terminal, and a second electrode connected to a fourth control node; an eighth transistor including a gate electrode connected to the second emission clock terminal, a first electrode connected to the fourth control node, and a second electrode connected to the pull-down node; a ninth transistor including a gate electrode connected to the first pull-up node, a first electrode connected to a gate-off voltage terminal configured to receive the gate-off voltage, and a second electrode connected to the pull-down node; a third capacitor between the third control node and the fourth control node; and a fourth capacitor between the pull-down node and the gate-off voltage terminal.

In an embodiment, the node connection circuit may include: a tenth transistor including a gate electrode connected to a gate-off voltage terminal configured to receive the gate-off voltage, a first electrode connected to the first pull-up node, and a second electrode connected to the second pull-up node; an eleventh transistor including a gate electrode connected to a gate-on voltage terminal, a first electrode connected to the first pull-up node, and a second electrode connected to the third pull-up node; and a twelfth transistor including a gate electrode connected to the gate-on voltage terminal, a first electrode connected to the third control node, and a second electrode connected to the first control node.

According to one or more embodiments of the present disclosure, a display device includes: a display panel including: data lines; sweep signal lines and pulse width modulation (PWM) emission lines crossing the data lines; and sub-pixels connected to the data lines, the sweep signal lines, and the PWM emission lines; a source driver configured to apply data voltages to the data lines; and a sweep signal driver including a plurality of stages configured to sequentially output PWM emission signals to the PWM emission lines, and sequentially output sweep signals to the sweep signal lines. The plurality of stages includes a kth stage configured to output a kth PWM emission signal to a kth PWM emission line, and output a kth sweep signal to a kth sweep signal line, where k is a natural number. A pulse of the kth PWM emission signal includes a gate-on voltage; a pulse of the kth sweep signal linearly changes from a gate-off voltage to the gate-on voltage; and a pulse width of the kth PWM emission signal is greater than a pulse width of the kth sweep signal.

In an embodiment, the display device may further include an emission signal driver configured to sequentially output pulse amplitude modulation (PAM) emission signals to PAM emission lines that cross the data lines. A pulse of a kth PAM emission signal output to a kth PAM emission line of the PAM emission lines may include a gate-on voltage, and a pulse width of the kth PAM emission signal may be the same as the pulse width of the kth sweep signal.

In an embodiment, the pulse of the kth PWM emission signal may overlap with the pulse of the kth sweep signal and the pulse of the kth PAM emission signal.

In an embodiment, the kth stage may include: a first pull-up node, a second pull-up node, and a third pull-up node; a node connection circuit between the first pull-up node and the second pull-up node, and between the first pull-up node and the third pull-up node; a first output circuit configured to output a sweep clock signal of a sweep clock terminal to a first output terminal connected to the kth sweep signal line when the third pull-up node has a gate-on voltage; and a second output circuit configured to output a gate-on voltage to a second output terminal connected to the kth emission line when the second pull-up node has a gate-on voltage.

In an embodiment, the kth stage may further include a pull-down node electrically disconnected from the first pull-up node, the second pull-up node, and the third pull-up node, and each of the first output circuit and the second output circuit may be configured to output a gate-off voltage when the pull-down node has a gate-on voltage.

According to one or more embodiments of the present disclosure, luminance of light emitted from an inorganic light emitting element may be controlled by adjusting a period in which a driving current is applied to the inorganic light emitting element while maintaining or substantially maintaining the driving current to be constant or substantially constant. Therefore, it may be possible to decrease or prevent deterioration of the quality of an image due to a change in a wavelength of light emitted from the inorganic light emitting element depending on the driving current applied to the inorganic light emitting element.

According to one or more embodiments of the present disclosure, one stage of a sweep signal driver may concurrently (e.g., simultaneously) output a sweep signal and a PWM emission signal, and thus, an area of a scan driver may be decreased.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
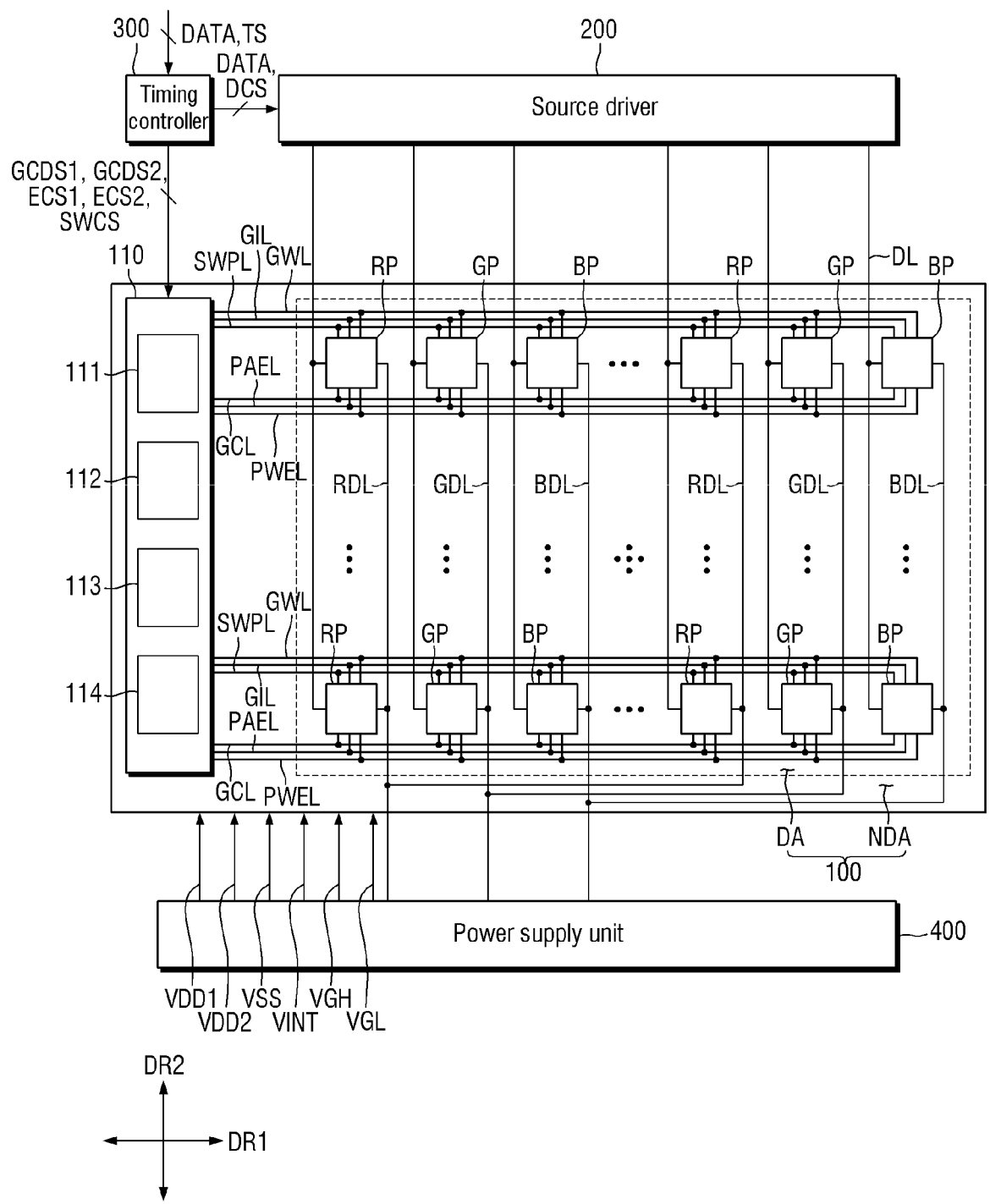
FIG. 1 is a block diagram illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated degrees or at other orientations) and the spatially relative descriptors used herein should be interpreted accordingly. For example, when a first part is described as being arranged "on" a second part, this indicates that the first part is arranged at an upper side or a lower side of the second part without limitation to the upper side thereof on the basis of the gravity direction.

Additionally, cross-hatching and/or shading in the accompanying drawings are generally used to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, and/or the like of the elements, unless otherwise specified.

Various embodiments are described herein with reference to sectional illustrations that are schematic illustrations of embodiments and/or intermediate structures. As such, variations from the shapes of the illustrations, for example, as a result of manufacturing techniques and/or tolerances are to be expected. Further, specific structural or functional descriptions disclosed herein are merely illustrative for the purpose of describing embodiments according to the present disclosure. Thus, the embodiments disclosed herein should not be construed as limited to the particular illustrated shapes of regions, but are to include variations and deviations in the shapes that may result, for example, from manufacturing processes thereof.

For example, an implanted region illustrated as a rectangle typically may have rounded or curved features, and/or a gradient of implant concentration at its edges rather than a binary change from implanted to non-implanted region.

Likewise, a buried region formed by implantation may result in some implantation in the region between the buried region and a surface through which the implantation takes place. Thus, the regions illustrated in the drawings are schematic in nature, and their shapes are not intended to illustrate the actual shape of a region of a device, and thus, are not intended to be limiting. Additionally, as those skilled in the art would realize, the described embodiments may be modified in various different ways, all without departing from the spirit and scope of the present disclosure.

As used herein, the phrase "on a plane" or "in a plan view" refers to a view of a target portion from the top, and the phrase "on a cross-section" or "in a cross-sectional view" refers to a view of a cross-section formed by vertically cutting a target portion from the side.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, any combination of two or more of a, b, and c, such as, for example, abc, abb, bc, and cc, or variations thereof.

As used herein, the term "substantially," "about," and similar terms are used as terms of approximation and not as terms of degree, and are intended to account for the inherent variations in measured or calculated values that would be recognized by those of ordinary skill in the art. "About" or "approximately," as used herein, is inclusive of the stated value and means within an acceptable range of a deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Further, the use of "may" when describing embodiments of the present disclosure refers to "one or more embodiments of the present disclosure." Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to an embodiment.

Referring to FIG. 1, a display device 10 includes a display panel 100, a scan driver 110, a source driver 200, a timing controller 300, and a power supply unit (e.g., a power supply) 400.

A display area DA of the display panel 100 may include sub-pixels RP, GP, and BP for displaying an image, and scan write lines GWL, scan initialization lines GIL, scan control lines GCL, sweep signal lines SWPL, pulse width modulation (PWM) emission lines PWEL, pulse amplitude modulation (PAM) emission lines PAEL, data lines DL, first PAM data lines RDL, second PAM data lines GDL, and third PAM data lines BDL connected to the sub-pixels RP, GP, and BP.

The scan write lines GWL, the scan initialization lines GIL, the scan control lines GCL, the sweep signal lines SWPL, the PWM emission lines PWEL, and the PAM emission lines PAEL may extend in a first direction (e.g., the X-axis direction) DR1, and may be disposed along a second direction (e.g., the Y-axis direction) DR2 crossing the first direction (e.g., the X-axis direction) DR1. The data lines DL, the first PAM data lines RDL, the second PAM data lines GDL, and the third PAM data lines BDL may extend in the second direction (e.g., the Y-axis direction) DR2, and may be disposed along the first direction (e.g., the X-axis direction) DR1. The first PAM data lines RDL may be electrically connected to each other, the second PAM data lines GDL may be electrically connected to each other, and the third PAM data lines BDL may be electrically connected to each other.

The sub-pixels RP, GP, and BP may include first sub-pixels RP for emitting first light, second sub-pixels GP for emitting second light, and third sub-pixels BP for emitting third light. The first light refers to light of a red wavelength band, the second light refers to light of a green wavelength band, and the third light refers to light of a blue wavelength band. For example, a main peak wavelength of the first light may be positioned between approximately 600 nm and 750 nm, a main peak wavelength of the second light may be positioned between approximately 480 nm and 560 nm, and a main peak wavelength of the third light may be positioned between approximately 370 nm and 460 nm.

Each of the sub-pixels RP, GP, and BP may be connected to any one of the scan write lines GWL, any one of the scan initialization lines GIL, any one of the scan control lines GCL, any one of the sweep signal lines SWPL, any one of the PWM emission lines PWEL, and any one of the PAM emission lines PAEL. Each of the first sub-pixels RP may be further connected to any one of the data lines DL and any one of the first PAM data lines RDL. Each of the second sub-pixels GP may be further connected to any one of the data lines DL and any one of the second PAM data lines GDL. Each of the third sub-pixels BP may be further connected to any one of the data lines DL and any one of the third PAM data lines BDL.

The scan driver 110 may apply signals to the scan write lines GWL, the scan initialization lines GIL, the scan control lines GCL, the sweep signal lines SWPL, the PWM emission lines PWEL, and the PAM emission lines PAEL, and may be disposed at (e.g., in or on) a non-display area NDA of the display panel 100. FIG. 1 shows that the scan driver 110 may be disposed at an edge of one side of the display panel 100, but the present disclosure is not limited thereto. For example, in some embodiments, a plurality of scan drivers 110 may be disposed at edges of opposite sides of the display panel 100.

The scan driver 110 may include a first scan signal driver 111, a second scan signal driver 112, a sweep signal driver 113, and an emission signal driver 114.

The first scan signal driver 111 may receive a first scan driving control signal GDCS1 from the timing controller 300. The first scan signal driver 111 may output scan initialization signals to the scan initialization lines GIL, and may output scan write signals to the scan write lines GWL, according to the first scan driving control signal GDCS1. In other words, the first scan signal driver 111 may output two scan signals together, that is, the scan initialization signals and the scan write signals.

The second scan signal driver 112 may receive a second scan driving control signal GDCS2 from the timing controller 300. The second scan signal driver 112 may output scan control signals to the scan control lines GCL according to the second scan driving control signal GDCS2.

The sweep signal driver 113 may receive a first emission control signal ECS1 and a sweep control signal SPCS from the timing controller 300. The sweep signal driver 113 may output PWM emission signals to the PWM emission lines PWEL, and may output sweep signals to the sweep signal lines SWPL, according to the first emission control signal ECS1. In other words, the sweep signal driver 113 may output the PWM emission signals and the sweep signals together.

The emission signal driver 114 may receive a second emission control signal ECS2 from the timing controller 300. The emission signal driver 114 may output PAM emission signals to the PAM emission lines PAEL according to the second emission control signal ECS2.

The timing controller 300 receives digital video data DATA and timing signals TS. The timing controller 300 may generate the first scan driving control signal GDCS1, the second scan driving control signal GDSC2, the first emission control signal ECS1, the second emission control signal ECS2, and the sweep control signal SPCS for controlling an operation timing of the scan driver 110 according to the timing signals TS. In addition, the timing controller 300 may generate a data control signal DCS for controlling an operation timing of the source driver 200.

The timing controller 300 may output the first scan driving control signal GDCS1, the second scan driving control signal GDSC2, the first emission control signal ECS1, the second emission control signal ECS2, and the sweep control signal SPCS to the scan driver 110. The timing controller 300 outputs the digital video data DATA and the data control signal DCS to the source driver 200.

The source driver 200 converts the digital video data DATA into analog data voltages, and outputs the analog data voltages to the data lines DL. Accordingly, the sub-pixels RP, GP, and BP may be selected by the scan write signals of the scan driver 110, and the data voltages may be supplied to the selected sub-pixels RP, GP, and BP.

The power supply unit 400 may commonly output a first PAM data voltage to the first PAM data lines RDL, may commonly output a second PAM data voltage to the second PAM data lines GDL, and may commonly output a third PAM data voltage to the third PAM data lines BDL. In addition, the power supply unit 400 may generate a plurality of source voltages, and may output the plurality of source voltages to the display panel 100.

The power supply unit 400 may output a first source voltage VDD1, a second source voltage VDD2, a third source voltage VSS, an initialization voltage VINT, a gate-on voltage VGL, and a gate-off voltage VGH to the display panel 100. The first source voltage VDD1 and the second source voltage VDD2 may be high potential driving voltages for driving the light emitting element of each of the sub-pixels RP, GP, and BP. The initialization voltage VINT may be a low potential driving voltage for driving the light emitting element of each of the sub-pixels RP, GP, and BP. The initialization voltage VINT and the gate-off voltage VGH may be applied to each of the sub-pixels RP, GP, and BP, and the gate-on voltage VGL and the gate-off voltage VGH may be applied to the scan driver 110.

Figure 2:
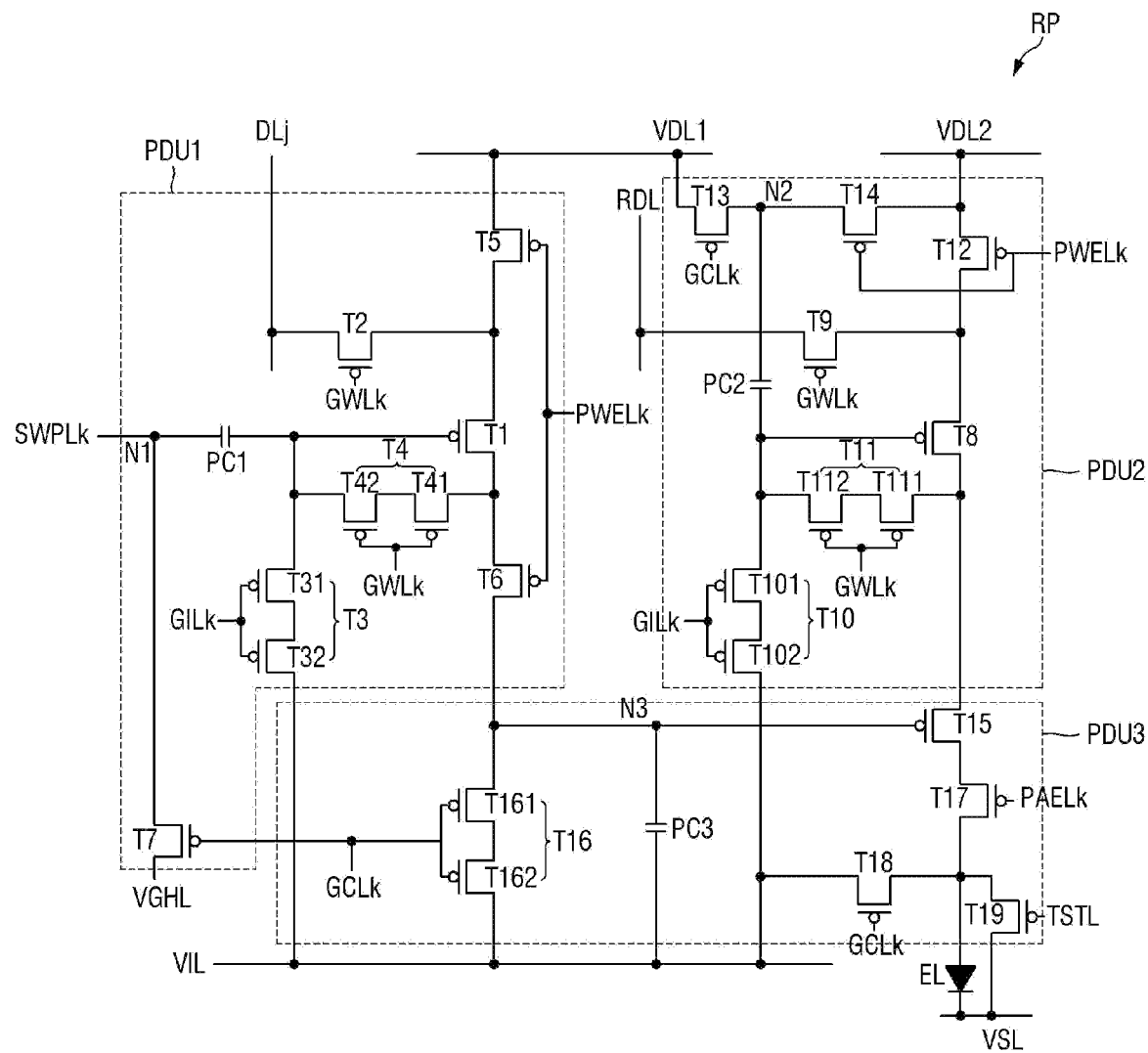
FIG. 2 is a circuit diagram illustrating a first sub-pixel according to an embodiment.

FIG. 2 is a circuit diagram illustrating a first sub-pixel according to an embodiment.

Referring to FIG. 2, the first sub-pixel RP according to an embodiment may be connected to a kth scan write line GWLk, a kth scan initialization line GILk, a kth scan control line GCLk, a kth sweep signal line SWPLk, a kth PWM emission line PWELk, and a kth PAM emission line PAELk, where k is a natural number. In addition, the first sub-pixel RP may be connected to a jth data line DLj and the first PAM data line RDL, where j is a natural number. Further, the first sub-pixel RP may be connected to a first power line VDL1 to which the first source voltage VDD1 is applied, a second power line VDL2 to which the second source voltage VDD2 is applied, a third power line VSL to which the third source voltage VSS is applied, an initialization voltage line VIL to which the initialization voltage VINT is applied, and a gate-off voltage line VGHL to which the gate-off voltage VGH is applied. For convenience of description, the jth data line DLj may be referred to as a first data line, and the first PAM data line RDL may be referred to as a second data line.

The first sub-pixel RP may include a light emitting element EL, a first pixel driving unit (e.g., a first pixel driving circuit or a first pixel driver) PDU1, a second pixel driving unit (e.g., a second pixel driving circuit or a second pixel driver) PDU2, and a third pixel driving unit (e.g., a third pixel driving circuit or a third pixel driver) PDU3.

The light emitting element EL emits light according to (e.g., depending on) a driving current Ids generated by the second pixel driving unit PDU2. The light emitting element EL may be disposed between a seventeenth transistor T17 and the third power line VSL. A first electrode of the light emitting element EL may be connected to a second electrode of the seventeenth transistor T17, and a second electrode of the light emitting element EL may be connected to the third power line VSL. The first electrode of the light emitting element EL may be an anode electrode, and the second electrode of the light emitting element EL may be a cathode electrode. The light emitting element EL may be an inorganic light emitting element including the first electrode, the second electrode, and an inorganic semiconductor disposed between the first electrode and the second electrode. For example, the light emitting element EL may be a micro light emitting diode including (e.g., made of) an inorganic semiconductor, but the present disclosure is not limited thereto.

The first pixel driving unit PDU1 controls a voltage of a third node N3 of the third pixel driving unit PDU3 by generating a control current Ic according to a jth data voltage of the jth data line DLj. Because a pulse width of a voltage applied to the first electrode of the light emitting element EL may be adjusted by the control current Ic of the first pixel driving unit PDU1, the first pixel driving unit PDU1 may be a pulse width modulation (PWM) unit (e.g., a PWM circuit) for performing pulse width modulation of the voltage applied to the first electrode of the light emitting element EL.

The first pixel driving unit PDU1 may include first to seventh transistors T1 to T7, and a first capacitor PC1.

The first transistor T1 controls the control current Ic flowing between a second electrode and a first electrode of the first transistor T1 according to a data voltage applied to a gate electrode of the first transistor T1.

The second transistor T2 is turned on by a kth scan write signal of the kth scan write line GWLk to supply the data voltage of the jth data line DLj to the first electrode of the first transistor T1. A gate electrode of the second transistor T2 may be connected to the kth scan write line GWLk, a first electrode of the second transistor T2 may be connected to the jth data line DLj, and a second electrode of the second transistor T2 may be connected to the first electrode of the first transistor T1.

The third transistor T3 is turned on by a kth scan initialization signal of the kth scan initialization line GILk to connect the initialization voltage line VIL to the gate electrode of the first transistor T1. Accordingly, the gate electrode of the first transistor T1 may be discharged to the initialization voltage VINT of the initialization voltage line VIL during a period in which the third transistor T3 is turned on. In this case, a gate-on voltage VGL of the kth scan initialization signal may be different from the initialization voltage VINT of the initialization voltage line VIL. In more detail, because a difference voltage between the gate-on voltage VGL and the initialization voltage VINT is greater than a threshold voltage of the third transistor T3, the third transistor T3 may be stably turned on even after the initialization voltage VINT is applied to the gate electrode of the first transistor T1. Accordingly, when the third transistor T3 is turned on, the initialization voltage VINT may be stably applied to the gate electrode of the first transistor T1, regardless of the threshold voltage of the third transistor T3.

The third transistor T3 may include a plurality of transistors that are connected to each other in series. For example, the third transistor T3 may include a first sub-transistor T31 and a second sub-transistor T32. Accordingly, it may be possible to prevent or substantially prevent a voltage of the gate electrode of the first transistor T1 from being leaked through the third transistor T3. A gate electrode of the first sub-transistor T31 may be connected to the kth scan initialization line GILk, a first electrode of the first sub-transistor T31 may be connected to the gate electrode of the first transistor T1, and a second electrode of the first sub-transistor T31 may be connected to a first electrode of the second sub-transistor T32. A gate electrode of the second sub-transistor T32 may be connected to the kth scan initialization line GILk, the first electrode of the second sub-transistor T32 may be connected to the second electrode of the first sub-transistor T31, and a second electrode of the second sub-transistor T32 may be connected to the initialization voltage line VIL.

The fourth transistor T4 is turned on by the kth scan write signal of the kth scan write line GWLk to connect the gate electrode and the second electrode of the first transistor T1 to each other. Accordingly, the first transistor T1 may operate as a diode during a period in which the fourth transistor T4 is turned on. In other words, the fourth transistor T4 may be turned on to diode-connect the first transistor T1.

The fourth transistor T4 may include a plurality of transistors that are connected to each other in series. For example, the fourth transistor T4 may include a third sub-transistor T41 and a fourth sub-transistor T42. Accordingly, it may be possible to prevent or substantially prevent the voltage of the gate electrode of the first transistor T1 from being leaked through the fourth transistor T4. A gate electrode of the third sub-transistor T41 may be connected to the kth scan write line GWLk, a first electrode of the third sub-transistor T41 may be connected to the second electrode of the first transistor T1, and a second electrode of the third sub-transistor T41 may be connected to a first electrode of the fourth sub-transistor T42. A gate electrode of the fourth sub-transistor T42 may be connected to the kth scan write line GWLk, the first electrode of the fourth sub-transistor T42 may be connected to the second electrode of the third sub-transistor T41, and a second electrode of the fourth sub-transistor T42 may be connected to the gate electrode of the first transistor T1.

The fifth transistor T5 is turned on by a kth PWM emission signal of the kth PWM emission line PWELk to connect the first electrode of the first transistor T1 to the first power line VDL1. A gate electrode of the fifth transistor T5 may be connected to the kth PWM emission line PWELk, a first electrode of the fifth transistor T5 may be connected to the first power line VDL1, and a second electrode of the fifth transistor T5 may be connected to the first electrode of the first transistor T1.

The sixth transistor T6 is turned on by the kth PWM emission signal of the kth PWM emission line PWELk to connect the second electrode of the first transistor T1 to the third node N3 of the third pixel driving unit PDU3. A gate electrode of the sixth transistor T6 may be connected to the kth PWM emission line PWELk, a first electrode of the sixth transistor T6 may be connected to the second electrode of the first transistor T1, and a second electrode of the sixth transistor T6 may be connected to the third node N3 of the third pixel driving unit PDU3.

The seventh transistor T7 may be turned on by a kth scan control signal of the kth scan control line GCLk to supply the gate-off voltage VGH of the gate-off voltage line VGHL to a first node N1 connected to the kth sweep signal line SWPLk. Accordingly, it may be possible to prevent or substantially prevent a change in voltage of the gate electrode of the first transistor T1 from being reflected in a kth sweep signal of the kth sweep signal line SWPLk by the first capacitor PC1 during a period in which the initialization voltage VINT is applied to the gate electrode of the first transistor T1 and a period in which the data voltage of the jth data line DLj and a threshold voltage Vth1 of the first transistor T1 are programmed. A gate electrode of the seventh transistor T7 may be connected to the kth scan control line GCLk, a first electrode of the seventh transistor T7 may be connected to the gate-off voltage line VGHL, and a second electrode of the seventh transistor T7 may be connected to the first node N1.

The first capacitor PC1 may be disposed between the gate electrode of the first transistor T1 and the first node N1. One electrode of the first capacitor PC1 may be connected to the gate electrode of the first transistor T1, and the other electrode of the first capacitor PC1 may be connected to the first node N1.

The first node N1 may be a contact point between the kth sweep signal line SWPLk, the second electrode of the seventh transistor T7, and the other electrode of the first capacitor PC1.

The second pixel driving unit PDU2 generates the driving current Ids supplied to the light emitting element EL according to the first PAM data voltage of the first PAM data line RDL. The second pixel driving unit PDU2 may be a pulse amplitude modulation (PAM) unit (e.g., a PAM circuit) for performing pulse amplitude modulation. In this case, each of the first sub-pixels RP may be a constant or substantially constant current generator that receives the same or substantially the same first PAM data voltage and that generates the same or substantially the same driving current Ids, regardless of a luminance of the first sub-pixel RP.

The second pixel driving unit PDU2 may include eighth to fourteenth transistors T8 to T14, and a second capacitor PC2.

The eighth transistor T8 controls the driving current Ids flowing to the light emitting element EL according to a voltage applied to a gate electrode of the eight transistor T8.

The ninth transistor T9 is turned on by the kth scan write signal of the kth scan write line GWLk to apply the first PAM data voltage of the first PAM data line RDL to a first electrode of the eighth transistor T8. A gate electrode of the ninth transistor T9 may be connected to the kth scan write line GWLk, a first electrode of the ninth transistor T9 may be connected to the first PAM data line RDL, and a second electrode of the ninth transistor T9 may be connected to the first electrode of the eighth transistor T8.

The tenth transistor T10 is turned on by the kth scan initialization signal of the kth scan initialization line GILk to connect the initialization voltage line VIL to the gate electrode of the eighth transistor T8. Accordingly, the gate electrode of the eighth transistor T8 may be discharged to the initialization voltage VINT of the initialization voltage line VIL during a period in which the tenth transistor T10 is turned on. In this case, the gate-on voltage VGL of the kth scan initialization signal may be different from the initialization voltage VINT of the initialization voltage line VIL. In more detail, because a difference voltage between the gate-on voltage VGL and the initialization voltage VINT is greater than a threshold voltage of the tenth transistor T10, the tenth transistor T10 may be stably turned on even after the initialization voltage VINT is applied to the gate electrode of the eighth transistor T8. Accordingly, when the tenth transistor T10 is turned on, the initialization voltage VINT may be stably applied to the gate electrode of the eighth transistor T8, regardless of the threshold voltage of the tenth transistor T10.

The tenth transistor T10 may include a plurality of transistors that are connected to each other in series. For example, the tenth transistor T10 may include a fifth sub-transistor T101 and a sixth sub-transistor T102. Accordingly, it may be possible to prevent or substantially prevent a voltage of the gate electrode of the eighth transistor T8 from being leaked through the tenth transistor T10. A gate electrode of the fifth sub-transistor T101 may be connected to the kth scan initialization line GILk, a first electrode of the fifth sub-transistor T101 may be connected to the gate electrode of the eighth transistor T8, and a second electrode of the fifth sub-transistor T101 may be connected to a first electrode of the sixth sub-transistor T102. A gate electrode of the sixth sub-transistor T102 may be connected to the kth scan initialization line GILk, the first electrode of the sixth sub-transistor T102 may be connected to the second electrode of the fifth sub-transistor T101, and a second electrode of the sixth sub-transistor T102 may be connected to the initialization voltage line VIL.

The eleventh transistor T11 is turned on by the kth scan write signal of the kth scan write line GWLk to connect the gate electrode and a second electrode of the eighth transistor T8 to each other. Accordingly, the eighth transistor T8 may operate as a diode during a period in which the eleventh transistor T11 is turned on. In other words, the eleventh transistor T11 may be turned on to diode-connect the eight transistor T8.

The eleventh transistor T11 may include a plurality of transistors that are connected to each other in series. For example, the eleventh transistor T11 may include a seventh sub-transistor T111 and an eighth sub-transistor T112. Accordingly, it may be possible to prevent or substantially prevent the voltage of the gate electrode of the eighth transistor T8 from being leaked through the eleventh transistor T11. A gate electrode of the seventh sub-transistor T111 may be connected to the kth scan write line GWLk, a first electrode of the seventh sub-transistor T111 may be connected to the second electrode of the eighth transistor T8, and a second electrode of the seventh sub-transistor T111 may be connected to a first electrode of the eighth sub-transistor T112. A gate electrode of the eighth sub-transistor T112 may be connected to the kth scan write line GWLk, the first electrode of the eighth sub-transistor T112 may be connected to the second electrode of the seventh sub-transistor T111, and a second electrode of the eighth sub-transistor T112 may be connected to the gate electrode of the eighth transistor T8.

The twelfth transistor T12 is turned on by the kth PWM emission signal of the kth PWM emission line PWELk to connect the first electrode of the eighth transistor T8 to the second power line VDL2. A gate electrode of the twelfth transistor T12 may be connected to the kth PWM emission line PWELk, a first electrode of the twelfth transistor T12 may be connected to the second power line VDL2, and a second electrode of the twelfth transistor T12 may be connected to the first electrode of the eighth transistor T8.

The thirteenth transistor T13 is turned on by the kth scan control signal of the kth scan control line GCLk to connect the first power line VDL1 to a second node N2. A gate electrode of the thirteenth transistor T13 may be connected to the kth scan control line GCLk, a first electrode of the thirteenth transistor T13 may be connected to the first power line VDL1, and a second electrode of the thirteenth transistor T13 may be connected to the second node N2.

The fourteenth transistor T14 is turned on by the kth PWM emission signal of the kth PWM emission line PWELk to connect the second power line VDL2 to the second node N2. Accordingly, when the fourteenth transistor T14 is turned on, the second source voltage VDD2 of the second power line VDL2 may be supplied to the second node N2. A gate electrode of the fourteenth transistor T14 may be connected to the kth PWM emission line PWELk, a first electrode of the fourteenth transistor T14 may be connected to the second power line VDL2, and a second electrode of the fourteenth transistor T14 may be connected to the second node N2.

The second capacitor PC2 may be disposed between the gate electrode of the eighth transistor T8 and the second node N2. One electrode of the second capacitor PC2 may be connected to the gate electrode of the eighth transistor T8, and the other electrode of the second capacitor PC2 may be connected to the second node N2.

The second node N2 may be a contact point between the second electrode of the thirteenth transistor T13, the second electrode of the fourteenth transistor T14, and the other electrode of the second capacitor PC2.

The third pixel driving unit PDU3 adjusts a period in which the driving current Ids is supplied to the light emitting element EL according to the voltage of the third node N3.

The third pixel driving unit PDU3 may include fifteenth to nineteenth transistors T15 to T19, and a third capacitor PC3.

The fifteenth transistor T15 is turned on or turned off according to the voltage of the third node N3. When the fifteenth transistor T15 is turned on, the driving current Ids of the eighth transistor T8 may be supplied to the light emitting element EL, and when the fifteenth transistor T15 is turned off, the driving current Ids of the eighth transistor T8 may not be supplied to the light emitting element EL. Therefore, a turn-on period of the fifteenth transistor T15 may be the same or substantially the same as an emission period of the light emitting element EL. A gate electrode of the fifteenth transistor T15 may be connected to the third node N3, a first electrode of the fifteenth transistor T15 may be connected to the second electrode of the eighth transistor T8, and a second electrode of the fifteenth transistor T15 may be connected to a first electrode of the seventeenth transistor T17.

The sixteenth transistor T16 is turned on by the kth scan control signal of the kth scan control line GCLk to connect the initialization voltage line VIL to the third node N3. Accordingly, the third node N3 may be discharged to the initialization voltage of the initialization voltage line VIL during a period in which the sixteenth transistor T16 is turned on.

The sixteenth transistor T16 may include a plurality of transistors that are connected to each other in series. For example, the sixteenth transistor T16 may include a ninth sub-transistor T161 and a tenth sub-transistor T162. Accordingly, it may be possible to prevent or substantially prevent the voltage of the third node N3 from being leaked through the sixteenth transistor T16. A gate electrode of the ninth sub-transistor T161 may be connected to the kth scan control line GCLk, a first electrode of the ninth sub-transistor T161 may be connected to the third node N3, and a second electrode of the ninth sub-transistor T161 may be connected to a first electrode of the tenth sub-transistor T162. A gate electrode of the tenth sub-transistor T162 may be connected to the kth scan control line GCLk, the first electrode of the tenth sub-transistor T162 may be connected to the second electrode of the ninth sub-transistor T161, and a second electrode of the tenth sub-transistor T162 may be connected to the initialization voltage line VIL.

The seventeenth transistor T17 is turned on by a kth PAM emission signal of the kth PAM emission line PAELk to connect the second electrode of the fifteenth transistor T15 to the first electrode of the light emitting element EL. A gate electrode of the seventeenth transistor T17 may be connected to the kth PAM emission line PAELk, the first electrode of the seventeenth transistor T17 may be connected to the second electrode of the fifteenth transistor T15, and the second electrode of the seventeenth transistor T17 may be connected to the first electrode of the light emitting element EL.

The eighteenth transistor T18 is turned on by the kth scan control signal of the kth scan control line GCLk to connect the initialization voltage line VIL to the first electrode of the light emitting element EL. Accordingly, the first electrode of the light emitting element EL may be discharged to the initialization voltage of the initialization voltage line VIL during a period in which the eighteenth transistor T18 is turned on. A gate electrode of the eighteenth transistor T18 may be connected to the kth scan control line GCLk, a first electrode of the eighteenth transistor T18 may be connected to the first electrode of the light emitting element EL, and a second electrode of the eighteenth transistor T18 may be connected to the initialization voltage line VIL.

The nineteenth transistor T19 is turned on by a test signal of a test signal line TSTL to connect the first electrode of the light emitting element EL to the third power line VSL. A gate electrode of the nineteenth transistor T19 may be connected to the test signal line TSTL, a first electrode of the nineteenth transistor T19 may be connected to the first electrode of the light emitting element EL, and a second electrode of the nineteenth transistor T19 may be connected to the third power line VSL.

The third capacitor PC3 may be disposed between the third node N3 and the initialization voltage line VIL. One electrode of the third capacitor PC3 may be connected to the third node N3, and the other electrode of the third capacitor PC3 may be connected to the initialization voltage line VIL.

The third node N3 may be a contact point between the second electrode of the sixth transistor T6, the gate electrode of the fifteenth transistor T15, the first electrode of the ninth sub-transistor T161, and the one electrode of the third capacitor PC3.

Any one of the first electrode and the second electrode of each of the first to nineteenth transistors T1 to T19 may be a source electrode, and the other of the first electrode and the second electrode of each of the first to nineteenth transistors T1 to T19 may be a drain electrode. An active layer of each of the first to nineteenth transistors T1 to T19 may be formed of any one of polysilicon, amorphous silicon, and an oxide semiconductor. When the active layer of each of the first to nineteenth transistors T1 to T19 is formed of polysilicon, the active layer of each of the first to nineteenth transistors T1 to T19 may be formed by a low temperature polysilicon (LTPS) process.

In addition, while FIG. 2 shows that each of the first to nineteenth transistors T1 to T19 is formed as a P-type metal oxide semiconductor field effect transistor (MOSFET), the present disclosure is not limited thereto. For example, each of the first to nineteenth transistors T1 to T19 may be formed as an N-type MOSFET instead.

As another example, in order to increase a black expression ability of the light emitting element EL by blocking a leakage current, the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 in the first sub-pixel RP may be formed as N-type MOSFETs. In this case, the gate electrode of the third sub-transistor T41 and the gate electrode of the fourth sub-transistor T42 of the fourth transistor T4 and the gate electrode of the seventh sub-transistor T111 and the gate electrode of the eighth sub-transistor T112 of the eleventh transistor T11 may be connected to a kth control line. The kth scan initialization signal GIk and a kth control signal of the kth control line may have pulses generated as a gate high voltage VGH. In addition, active layers of the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed of an oxide semiconductor, and active layers of the other transistors may be formed of polysilicon.

As another example, any one of the first sub-transistor T31 and the second sub-transistor T32 of the third transistor T3 may be formed as an N-type MOSFET and the other of the first sub-transistor T31 and the second sub-transistor T32 of the third transistor T3 may be formed as a P-type MOSFET. In this case, a transistor formed as the N-type MOSFET from among the first sub-transistor T31 and the second sub-transistor T32 of the third transistor T3 may be formed of an oxide semiconductor, and a transistor formed as the P-type MOSFET from among the first sub-transistor T31 and the second sub-transistor T32 of the third transistor T3 may be formed of polysilicon.

As another example, any one of the third sub-transistor T41 and the fourth sub-transistor T42 of the fourth transistor T4 may be formed as an N-type MOSFET, and the other of the third sub-transistor T41 and the fourth sub-transistor T42 of the fourth transistor T4 may be formed as a P-type MOSFET. In this case, a transistor formed as the N-type MOSFET from among the third sub-transistor T41 and the fourth sub-transistor T42 of the fourth transistor T4 may be formed of an oxide semiconductor, and a transistor formed as the P-type MOSFET from among the third sub-transistor T41 and the fourth sub-transistor T42 of the fourth transistor T4 may be formed of polysilicon.

As another example, any one of the fifth sub-transistor T101 and the sixth sub-transistor T102 of the tenth transistor T10 may be formed as an N-type MOSFET, and the other of the fifth sub-transistor T101 and the sixth sub-transistor T102 of the tenth transistor T10 may be formed as a P-type MOSFET. In this case, a transistor formed as the N-type MOSFET from among the fifth sub-transistor T101 and the sixth sub-transistor T102 of the tenth transistor T10 may be formed of an oxide semiconductor, and a transistor formed as the P-type MOSFET from among the fifth sub-transistor T101 and the sixth sub-transistor T102 of the tenth transistor T10 may be formed of polysilicon.

As another example, any one of the seventh sub-transistor T111 and the eighth sub-transistor T112 of the eleventh transistor T11 may be formed as an N-type MOSFET, and the other of the seventh sub-transistor T111 and the eighth sub-transistor T112 of the eleventh transistor T11 may be formed as a P-type MOSFET. In this case, a transistor formed as the N-type MOSFET from among the seventh sub-transistor T111 and the eighth sub-transistor T112 of the eleventh transistor T11 may be formed of an oxide semiconductor, and a transistor formed as the P-type MOSFET from among the seventh sub-transistor T111 and the eighth sub-transistor T112 of the eleventh transistor T11 may be formed of polysilicon.

Circuits of the second sub-pixel GP and the third sub-pixel BP may be the same or substantially the same as that of the first sub-pixel RP described above with reference to FIG. 2, and thus, redundant description thereof will not be repeated.

Figure 3:
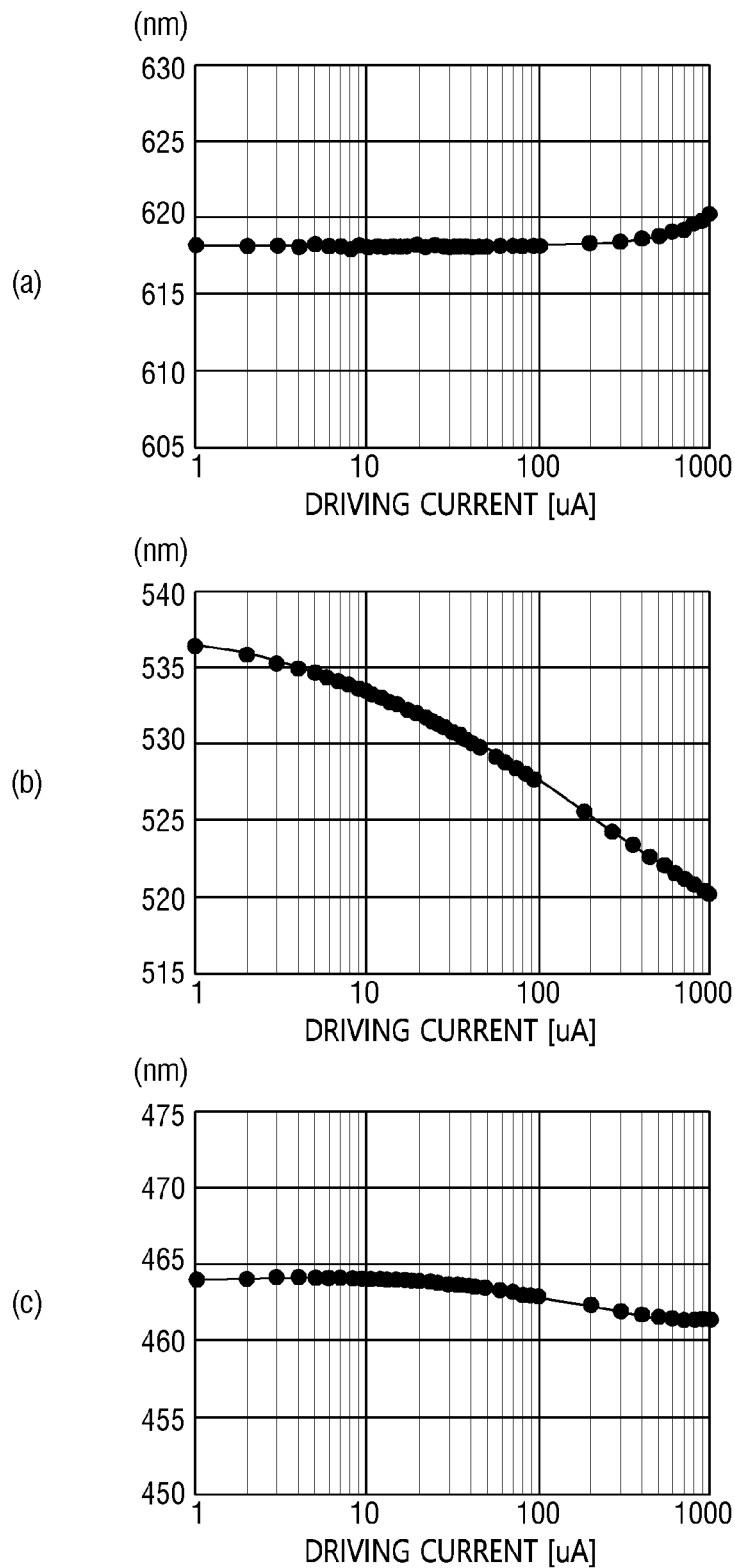
FIG. 3 shows graphs illustrating a wavelength of light emitted from a light emitting element of a first sub-pixel, a wavelength of light emitted from a light emitting element of a second sub-pixel, and a wavelength of light emitted from a light emitting element of a third sub-pixel, respectively, depending on a driving current according to an embodiment.

FIG. 3 shows graphs illustrating a wavelength of light emitted from a light emitting element of a first sub-pixel, a wavelength of light emitted from a light emitting element of a second sub-pixel, and a wavelength of light emitted from a light emitting element of a third sub-pixel, respectively, depending on a driving current according to an embodiment.

In FIG. 3, the graph (a) illustrates a wavelength of light emitted from the light emitting element EL of the first sub-pixel RP depending on the driving current Ids applied to the light emitting element EL of the first sub-pixel RP, when the light emitting element EL of the first sub-pixel RP includes an inorganic material, for example, such as GaN. In FIG. 3, the graph (b) illustrates a wavelength of light emitted from the light emitting element EL of the second sub-pixel GP depending on the driving current Ids applied to the light emitting element EL of the second sub-pixel GP, when the light emitting element EL of the second sub-pixel GP includes an inorganic material, for example, such as GaN. In FIG. 3, the graph (c) illustrates a wavelength of light emitted from the light emitting element EL of the third sub-pixel BP depending on the driving current Ids applied to the light emitting element EL of the third sub-pixel BP, when the light emitting element EL of the third sub-pixel BP includes an inorganic material, for example, such as GaN. In each of the graphs (a), (b), and (c) of FIG. 3, the X-axis indicates the driving current Ids, and the Y-axis indicates a wavelength of light emitted from the light emitting element.

Referring to the graph (a) in FIG. 3, when the driving current Ids applied to the light emitting element EL of the first sub-pixel RP is 1 to 300 μA, a wavelength of the light emitted from the light emitting element EL of the first sub-pixel RP is approximately 618 nm, and is constant or substantially constant. As the driving current Ids applied to the light emitting element EL of the first sub-pixel RP increases from 300 μA to 1000 μA, a wavelength of the light emitted from the light emitting element EL of the first sub-pixel RP increases from approximately 618 nm to approximately 620 nm.

Referring to the graph (b) in FIG. 3, when the driving current Ids applied to the light emitting element EL of the second sub-pixel GP increases from 1 μA to 1000 μA, a wavelength of the light emitted from the light emitting element EL of the second sub-pixel GP decreases from approximately 536 nm to approximately 520 nm.

Referring to the graph (c) in FIG. 3, when the driving current Ids applied to the light emitting element EL of the third sub-pixel BP increases from 1 μA to 1000 μA, a wavelength of the light emitted from the light emitting element EL of the third sub-pixel BP decreases from approximately 464 nm to approximately 461 nm.

As such, the wavelength of the light emitted from the light emitting element EL of the first sub-pixel RP and the wavelength of the light emitted from the light emitting element EL of the third sub-pixel BP barely change, even though the driving current Ids changes. On the other hand, the wavelength of the light emitted from the light emitting element EL of the second sub-pixel GP is in inverse proportion to the driving current Ids. Therefore, when the driving current Ids applied to the light emitting element EL of the second sub-pixel GP is adjusted, the wavelength of the light emitted from the light emitting element EL of the second sub-pixel GP may change, and color coordinates of the image displayed by the display panel 100 may change.

Figure 4:
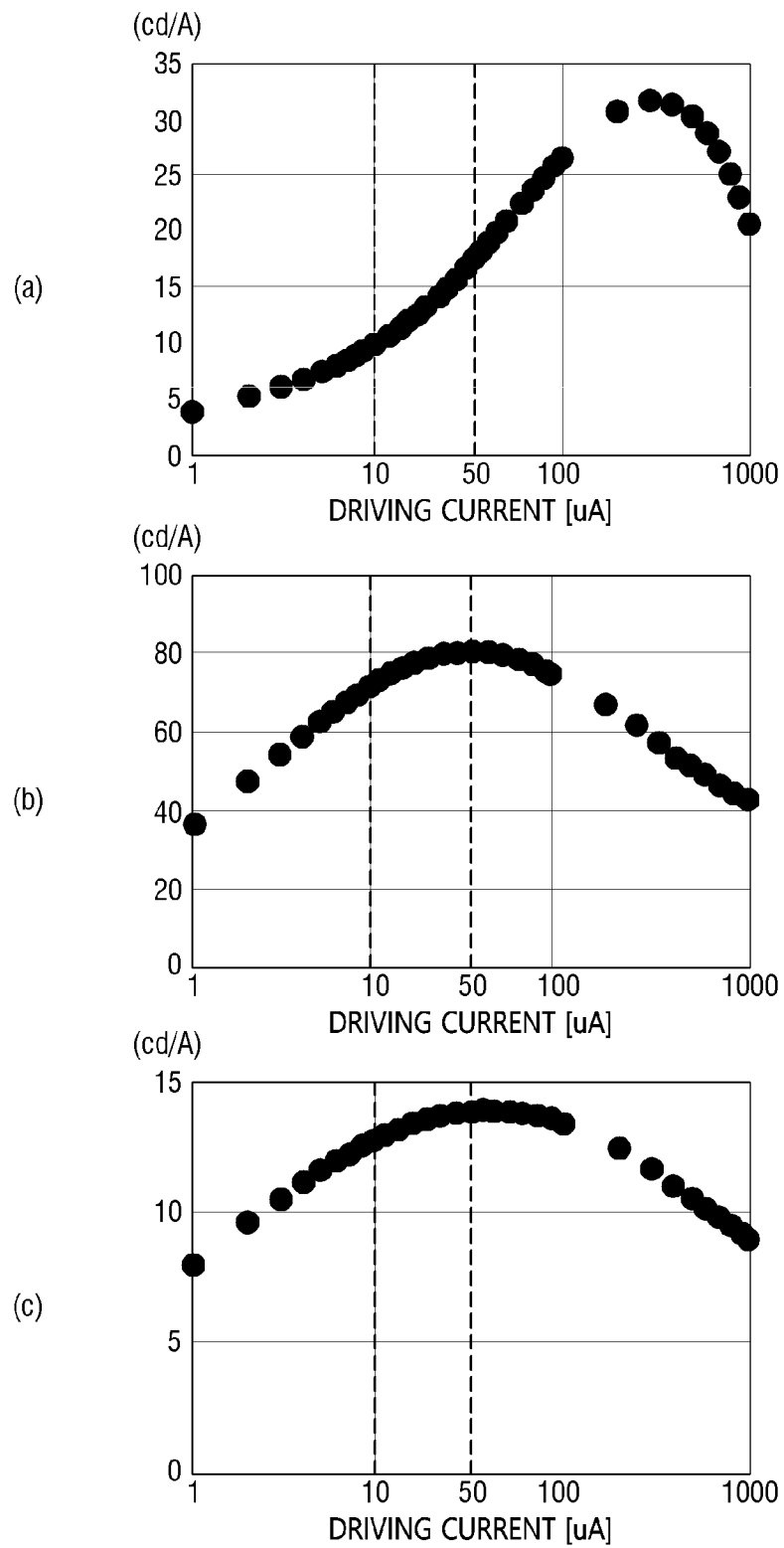
FIG. 4 shows graphs illustrating a luminous efficiency of the light emitting element of the first sub-pixel, a luminous efficiency of the light emitting element of the second sub-pixel, and a luminous efficiency of the light emitting element of the third sub-pixel, respectively, depending on the driving current according to an embodiment.

FIG. 4 shows graphs illustrating a luminous efficiency of the light emitting element of the first sub-pixel, a luminous efficiency of the light emitting element of the second sub-pixel, and a luminous efficiency of the light emitting element of the third sub-pixel, respectively, depending on the driving current according to an embodiment.

In FIG. 4, the graph (a) illustrates a luminous efficiency of the light emitting element EL of the first sub-pixel RP depending on the driving current Ids applied to the light emitting element EL of the first sub-pixel RP, when the light emitting element EL of the first sub-pixel RP includes (e.g., is made of) an inorganic material. In FIG. 4, the graph (b) illustrates a luminous efficiency of the light emitting element EL of the second sub-pixel GP depending on the driving current Ids applied to the light emitting element EL of the second sub-pixel GP, when the light emitting element EL of the second sub-pixel GP includes (e.g., is made of) an inorganic material. In FIG. 4, the graph (c) illustrates a luminous efficiency of the light emitting element EL of the third sub-pixel BP depending on the driving current Ids applied to the light emitting element EL of the third sub-pixel BP, when the light emitting element EL of the third sub-pixel BP includes (e.g., is made of) an inorganic material.

Referring to the graph (a) of FIG. 4, when the driving current Ids applied to the light emitting element EL of the first sub-pixel RP is approximately 10 μA, a luminous efficiency of the light emitting element EL of the first sub-pixel RP is approximately 8.5 cd/A. When the driving current Ids applied to the light emitting element EL of the first sub-pixel RP is approximately 50 μA, a luminous efficiency of the light emitting element EL of the first sub-pixel RP is approximately 18 cd/A. In other words, the luminous efficiency of the light emitting element EL of the first sub-pixel RP increases approximately 2.1 times in a case where the driving current Ids applied to the light emitting element EL of the first sub-pixel RP is 50 μA when compared with a case where the driving current Ids applied to the light emitting element EL of the first sub-pixel RP is 10 μA.

Referring to the graph (b) of FIG. 4, when the driving current Ids applied to the light emitting element EL of the second sub-pixel GP is approximately 10 μA, a luminous efficiency of the light emitting element EL of the second sub-pixel GP is approximately 72 cd/A. When the driving current Ids applied to the light emitting element EL of the second sub-pixel GP is approximately 50 μA, a luminous efficiency of the light emitting element EL of the second sub-pixel GP is approximately 80 cd/A. In other words, the luminous efficiency of the light emitting element EL of the second sub-pixel GP increases approximately 1.1 times in a case where the driving current Ids applied to the light emitting element EL of the second sub-pixel GP is 50 μA when compared with a case where the driving current Ids applied to the light emitting element EL of the second sub-pixel GP is 10 μA.

Referring to the graph (c) of FIG. 4, when the driving current Ids applied to the light emitting element EL of the third sub-pixel BP is approximately 10 μA, a luminous efficiency of the light emitting element EL of the third sub-pixel BP is approximately 14 cd/A. When the driving current Ids applied to the light emitting element EL of the third sub-pixel BP is approximately 50 μA, a luminous efficiency of the light emitting element EL of the third sub-pixel BP is approximately 13.2 cd/A. In other words, the luminous efficiency of the light emitting element EL of the third sub-pixel BP increases approximately 1.06 times in a case where the driving current Ids applied to the light emitting element EL of the third sub-pixel BP is 50 μA when compared with a case where the driving current Ids applied to the light emitting element EL of the third sub-pixel BP is 10 μA.

Accordingly, the luminous efficiency of the light emitting element of the first sub-pixel RP, the luminous efficiency of the light emitting element of the second sub-pixel GP, and the luminous efficiency of the third sub-pixel BP may change depending on the driving current Ids.

As illustrated in FIGS. 3 and 4, when the driving current Ids applied to the light emitting element EL of the second sub-pixel GP is adjusted, the color coordinates of the image displayed by the display panel 100 may change. In addition, the luminous efficiency of the light emitting element of the first sub-pixel RP, the luminous efficiency of the light emitting element of the second sub-pixel GP, and the luminous efficiency of the light emitting element of the third sub-pixel BP may change depending on the driving current Ids. Therefore, the driving current Ids may be fixed or substantially fixed (e.g., may be constant or substantially constant), so that the color coordinates of the image displayed by the display panel 100 are constantly or substantially constantly maintained and the light emitting element EL of the first sub-pixel RP, the light emitting element of the second sub-pixel GP, and the light emitting element EL of the third sub-pixel BP have improved or optimal luminous efficiencies.

Therefore, as illustrated in FIG. 2, the first sub-pixel RP may adjust a luminance of the light emitted from the light emitting element EL thereof by providing the driving current Ids to the light emitting element EL, so that the light emitting element EL of the first sub-pixel RP is driven with an improved or optimized luminous efficiency according to the first PAM data voltage of the first PAM data line RDL, and adjusting a duty ratio of the light emitting element EL, or in other words, adjusting an emission period of the light emitting element EL. In addition, the second sub-pixel GP may adjust a luminance of the light emitted from the light emitting element EL thereof by providing the driving current Ids to the light emitting element EL, so that the light emitting element EL of the second sub-pixel GP is driven with an improved or optimized luminous efficiency according to the second PAM data voltage of the second PAM data line GDL, and adjusting a duty ratio of the light emitting element EL, or in other words, adjusting an emission period of the light emitting element EL. Further, the third sub-pixel BP may adjust a luminance of the light emitted from the light emitting element EL thereof by providing the driving current Ids to the light emitting element EL, so that the light emitting element EL of the third sub-pixel BP is driven with an improved or optimized luminous efficiency according to the third PAM data voltage of the third PAM data line BDL, and adjusting a duty ratio of the light emitting element EL, or in other words, adjusting an emission period of the light emitting element EL. Accordingly, it may be possible to decrease or prevent deterioration of the quality of the image due to a change in the wavelength of the emitted light depending on the driving current applied to the light emitting element EL. In addition, each of the light emitting element EL of the first sub-pixel RP, the light emitting element EL of the second sub-pixel GP, and the light emitting element EL of the third sub-pixel GP may emit light with the improved or optimized luminous efficiency.

Figure 5:
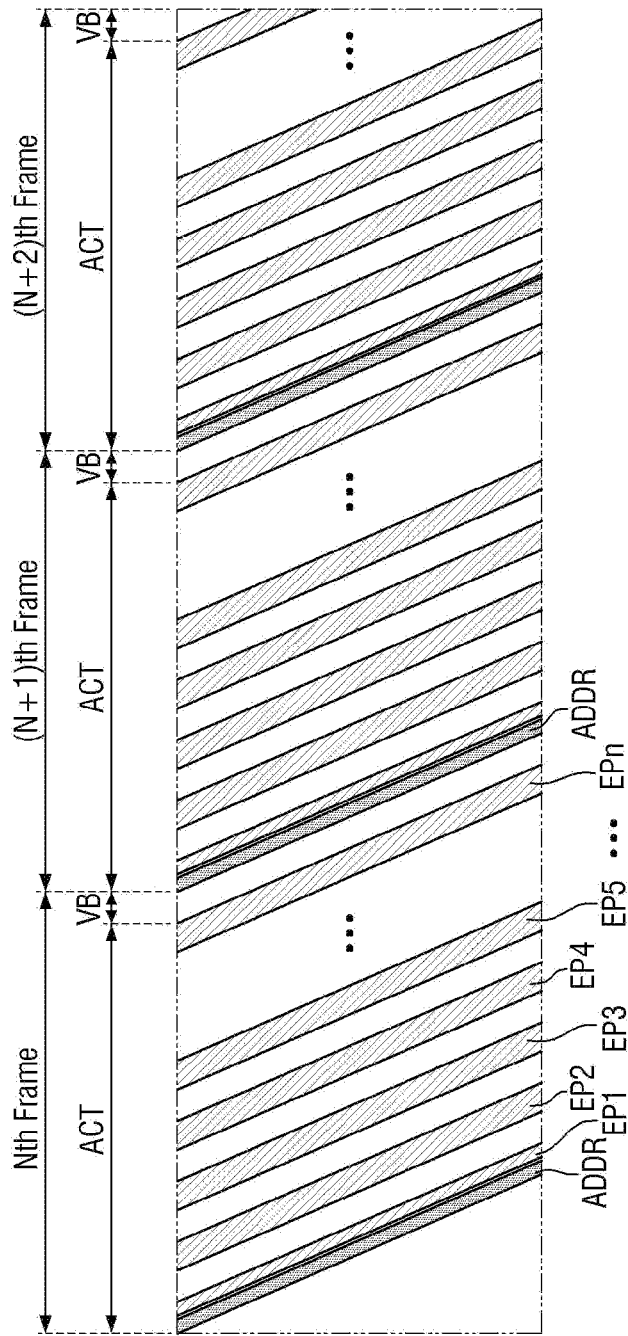
FIG. 5 is a schematic view illustrating an operation of a display device during Nth to (N+2)th frame periods.

FIG. 5 is a schematic view illustrating an operation of a display device during Nth to (N+2)th frame periods.

Referring to FIG. 5, each of the Nth to (N+2)th frame periods, where N is a natural number, may include an active period ACT and a blank period VB. The active period ACT may include a data address period ADDR in which data voltages and first/second/third PAM data voltages are supplied to corresponding ones of the first to third sub-pixels RP, GP, and BP, and a plurality of emission periods EP1, EP2, EP3, EP4, EP5, . . . , EPn in which the light emitting element EL of the corresponding sub-pixels RP, GP, and BP emit light. The blank period VB may be a period in which the sub-pixels RP, GP, and BP of the display panel 100 are idle without performing a special operation.

The data address period ADDR and a first emission period EP1 may be approximately five horizontal periods, and each of second to nth emission periods EP2, EP3, EP4, EP5, . . . , EPn may be approximately twelve horizontal periods, but the present disclosure is not limited thereto. In addition, the active period ACT may include 25 emission periods, but the number of emission periods EP1, EP2, EP3, EP4, EP5, . . . , EPn included in the active period ACT is not limited thereto.

The sub-pixels RP, GP, and BP of the display panel 100 may sequentially receive the data voltages and the red/green/third PAM data voltages for each row line during the data address period ADDR. For example, sub-pixels RP, GP, and BP disposed in a first row line to sub-pixels RP, GP, and BP disposed in an nth row line corresponding to the last row line may sequentially receive the data voltages and the red/green/third PAM data voltages.

The sub-pixels RP, GP, and BP of the display panel 100 may sequentially emit light for each row line in each of the plurality of emission periods EP1, EP2, EP3, EP4, EP5, . . . , EPn. For example, the sub-pixels RP, GP, and BP disposed in the first row line to the sub-pixels RP, GP, and BP disposed in the last row line may sequentially emit light.

Figure 6:
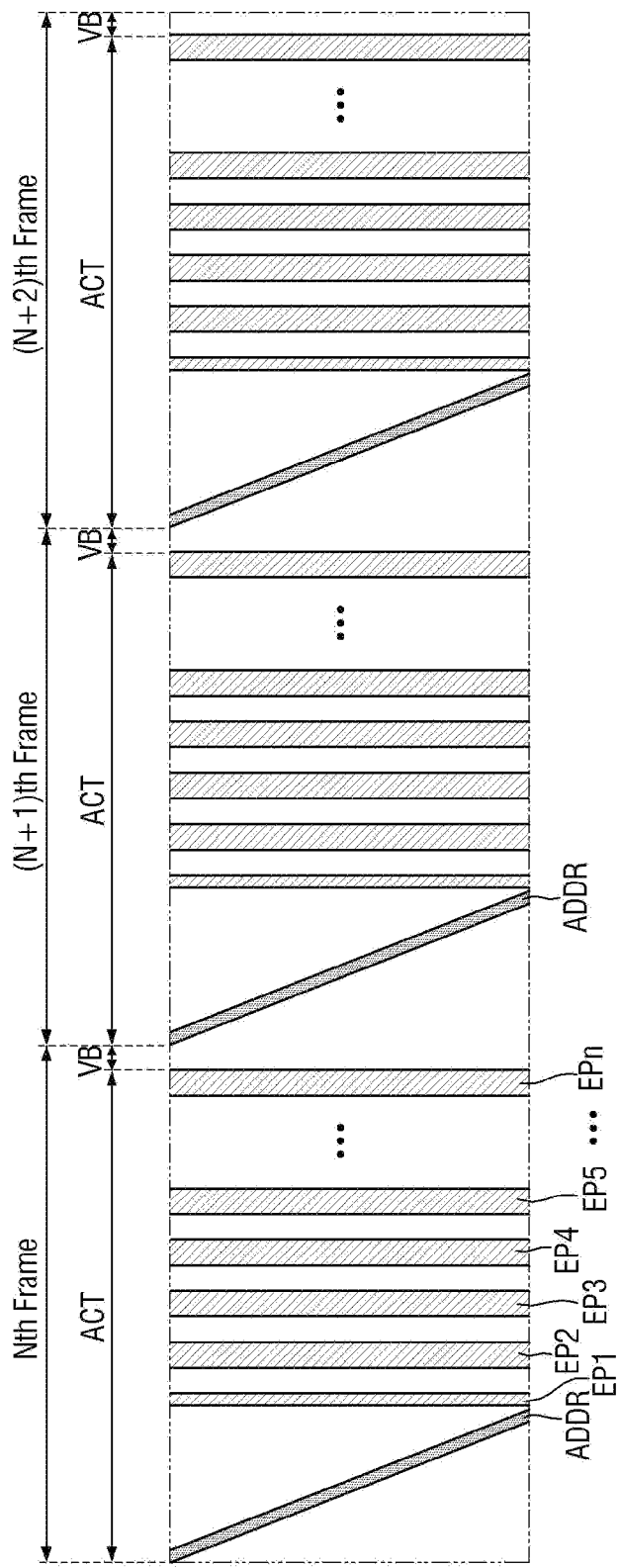
FIG. 6 is another schematic view illustrating an operation of a display device during Nth to (N+2)th frame periods.

FIG. 6 is another schematic view illustrating an operation of a display device during Nth to (N+2)th frame periods.

The embodiment of FIG. 6 may be different from the embodiment of FIG. 5 in that in FIG. 6, the sub-pixels RP, GP, and BP of the display panel 100 may concurrently (e.g., may simultaneously) emit light with each other in each of the plurality of emission periods EP1, EP2, EP3, EP4, EP5, . . . , EPn. Otherwise, the embodiment of FIG. 6 may be the same or substantially the same as the embodiment of FIG. 5, and thus, redundant description thereof will not be repeated.

Figure 7:
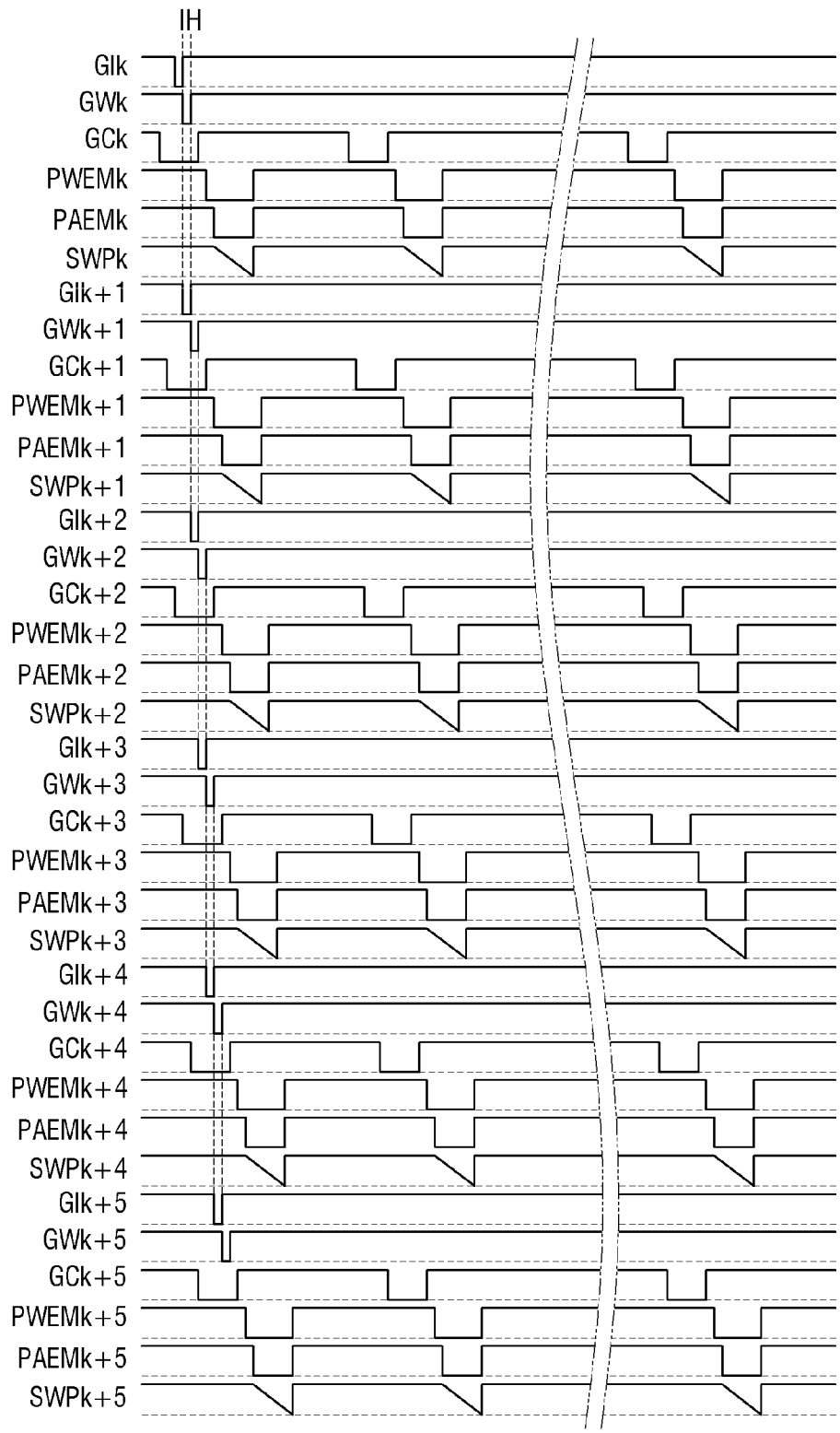
FIG. 7 is a waveform diagram illustrating scan initialization signals, scan write signals, scan control signals, pulse width modulation (PWM) emission signals, pulse amplitude modulation (PAM) emission signals, and sweep signals applied to sub-pixels disposed in kth to (k+5)th row lines during the Nth frame period.

FIG. 7 is a waveform diagram illustrating scan initialization signals, scan write signals, scan control signals, PWM emission signals, PAM emission signals, and sweep signals applied to sub-pixels disposed in kth to (k+5)th row lines in the Nth frame period.

Referring to FIG. 7, sub-pixels RP, GP, and BP disposed in a kth row line refer to the sub-pixels RP, GP, and BP connected to the kth scan initialization line GWLk, the kth scan write line GWLk, the kth scan control line GCLk, the kth PWM emission line PWELk, the kth PAM emission line PAELk, and the kth sweep signal line SWPLk. The kth scan initialization signal GIk refers to a signal applied to the kth scan initialization line GWLk, and the kth scan write signal GWk refers to a signal applied to the kth scan write line GWLk. The kth scan control signal GCk refers to a signal applied to the kth scan control line GCLk, and the kth PWM emission signal PWEMk refers to a signal applied to the kth PWM emission line PWELk. The kth PAM emission signal PAEMk refers to a signal applied to the kth PAM emission line PAELk, and the kth sweep signal SWPk refers to a signal applied to the kth sweep signal line SWPLk.

Scan initialization signals GIk to GIk+5, scan write signals GWk to GWk+5, scan control signals GCk to GCk+5, PWM emission signals PWEMk to PWEMk+5, PAM emission signals PAEMk to PAEMk+5, and sweep signals SWPk to SWPk+5 may be sequentially shifted by one horizontal period (1H). The kth scan write signal GWk may be a signal shifted from the kth scan initialization signal GIk by one horizontal period, and a (k+1)th scan write signal GWk+1 may be a signal shifted from a (k+1)th scan initialization signal GIk+1 by one horizontal period. In this case, the (k+1)th scan initialization signal GIk+1 may be a signal shifted from the kth scan initialization signal GIk by one horizontal period, and thus, the kth scan write signal GWk and the (k+1)th scan initialization signal GIk+1 may be the same or substantially the same as each other.

Figure 8:
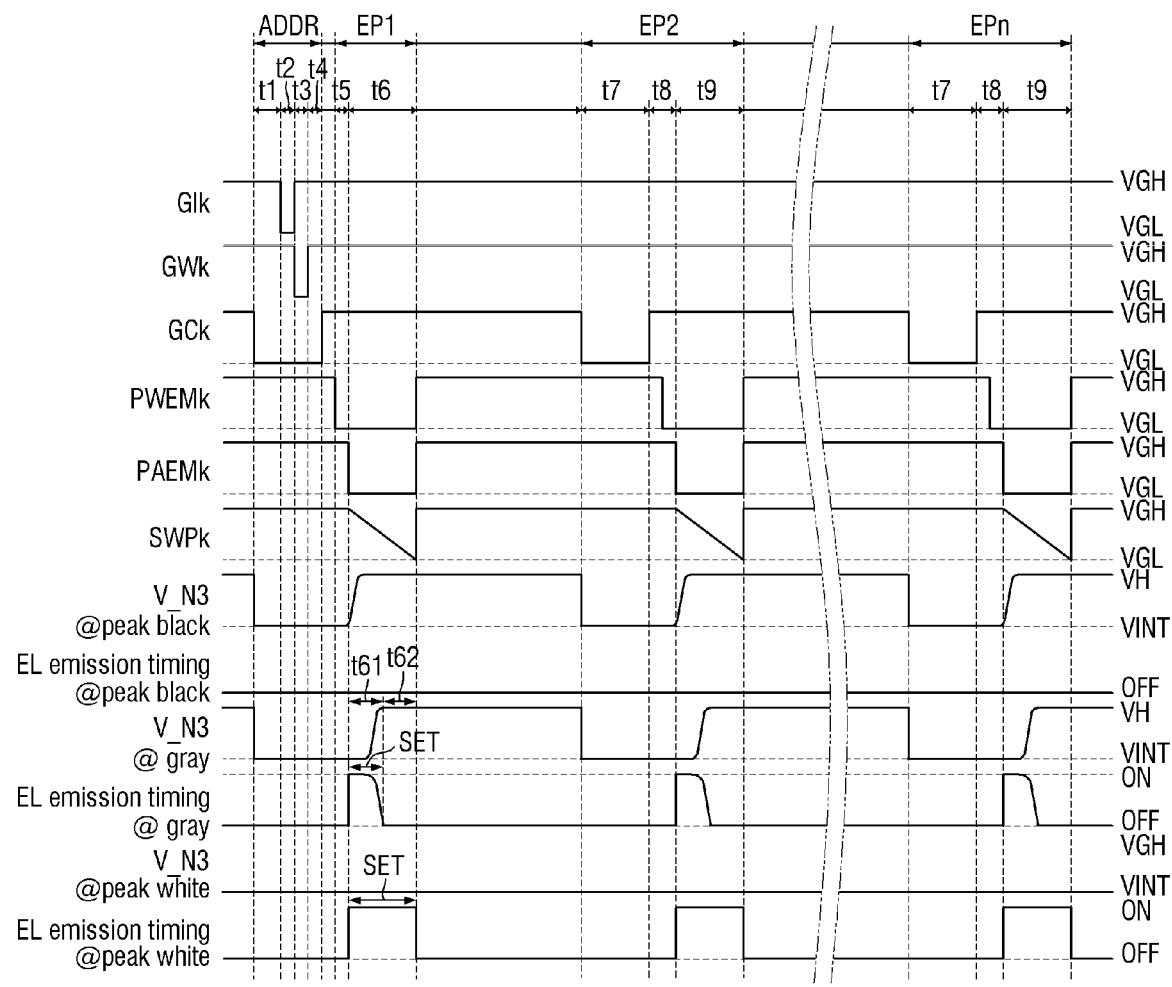
FIG. 8 is a waveform diagram illustrating a scan initialization signal, a scan write signal, a scan control signal, a PWM emission signal, a PAM emission signal, and a sweep signal applied to each of sub-pixels disposed in a kth row line, a voltage of a third node of a first sub-pixel, and a period in which a driving current is applied to a light emitting element, in the Nth frame period.

FIG. 8 is a waveform diagram illustrating a kth scan initialization signal, a kth scan write signal, a kth scan control signal, a kth PWM emission signal, a kth PAM emission signal, a kth sweep signal, a voltage of a third node of a first sub-pixel, and a period in which a driving current is applied to a light emitting element, in the Nth frame period.

Referring to FIG. 8, the kth scan initialization signal GIk is a signal for controlling turn-on and turn-off of the third and tenth transistors T3 and T10 of each of the sub-pixels RP, GP, and BP. The kth scan write signal GWk is a signal for controlling turn-on and turn-off of the second, fourth, ninth, and eleventh transistors T2, T4, T9, and T11 of each of the sub-pixels RP, GP, and BP. The kth scan control signal GCk is a signal for controlling turn-on and turn-off of the seventh, thirteenth, sixteenth, and eighteenth transistors T7, T13, T16, and T18 of each of the sub-pixels RP, GP, and BP. The kth PWM emission signal PWEMk is a signal for controlling turn-on and turn-off of the fifth, sixth, twelfth, and fourteenth transistors T5, T6, T12, and T14. The kth PAM emission signal PAEMk is a signal for controlling turn-on and turn-off of the seventeenth transistor T17. The kth scan initialization signal, the kth scan write signal, the kth scan control signal, the kth PWM emission signal, the kth PAM emission signal, and the kth sweep signal may be generated with one frame period as a cycle.

The data address period ADDR includes first to fourth periods t1 to t4. The first period t1 and the fourth period t4 are first initialization periods in which the first electrode and the voltage of the third node N3 of the light emitting element EL are initialized. The second period t2 is a second initialization period in which the gate electrode of the first transistor T1 and the gate electrode of the eighth transistor T8 are initialized. The third period t3 is a period in which a data voltage Vdata of the jth data line DLj and a threshold voltage Vth1 of the first transistor T1 are sampled at the gate electrode of the first transistor T1, and a first PAM data voltage Rdata of the first PAM data line RDL and a threshold voltage Vth8 of the eighth transistor T8 are sampled at the gate electrode of the eighth transistor T8.

The first emission period EP1 includes a fifth period t5 and a sixth period t6. The fifth period t5 is a period in which the control current Ic is applied to the third node N3, and the sixth period t6 is a period in which a turn-on period of the fifteenth transistor T15 is controlled according to the control current Ic, and the driving current Ids is supplied to the light emitting element EL.

Each of the second to nth emission periods EP2 to EPn includes seventh to ninth periods t7 to t9. The seventh period t7 is a third initialization period in which the third node N3 is initialized, the eighth period t8 is a period that is the same or substantially the same as the fifth period t5, and the ninth period t9 is a period that is the same or substantially the same as the sixth period t6.

Emission periods that are adjacent to each other from among the first to nth emission periods EP1 to EPn may be spaced apart from each other by approximately several to several tens of horizontal periods.

The kth scan initialization signal GIk may have a gate-on voltage VGL during the second period t2, and may have a gate-off voltage VGH during other periods. The kth scan write signal GWk may have a gate-on voltage VGL during the third period t3, and may have a gate-off voltage VGH during other periods. The kth scan control signal GCk may have a gate-on voltage VGL during the first to fourth periods t1 to t4 and during the seven period t7, and may have a gate-off voltage VGH during other periods. The gate-off voltage VGH may be a voltage having a higher level than that of the gate-on voltage VGL, but the present disclosure is not limited thereto, and the gate-off voltage VGH may be a voltage having a lower level than that of the gate-on voltage VGL according to a type of a transistor.

The kth PWM emission signal PWEMk may have a gate-on voltage VGL during the fifth and sixth periods t5 and t6 and during the eighth and ninth periods t8 and t9, and may have a gate-off voltage VGH during other periods. The kth PAM emission signal PAEMk may have a gate-on voltage VGL during the sixth period t6 and during the ninth period t9, and may have a gate-off voltage VGH during other periods.

The kth sweep signal SWPk may include a pulse having a triangular wave shape during the sixth period t6 and during the ninth period t9, and may have a gate-off voltage VGH during other periods. For example, the kth sweep signal SWPk may include the pulse having the triangular wave shape that linearly decreases from the gate-off voltage VGH to the gate-on voltage VGL during the sixth period t6, and increases from the gate-on voltage VGL to the gate-off voltage VGH at an end of the sixth period t6.

The kth PWM emission signal PWEMk may have the gate-on voltage VGL during the fifth and sixth periods t5 and t6 and during the eighth and ninth periods t8 and t9, and may have the gate-off voltage VGH during the other periods. The kth PAM emission signal PAEMk may have the gate-on voltage VGL during the sixth period t6 and during the ninth period t9, and may have a gate-off voltage VGH during the other periods. A pulse width of the kth PWM emission signal PWEMk may be greater than a pulse width of the kth sweep signal SWPk.

FIGS. 9 to 12 are circuit diagrams illustrating an operation of the first sub-pixel during a first period, a second period, a third period, and a sixth period.

Hereinafter, for convenience, an operation of the first sub-pixel RP during the first to ninth periods t1 to t9 will be described in more detail with reference to FIGS. 8 to 12.

Figure 9:
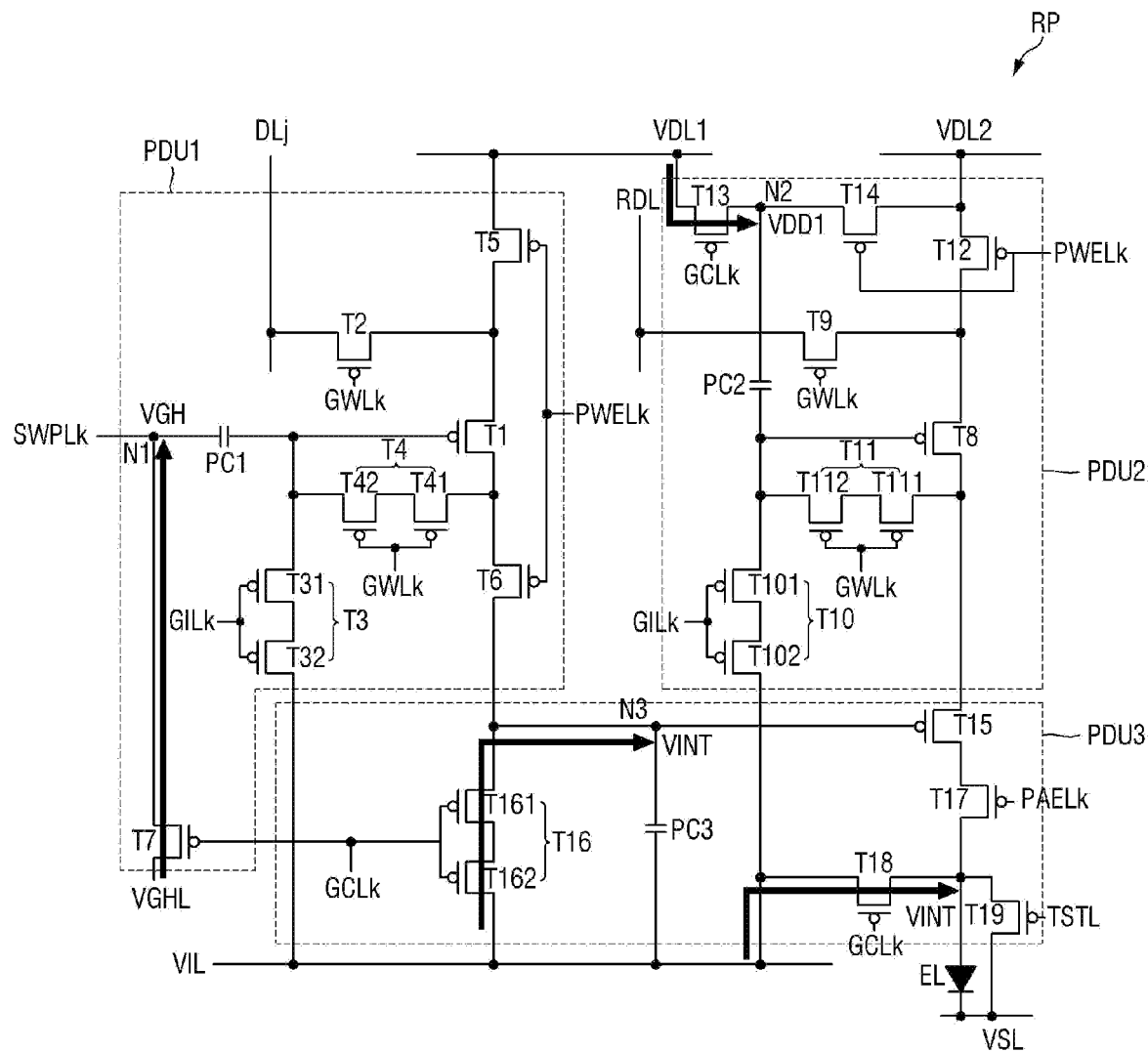
FIGS. 9-12 are circuit diagrams illustrating an operation of the first sub-pixel during a first period, a second period, a third period, and a sixth period.

First, during the first period t1, the seventh transistor T7, the thirteenth transistor T13, the sixteenth transistor T16, and the eighteenth transistor T18 are turned on by the kth scan control signal GCk having the gate-on voltage VGL, as illustrated in FIG. 9.

Due to the turn-on of the seventh transistor T7, the gate-off voltage VGH of the gate-off voltage line VGHL is applied to the first node N1. Due to the turn-on of the thirteenth transistor T13, the first source voltage VDD1 of the first power line VDL1 is applied to the second node N2.

Due to the turn-on of the sixteenth transistor T16, the third node N3 is initialized to the initialization voltage VINT of the initialization voltage line VIL. Due to the turn-on of the eighteenth transistor T18, the first electrode of the light emitting element EL is initialized to the initialization voltage VINT of the initialization voltage line VIL.

Figure 10:
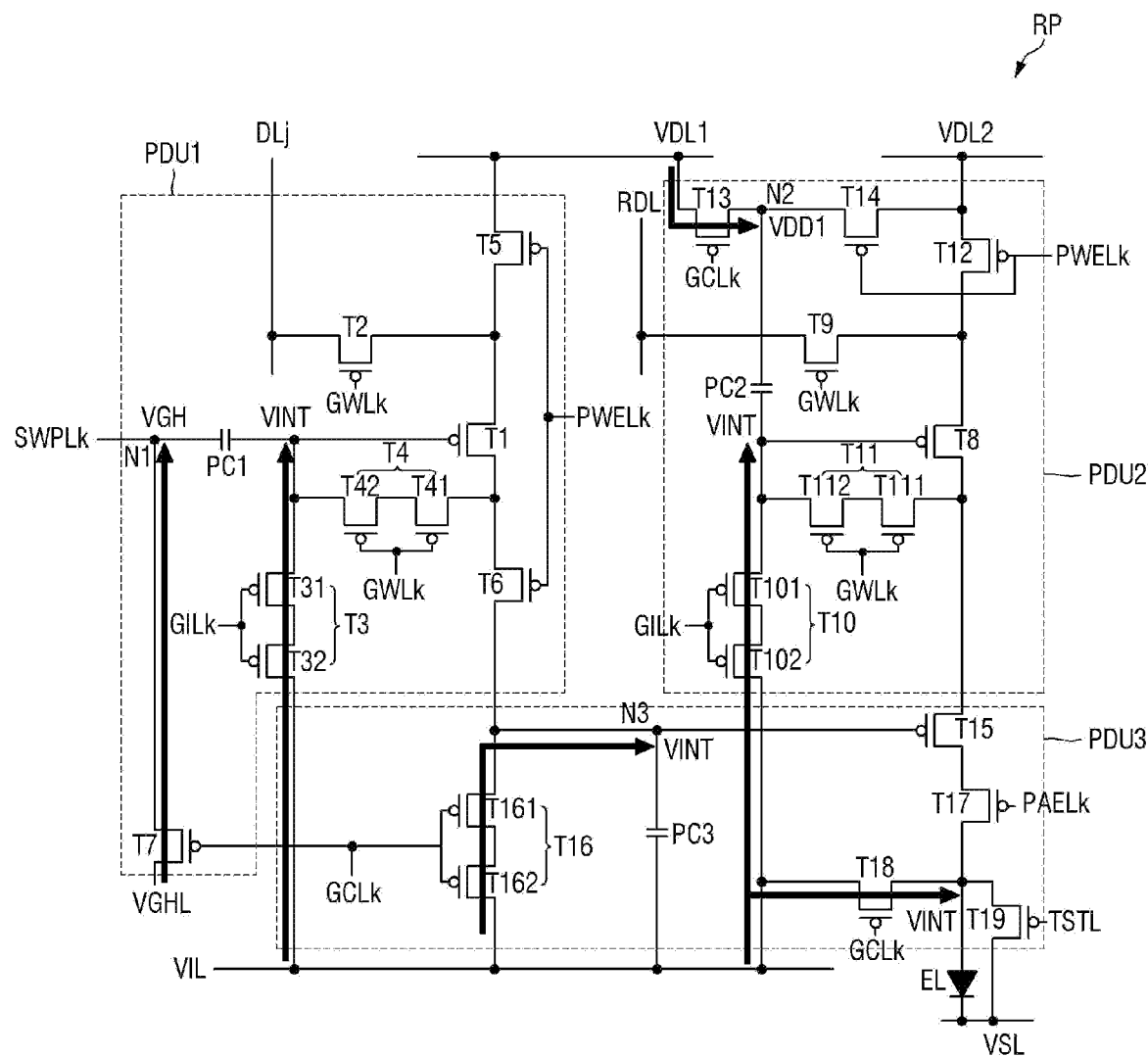

Second, during the second period t2, the seventh transistor T7, the thirteenth transistor T13, the sixteenth transistor T16, and the eighteenth transistor T18 maintain the on state by the kth scan control signal GCk having the gate-on voltage VGL, as illustrated in FIG. 10. In addition, during the second period t2, the third transistor T3 and the tenth transistor T10 are turned on by the kth scan initialization signal GIk having the gate-on voltage VGL.

The seventh transistor T7, the thirteenth transistor T13, the sixteenth transistor T16, and the eighteenth transistor T18 are the same or substantially the same as those described above with reference to the first period t1.

Due to the turn-on of the third transistor T3, the gate electrode of the first transistor T1 is initialized to the initialization voltage VINT of the initialization voltage line VIL. In addition, due to the turn-on of the tenth transistor T10, the gate electrode of the eighth transistor T8 is initialized to the initialization voltage VINT of the initialization voltage line VIL.

In this case, the gate-off voltage VGH of the gate-off voltage line VGHL is applied to the first node N1, and thus, it may be possible to prevent or substantially prevent a phenomenon in which a change amount in the voltage of the gate electrode of the first transistor T1 is reflected in the kth sweep signal line SWPLk by the first capacitor PC1, such that the gate-off voltage VGH of the kth sweep signal SWPk is changed.

Figure 11:
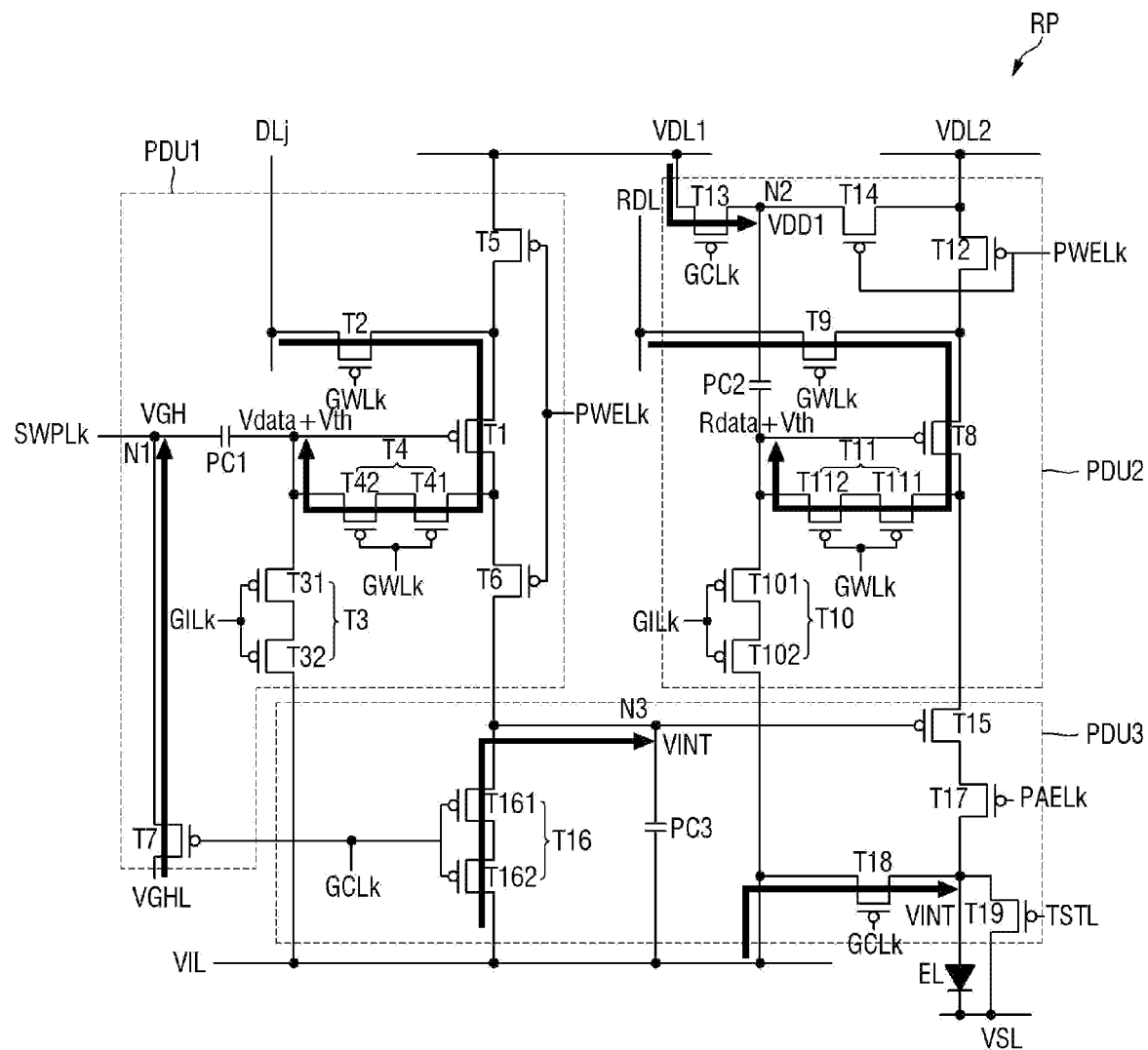

Third, during the third period t3, the seventh transistor T7, the thirteenth transistor T13, the sixteenth transistor T16, and the eighteenth transistor T18 maintain the on state by the kth scan control signal GCk having the gate-on voltage VGL, as illustrated in FIG. 11. In addition, during the third period t3, the second transistor T2, the fourth transistor T4, the ninth transistor T9, and the eleventh transistor T11 are turned on by the kth scan write signal GWk having the gate-on voltage VGL.

The seventh transistor T7, the thirteenth transistor T13, the sixteenth transistor T16, and the eighteenth transistor T18 are the same or substantially the same as those described above with reference to the first period t1.

Due to the turn-on of the second transistor T2, the data voltage Vdata of the jth data line DLj is applied to the first electrode of the first transistor T1. Due to the turn-on of the fourth transistor T4, the gate electrode and the second electrode of the first transistor T1 are connected to each other, and thus, the first transistor T1 is driven as a diode.

In this case, a voltage (e.g., Vgs=Vint−Vdata) between the gate electrode and the first electrode of the first transistor T1 is greater than the threshold voltage Vth1, and thus, the first transistor T1 forms a current path until the voltage Vgs between the gate electrode and the first electrode thereof reaches the threshold voltage Vth1. Accordingly, the voltage of the gate electrode of the first transistor T1 may increase from "Vint" to "Vdata+Vth1". Because the first transistor T1 is formed as the P-type MOSFET, the threshold voltage Vth1 of the first transistor T1 may be less than 0V.

In addition, the gate-off voltage VGH of the gate-off voltage line VGHL is applied to the first node N1, and thus, it may be possible to prevent or substantially prevent a phenomenon in which a change amount in the voltage of the gate electrode of the first transistor T1 is reflected in the kth sweep signal line SWPLk by the first capacitor PC1, such that the gate-off voltage VGH of the kth sweep signal SWPk is changed.

Due to the turn-on of the ninth transistor T9, the first PAM data voltage Rdata of the first PAM data line RDL is applied to the first electrode of the eighth transistor T8. Due to the turn-on of the eleventh transistor T11, the gate electrode and the second electrode of the eighth transistor T8 are connected to each other, and thus, the eighth transistor T8 is driven as a diode.

In this case, a voltage (e.g., Vgs=Vint−Rdata) between the gate electrode and the first electrode of the eighth transistor T8 is greater than the threshold voltage Vth8, and thus, the eighth transistor T8 forms a current path until the voltage Vgs between the gate electrode and the first electrode thereof reaches the threshold voltage Vth8. Accordingly, the voltage of the gate electrode of the eighth transistor T8 may increase from "Vint" to "Rdata+Vth8".

Fourth, during the fourth period t4, the seventh transistor T7, the thirteenth transistor T13, the sixteenth transistor T16, and the eighteenth transistor T18 maintain the on state by the kth scan control signal GCk having the gate-on voltage VGL.

The seventh transistor T7, the thirteenth transistor T13, the sixteenth transistor T16, and the eighteenth transistor T18 are the same or substantially the same as those described above with reference to the first period t1.

Fifth, during the fifth period t5, the fifth transistor T5, the sixth transistor T6, the twelfth transistor T12, and the fourteenth transistor T14 are turned on by the kth PWM emission signal PWEMk having the gate-on voltage VGL.

Due to the turn-on of the fifth transistor T5, the first source voltage VDD1 is applied to the first electrode of the first transistor T1. In addition, due to the turn-on of the sixth transistor T6, the second electrode of the first transistor T1 is connected to the third node N3. However, during the fifth period t5, the voltage (e.g., Vdata+Vth1) of the gate electrode of the first transistor T1 may be the same as or substantially the same as the first source voltage VDD1, or may be higher than the first source voltage VDD1. Therefore, during the fifth period t5, the first transistor T1 may be turned off.

In addition, due to the turn-on of the twelfth transistor T12, the first electrode of the eighth transistor T8 may be connected to the second power line VDL2.

In addition, due to the turn-on of the fourteenth transistor T14, the second source voltage VDD2 of the second power line VDL2 is applied to the second node N2. When the second source voltage VDD2 of the second power line VDL2 is changed due to a voltage drop and/or the like, a voltage difference ΔV2 between the first source voltage VDD1 and the second source voltage VDD2 may be reflected in the gate electrode of the eighth transistor T8 by the second capacitor PC2.

Due to the turn-on of the fourteenth transistor T14, the driving current Ids flowing according to the voltage (e.g., Rdata+Vth8) of the gate electrode of the eighth transistor T8 may be supplied to the fifteenth transistor T15. As represented in Equation 1, the driving current Ids may not depend on the threshold voltage Vth8 of the eighth transistor T8.

$$Ids = k' \times (Vgs - Vth8)^2 = k' \times (Rdata + Vth8 - VDD2 - Vth8)^2 = k' \times (Rdata - VDD2)^2 \quad \text{[Equation 1]}$$

In Equation 1, k' refers to a proportional coefficient determined by a structure and physical properties of the eighth transistor T8, Vth8 refers to the threshold voltage of the eighth transistor T8, VDD2 refers to the second source voltage, and Rdata refers to the first PAM data voltage.

Figure 12:
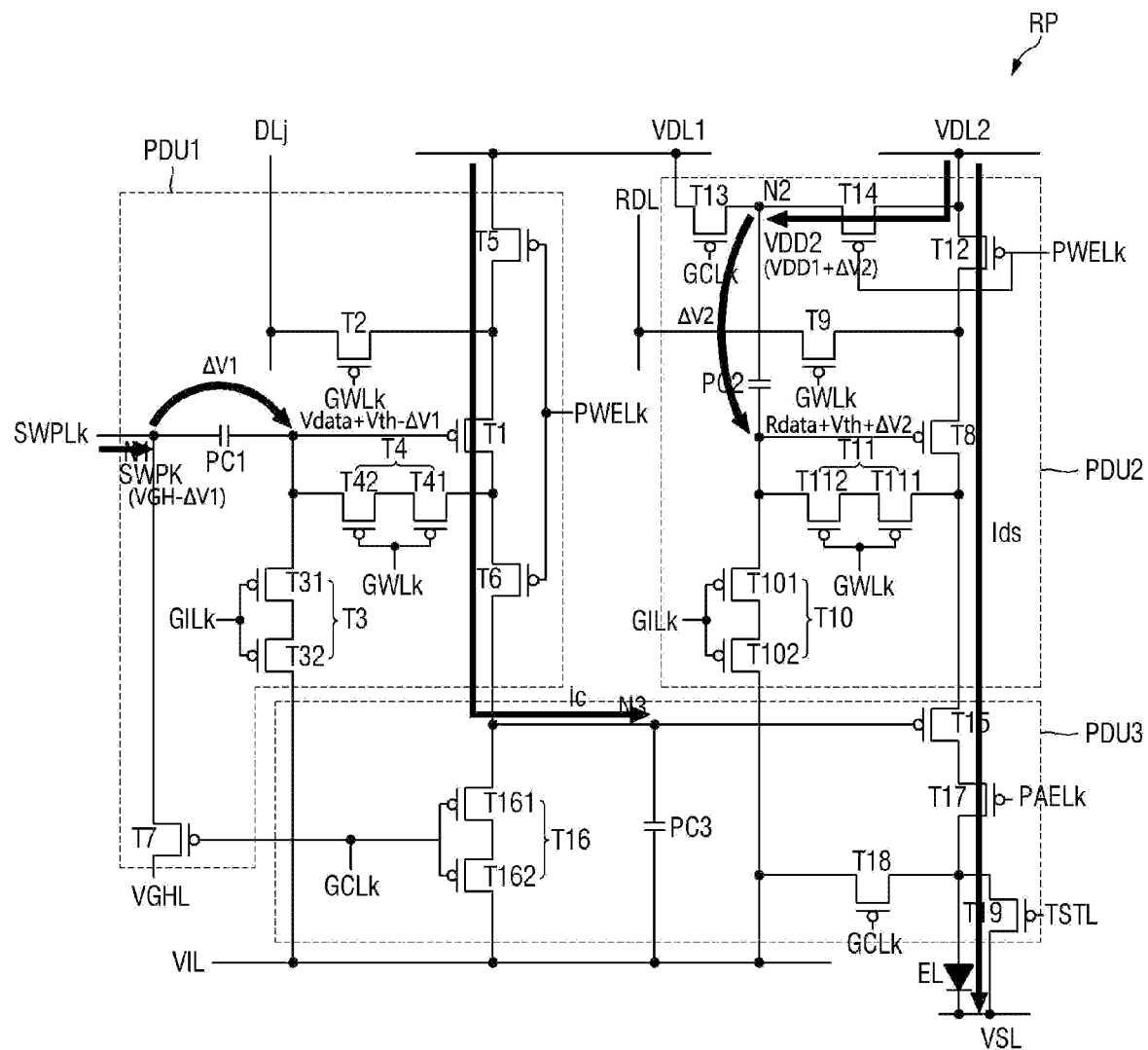

Sixth, during the sixth period t6, the fifth transistor T5, the sixth transistor T6, the twelfth transistor T12, and the fourteenth transistor T14 maintain the on state by the kth PWM emission signal PWEMk having the gate-on voltage VGL, as illustrated in FIG. 12. During the sixth period t6, the seventeenth transistor T17 is turned on by the kth PAM emission signal PAEMk having the gate-on voltage VGL, as illustrated in FIG. 12. During the sixth period t6, the kth sweep signal SWPk linearly decreases from the gate-off voltage VGH to the gate-on voltage VGL.

The fifth transistor T5, the sixth transistor T6, the twelfth transistor T12, and the fourteenth transistor T14 are the same or substantially the same as those described above with reference to the fifth period t5.

Due to the turn-on of the seventeenth transistor T17, the first electrode of the light emitting element EL may be connected to the second electrode of the fifteenth transistor T15.

During the sixth period t6, the kth sweep signal SWPk linearly decreases from the gate-off voltage VGH to the gate-on voltage VGL, and a change amount in the voltage of the kth sweep signal SWPk is reflected in the gate electrode of the first transistor T1 by the first capacitor PC1, and thus, the voltage of the gate electrode of the first transistor T1 may be Vdata+Vth1−ΔV1. In other words, as the voltage of the kth sweep signal SWPk linearly decreases during the sixth period t6, the voltage of the gate electrode of the first transistor T1 may linearly decrease.

As represented in Equation 2, during the sixth period t6, the control current Ic flowing according to the voltage (e.g., Vdata+Vth1) of the gate electrode of the first transistor T1 may not depend on the threshold voltage Vth1 of the first transistor T1.

$$Ids=k''\times(Vgs-Vth1)^2=k''\times(Vdata+Vth1-VDD1-Vth1)^2=k''\times(Vdata-VDD1)^2 \quad \text{[Equation 2]}$$

In Equation 2, k'' refers to a proportional coefficient determined by a structure and physical properties of the first transistor T1, Vth1 refers to the threshold voltage of the first transistor T1, VDD1 refers to the first source voltage, and Vdata refers to the first data voltage.

A period in which the control current Ic is applied to the third node N3 may change depending on a magnitude of the data voltage Vdata applied to the first transistor T1. Accordingly, the voltage of the third node N3 changes depending on the magnitude of the data voltage Vdata applied to the first transistor T1, and thus, a turn-on period of the fifteenth transistor T15 may be controlled. Therefore, a period SEP in which the driving current Ids is applied to the light emitting element EL during the sixth period t6 may be controlled by controlling the turn-on period of the fifteenth transistor T15.

When a PWM data voltage Vdata of the gate electrode of the first transistor T1 is a PWM data voltage of a peak black gray level, the voltage of the gate electrode of the first transistor T1 may be lower than the first source voltage VDD1, which is a voltage of the first electrode of the first transistor T1, throughout the sixth period t6 due to a decrease in the voltage of the kth sweep signal SWPk. Therefore, the first transistor T1 may be turned on throughout the sixth period t6. Accordingly, the control current Ic of the first transistor T1 flows to the third node N3 throughout the sixth period t6, and the voltage of the third node N3 may increase to a high level VH with the start of the sixth period t6. Therefore, the fifteenth transistor T15 may be turned off throughout the sixth period t6. Accordingly, the driving current Ids is not applied to the light emitting element EL during the sixth period t6, and thus, the light emitting element EL may not emit light during the sixth period t6.

On the other hand, when the PWM data voltage Vdata of the gate electrode of the first transistor T1 is a PWM data voltage of a gray gray level, the voltage of the gate electrode of the first transistor T1 may have a level higher than the first source voltage during a first sub-period t61, and may have a level lower than the first source voltage during a second sub-period t62, due to the decrease in the voltage of the kth sweep signal SWPk. Therefore, the first transistor T1 may be turned on during the second sub-period t62 of the sixth period t6. In this case, the control current Ic of the first transistor T1 flows to the third node N3 during the second sub-period t62, and thus, the voltage of the third node N3 may have a high level VH during the second sub-period t62. Therefore, the fifteenth transistor T15 may be turned off during the second sub-period t62. Accordingly, the driving current Ids may be applied to the light emitting element EL during the first sub-period t61, and the driving current Ids may not be applied to the light emitting element EL during the second sub-period t62. In other words, the light emitting element EL may emit light during the first sub-period t61, which is a portion of the sixth period t6. As the first sub-pixel RP expresses a gray gray level close to the peak black gray level, an emission period SET of the light emitting element EL may become shorter. As the first sub-pixel RP expresses a gray gray level close to a peak white gray level, an emission period SET of the light emitting element EL may become longer.

When the PWM data voltage Vdata of the gate electrode of the first transistor T1 is a PWM data voltage of a peak white gray level, the voltage of the gate electrode of the first transistor T1 may be higher than the first source voltage VDD1 during the sixth period t6, irrespective of the decrease in the voltage of the k-th sweep signal SWPk. Accordingly, the first transistor T1 may be turned off throughout the sixth period t6. In this case, the control current Ic of the first transistor T1 does not flow to the third node N3 throughout the sixth period t6, and thus, the voltage of the third node N3 may be maintained or substantially maintained as the initialization voltage VINT. Therefore, the fifteenth transistor T15 may be turned on throughout the sixth period t6. Accordingly, the driving current Ids may be applied to the light emitting element EL throughout the sixth period t6, and the light emitting element EL may emit light throughout the sixth period t6.

As described above, the emission period of the light emitting element EL may be adjusted by adjusting the data voltage applied to the gate electrode of the first transistor T1. Therefore, gray levels or a luminance displayed by the first sub-pixel RP may be adjusted by adjusting a pulse width of the voltage applied to the first electrode of the light emitting element EL, while maintaining or substantially maintaining the driving current Ids applied to the light emitting element EL to be constant or substantially constant, rather than adjusting a magnitude of the driving current Ids applied to the light emitting element EL.

When digital video data that is converted into data voltages is data of 8 bits, the digital video data that is converted to a data voltage of a peak black gray level may be 0, and the digital video data that is converted to a data voltage of a peak white gray level may be 255. In this case, a data voltage of a gray gray level may be data other than 0 and 255 (e.g., may be data between 0 and 255).

In addition, the seventh period t7, the eighth period t8, and the ninth period t9 of each of the second to nth emission periods EP2 to EPn are the same or substantially the same as the above-described first period t1, fifth period t5, and sixth period t6, respectively. In other words, in each of the second to nth emission periods EP2 to EPn, after the third node N3 is initialized, a period in which the driving current Ids that is generated according to the first PAM data voltage Rdata written in the gate electrode of the eighth transistor T8 is applied to the light emitting element EL may be adjusted based on the data voltage Vdata written in the gate electrode of the first transistor T1 during the data address period ADDR.

Because the test signal of the test signal line TSTL may be applied as a gate high voltage VGH during the active period ACT of the Nth frame period, the nineteenth transistor T19 may be turned off during the active period ACT of the Nth frame period.

The second sub-pixel GP and the third sub-pixel BP may operate in the same or substantially the same manner as that of the first sub-pixel RP described above with reference to FIGS. 8 to 12, and thus, redundant description thereof will not be repeated.

Figure 13:
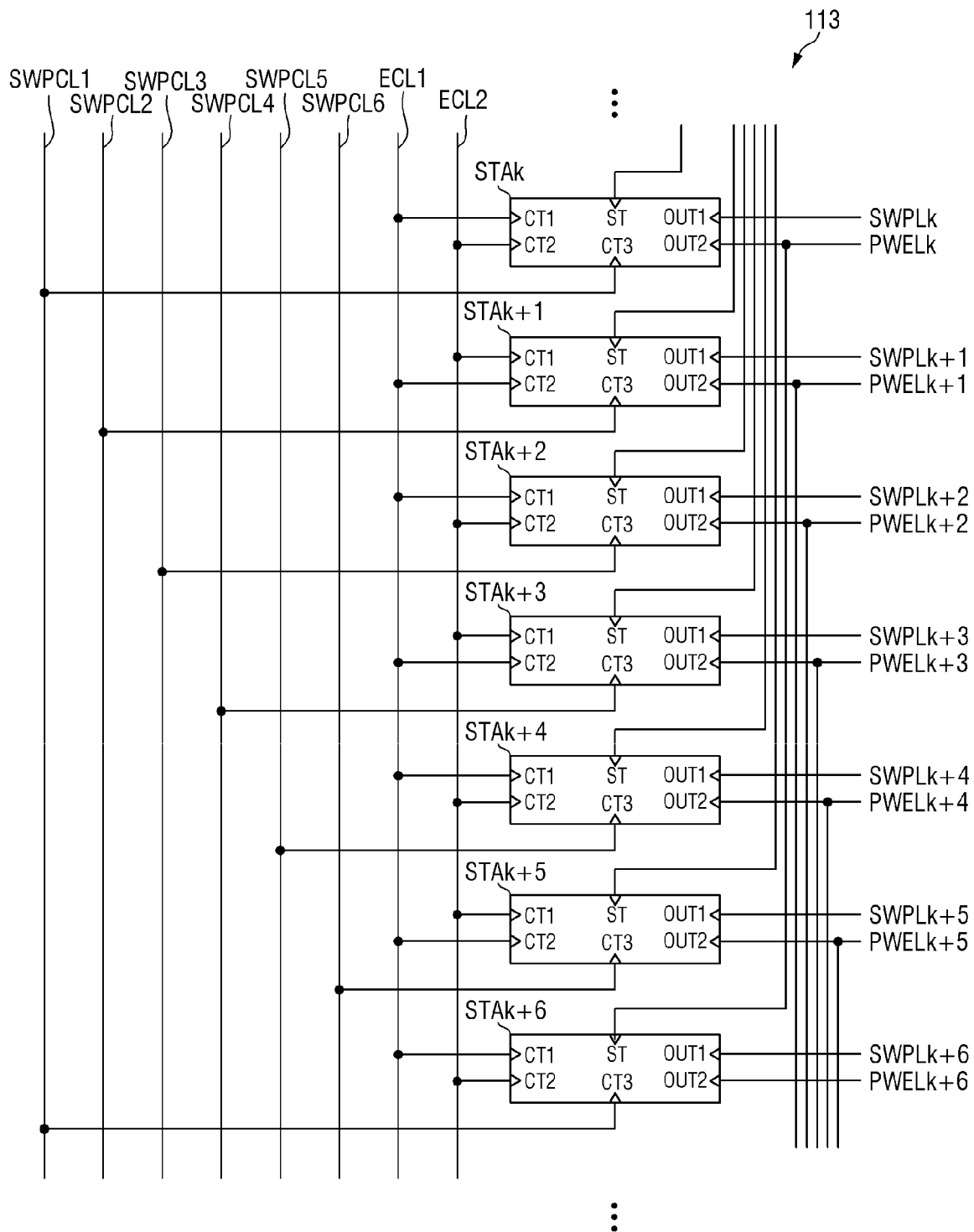
FIG. 13 is a block diagram illustrating a sweep signal driver according to an embodiment.

FIG. 13 is a block diagram illustrating a sweep signal driver according to an embodiment. In FIG. 13, for convenience of illustration, kth to (k+6)th stages STAk to STAk+6 of the sweep signal driver 113 are illustrated, where k is a natural number.

As used herein, a "previous stage" refers to a stage positioned in front of (e.g., before) a reference stage. For example, previous stages of a (k+1)th stage STAk+1 refer to first to kth stages, and previous stages of a (k+2)th stage STAk+2 refer to first to (k+1)th stages.

Referring to FIG. 13, emission clock lines ECL1 and ECL2 and sweep clock lines SWPCL1 to SWPCL6 may be disposed at (e.g., in or on) one side of the k to (k+6)th stages STAk to STAk+6. Emission clock signals having phases that are sequentially delayed may be applied to the emission clock lines ECL1 and ECL2. Sweep clock signals having phases that are sequentially delayed may be applied to the sweep clock lines SWPCL1 to SWPCL6. The first emission control signal ECS1 described above with reference to FIG. 1 may include the emission clock signals, and the sweep control signal SPCS may include the sweep clock signals. Two emission clock lines ECL1 and ECL2 and six sweep clock lines SWPCL1 to SWPCL6 are illustrated in FIG. 13 for convenience, but the number of emission clock lines ECL1 and ECL2 and the number of sweep clock lines SWPCL1 to SWPCL6 are not limited thereto.

The sweep signal driver 113 includes a plurality of stages STAk to STAk+6 connected to sweep signal lines SWPLk to SWPLk+6 and PWM emission lines PWELk to PWELk+6. For example, the kth stage STAk may output a kth sweep signal to a kth sweep signal line SWPLk, and may output a kth PWM emission signal to the kth PWM emission line PWELk. The (k+1)th stage STAk+1 may output a (k+1)th sweep signal to a (k+1)th sweep signal line SWPLk+1, and may output a (k+1)th PWM emission signal to a (k+1)th PWM emission line PWELk+1.

Each of the plurality of stages STAk to STAk+6 includes a start terminal ST, a first clock terminal CT1, a second clock terminal CT2, a third clock terminal CT3, a first output terminal OUT1, and a second output terminal OUT2. The first clock terminal CT1 may be a first emission clock terminal to which any one of the emission clock signals of the emission clock lines ECL1 and ECL2 is input, and the second clock terminal CT2 may be a second emission clock terminal to which the other of the emission clock signals of the emission clock lines ECL1 and ECL2 is input. The third clock terminal CT3 may be a sweep clock terminal to which any one of the sweep clock signals of the sweep clock lines SWPCL1 to SWPCL6 is input.

The start terminal ST of each of the plurality of stages STAk to STAk+6 may be connected to a start signal line or the second output terminal OUT2 of a previous stage. For example, the start signal line may be connected to a start terminal ST of a first stage, which is a 1$^{st}$ stage of the sweep signal driver 113. Accordingly, a start signal of the start signal line may be input to the start terminal ST of the first stage. In addition, as illustrated in FIG. 13, the start terminal ST of the (k+6)th stage STAk+6 may be connected to the second output terminal OUT2 of the kth stage STAk. In this case, the kth PWM emission signal output to the second output terminal OUT2 of the kth stage STAk may be input to the start terminal ST of the (k+6)th stage STAk+6. The first clock terminal CT1 of each of the plurality of stages STAk to STAk+6 may be connected to any one of the emission clock lines ECL1 and ECL2, and the second clock terminal CT2 of each of the plurality of stages STAk to STAk+6 may be connected to the other of the emission clock lines ECL1 and ECL2. The emission clock lines ECL1 and ECL2 may be alternately connected to the first clock terminals CT1 of the plurality of stages STAk to STAk+6. For example, the first emission clock line ECL1 may be connected to the first clock terminal CT1 of the kth stage STAk, the second emission clock line ECL2 may be connected to the first clock terminal CT1 of the (k+1)th stage STAk+1, the first emission clock line ECL1 may be connected to the first clock terminal CT1 of the (k+2)th stage STAk+2, the second emission clock line ECL2 may be connected to the first clock terminal CT1 of the (k+3)th stage STAk+3, and so on and so forth.

In addition, the emission clock lines ECL1 and ECL2 may be alternately connected to the second clock terminals CT2 of the plurality of stages STAk to STAk+6. For example, the second emission clock line ECL2 may be connected to the second clock terminal CT2 of the kth stage STAk, the first emission clock line ECL1 may be connected to the second clock terminal CT2 of the (k+1)th stage STAk+1, the second emission clock line ECL2 may be connected to the second clock terminal CT2 of the (k+2)th stage STAk+2, the first emission clock line ECL1 may be connected to the second clock terminal CT2 of the (k+3)th stage STAk+3, and so on and so forth.

The sweep clock lines SWPCL1 to SWPCL6 may be alternately connected to the third clock terminals CT3 of the plurality of stages STAk to STAk+6. For example, a first sweep clock line SWPCL1 may be connected to the third clock terminal CT3 of the kth stage STAk, a second sweep clock line SWPCL2 may be connected to the third clock terminal CT3 of the (k+1)th stage STAk+1, and a third sweep clock line SWPCL3 may be connected to the third clock terminal CT3 of the (k+2)th stage STAk+2. In addition, a fourth sweep clock line SWPCL4 may be connected to the third clock terminal CT3 of the (k+3)th stage STAk+3, a fifth sweep clock line SWPCL5 may be connected to the third clock terminal CT3 of the (k+4)th stage STAk+4, and a sixth sweep clock line SWPCL6 may be connected to the third clock terminal CT3 of the (k+5)th stage STAk+5. Further, the first sweep clock line SWPCL1 may be connected to the third clock terminal CT3 of the (k+6)th stage STAk+6.

The first output terminal OUT1 of each of the plurality of stages STAk to STAk+6 is connected to a corresponding one of the sweep signal lines SWPLk to SWPLk+6 to output the sweep signal, and the second output terminal OUT2 of each of the plurality of stages STAk to STAk+6 is connected to a corresponding one of the PWM emission lines PWELk to PWELk+6 to output the PWM emission signal. For example, as illustrated in FIG. 13, the first output terminal OUT1 of the kth stage STAk may be connected to the kth sweep signal line SWPLk to output the kth sweep signal, and the second output terminal OUT2 of the kth stage STAk may be connected to the kth PWM emission line PWELk to output the kth PWM emission signal. In addition, the first output terminal OUT1 of the (k+1)th stage STAk+1 may be connected to the (k+1)th sweep signal line SWPLk+1 to output the (k+1)th sweep signal, and the second output terminal OUT2 of the (k+1)th stage STAk+1 may be connected to the (k+1)th PWM emission line PWELk+1 to output the (k+1)th PWM emission signal.

As illustrated in FIG. 13, one stage of the sweep signal driver 113 may concurrently (e.g., may simultaneously) output the sweep signal and the PWM emission signal, and thus, an area of the scan driver 110 may be decreased.

Figure 14:
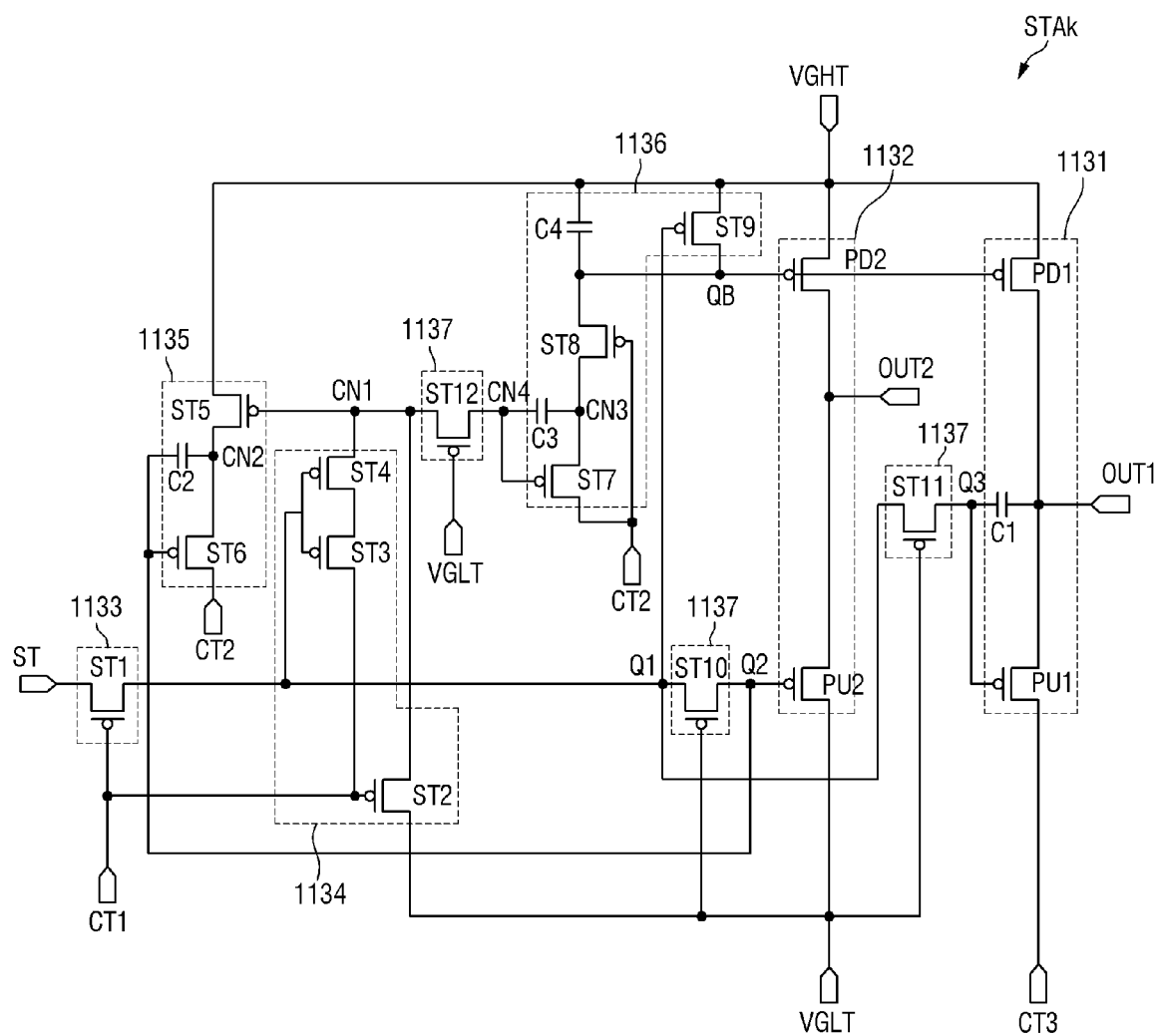
FIG. 14 is a circuit diagram illustrating a kth stage of the sweep signal driver according to an embodiment.

FIG. 14 is a circuit diagram illustrating a kth stage of the sweep signal driver according to an embodiment.

Referring to FIG. 14, the kth stage STAk includes the start terminal ST, the first clock terminal CT1, the second clock terminal CT2, the third clock terminal CT3, a gate-on voltage terminal VGLT, a gate-off voltage terminal VGHT, the first output terminal OUT1, and the second output terminal OUT2. A gate-on voltage is applied to the gate-on voltage terminal VGLT, and a gate-off voltage is applied to the gate-off voltage terminal VGHT. The gate-off voltage may be a voltage having a higher level than that of the gate-on voltage. As FIG. 14 shows the kth stage STAk in more detail, it will be mainly described that a first emission clock signal of the first emission clock line ECL1 is input to the first clock terminal CT1, a second emission clock signal of the second emission clock line ECL2 is input to the second clock terminal CT2, and a first sweep clock signal of the first sweep clock line SWPCL1 is input to the third clock terminal CT3, but the present disclosure is not limited thereto, and suitable modifications may be made as would be understood by those having ordinary skill in the art based on the stage of the sweep signal driver, for example, as shown in FIG. 13.

In addition, the kth stage STAk includes a first output unit (e.g., a first output circuit) 1131, a second output unit (e.g., a second output circuit) 1132, a pull-up node control unit (e.g., a pull-up node control circuit) 1133, a first control node control unit (e.g., a first control node control circuit) 1134, a second control node control unit (e.g., a second control node control circuit) 1135, a pull-down node control unit (e.g., a pull-down node control circuit) 1136, and a node connection unit (e.g., a node connection circuit) 1137.

The first output unit 1131 outputs to the first output terminal OUT1, the sweep clock signal input to the third clock terminal CT3 when a third pull-up node Q3 has a gate-on voltage. In addition, the first output unit 1131 outputs to the first output terminal OUT1, the gate-off voltage of the gate-off voltage terminal VGHT when a pull-down node QB has a gate-on voltage. The first output unit 1131 may include a first pull-up transistor PU1, a first pull-down transistor PD1, and a first capacitor C1.

A first pull-up node Q1, a second pull-up node Q2, and the third pull-up node Q3 may be electrically connected to each other. On the other hand, the pull-down node QB may be electrically disconnected from the first pull-up node Q1, the second pull-up node Q2, and the third pull-up node Q3.

The first pull-up transistor PU1 is turned on by the gate-on voltage of the third pull-up node Q3 to output the sweep clock signal input to the third clock terminal CT3 to the first output terminal OUT1. A gate electrode of the first pull-up transistor PU1 may be connected to the third pull-up node Q3, a first electrode of the first pull-up transistor PU1 may be connected to the first output terminal OUT1, and a second electrode of the first pull-up transistor PU1 may be connected to the third clock terminal CT3.

In order to increase an amount of current flowing through a channel of the first pull-up transistor PU1 when the first pull-up transistor PU1 is turned on, the first pull-up transistor PU1 may further include a second gate electrode electrically connected to the third pull-up node Q3. In this case, the first pull-up transistor PU1 may be formed in a double-gate structure including a first gate electrode corresponding to an upper gate electrode and a second gate electrode corresponding to a lower gate electrode.

The first pull-down transistor PD1 is turned on by the gate-on voltage of the pull-down node QB to output the gate-off voltage input to the gate-off voltage terminal VGHT to the first output terminal OUT1. A gate electrode of the first pull-down transistor PD1 may be connected to the pull-down node QB, a first electrode of the first pull-down transistor PD1 may be connected to the gate-off voltage terminal VGHT, and a second electrode of the first pull-down transistor PD1 may be connected to the first output terminal OUT1.

In order to prevent or decrease a leakage current flowing through the first pull-down transistor PD1, the first pull-down transistor PD1 may further include a second gate electrode connected to the gate-off voltage terminal VGHT. In this case, the first pull-down transistor PD1 may be formed in a double-gate structure including a first gate electrode corresponding to an upper gate electrode and a second gate electrode corresponding to a lower gate electrode.

The first capacitor C1 is disposed between the third pull-up node Q3 and the first output terminal OUT1. One electrode of the first capacitor C1 may be connected to the third pull-up node Q3, and the other electrode of the first capacitor C1 may be connected to the first output terminal OUT1. Because the first capacitor C1 stores a voltage difference between the third pull-up node Q3 and the first output terminal OUT1, the voltage difference between the third pull-up node Q3 and the first output terminal OUT1 may be maintained or substantially maintained to be constant or substantially constant by the first capacitor C1.

The second output unit 1132 outputs the gate-on voltage of the gate-on voltage terminal VGLT to the second output terminal OUT2 when the second pull-up node Q2 has a gate-on voltage. The second output unit 1132 outputs the gate-off voltage of the gate-off voltage terminal VGHT to the second output terminal OUT2 when the pull-down node QB has the gate-on voltage. The second output unit 1132 may include a second pull-up transistor PU2 and a second pull-down transistor PD2.

The second pull-up transistor PU2 is turned on by the gate-on voltage of the second pull-up node Q2 to output the gate-on voltage of the gate-on voltage terminal VGLT to the second output terminal OUT2. A gate electrode of the second pull-up transistor PU2 may be connected to the second pull-up node Q2, a first electrode of the second pull-up transistor PU2 may be connected to the second output terminal OUT2, and a second electrode of second pull-up transistor PU2 may be connected to the gate-on voltage terminal VGLT.

The second pull-down transistor PD2 is turned on by the gate-on voltage of the pull-down node QB to output the gate-off voltage of the gate-off voltage terminal VGHT to the second output terminal OUT2. A gate electrode of the second pull-down transistor PD2 may be connected to the pull-down node QB, a first electrode of the second pull-down transistor PD2 may be connected to the gate-off voltage terminal VGHT, and a second electrode of the second pull-down transistor PD2 may be connected to the second output terminal OUT2.

The pull-up node control unit 1133 supplies to the first pull-up node Q1, a start signal or a previous-stage carry signal input to the start terminal ST when the first emission clock signal input to the first clock terminal CT1 has a gate-on voltage. The pull-up node control unit 1133 may include a first switching transistor ST1.

The first switching transistor ST1 is turned on by the first emission clock signal having the gate-on voltage that is input to the first clock terminal CT1 to connect the first pull-up node Q1 to the start terminal ST. A gate electrode of the first switching transistor ST1 may be connected to the first clock terminal CT1, a first electrode of the first switching transistor ST1 may be connected to the start terminal ST, and a second electrode of the first switching transistor ST1 may be connected to the first pull-up node Q1.

The first control node control unit 1134 supplies the gate-on voltage of the gate-on voltage terminal VGLT to a first control node CN1 when the first emission clock signal input to the first clock terminal CT1 has the gate-on voltage. The first control node control unit 1134 supplies the first emission clock signal input to the first clock terminal CT1 to the first control node CN1 when the first pull-up node Q1 has a gate-on voltage. The first control node control unit 1134 may include a second switching transistor ST2, a third switching transistor ST3, and a fourth switching transistor ST4.

The second switching transistor ST2 is turned on by the first emission clock signal having the gate-on voltage that is input to the first clock terminal CT1 to connect the first control node CN1 to the gate-on voltage terminal VGLT. A gate electrode of the second switching transistor ST2 may be connected to the first clock terminal CT1, a first electrode of the second switching transistor ST2 may be connected to the first control node CN1, and a second electrode of the second switching transistor ST2 may be connected to the gate-on voltage terminal VGLT.

The third switching transistor ST3 and the fourth switching transistor ST4 are turned on by the gate-on voltage of the first pull-up node Q1 to connect the first control node CN1 to the first clock terminal CT1. A gate electrode of the third switching transistor ST3 may be connected to the first pull-up node Q1, a first electrode of the third switching transistor ST3 may be connected to the first clock terminal CT1, and a second electrode of the third switching transistor ST3 may be connected to a first electrode of the fourth switching transistor ST4. A gate electrode of the fourth switching transistor ST4 may be connected to the first pull-up node Q1, the first electrode of the fourth switching transistor ST4 may be connected to the second electrode of the third switching transistor ST3, and a second electrode of the fourth switching transistor ST4 may be connected to the first control node CN1.

The second control node control unit 1135 supplies the gate-off voltage of the gate-off voltage terminal VGHT to a second control node CN2 when the first control node CN1 has a gate-on voltage. The second control node control unit 1135 supplies to the second control node CN2, the second emission clock signal input to the second clock terminal CT2 when the second pull-up node Q2 has the gate-on voltage. The second control node control unit 1135 may include a fifth switching transistor ST5, a sixth switching transistor ST6, and a second capacitor C2.

The fifth switching transistor ST5 is turned on by the gate-on voltage of the first control node CN1 to connect the second control node CN2 to the gate-off voltage terminal VGHT. A gate electrode of the fifth switching transistor ST5 may be connected to the first control node CN1, a first electrode of the fifth switching transistor ST5 may be connected to the gate-off voltage terminal VGHT, and a second electrode of the fifth switching transistor ST5 may be connected to the second control node CN2.

The sixth switching transistor ST6 is turned on by the gate-on voltage of the second pull-up node Q2 to connect the second control node CN2 to the second clock terminal CT2. A gate electrode of the sixth switching transistor ST6 may be connected to the second pull-up node Q2, a first electrode of the sixth switching transistor ST6 may be connected to the second control node CN2, and a second electrode of the sixth switching transistor ST6 may be connected to the second clock terminal CT2.

The second capacitor C2 is disposed between the second pull-up node Q2 and the second control node CN2. One electrode of the second capacitor C2 may be connected to the second pull-up node Q2, and the other electrode of the second capacitor C2 may be connected to the second control node CN2. Because the second capacitor C2 stores a voltage difference between the second pull-up node Q2 and the second control node CN2, the voltage difference between the second pull-up node Q2 and the second control node CN2 may be maintained or substantially maintained to be constant or substantially constant by the second capacitor C2.

The pull-down node control unit 1136 supplies to the pull-down node QB, a gate-on voltage of the second emission clock signal input to the second clock terminal CT2 when a fourth control node CN4 has a gate-on voltage and the second emission clock signal input to the second clock terminal CT2 has the gate-on voltage. In addition, the pull-down node control unit 1136 supplies the gate-off voltage of the gate-off voltage terminal VGHT to the pull-down node QB when the first pull-up node Q1 has the gate-on voltage. The pull-down node control unit 1136 may include a seventh switching transistor ST7, an eighth switching transistor ST8, a ninth switching transistor ST9, a third capacitor C3, and a fourth capacitor C4.

The seventh switching transistor ST7 is turned on by the gate-on voltage of the fourth control node CN4 to connect the second clock terminal CT2 to a third control node CN3. A gate electrode of the seventh switching transistor ST7 may be connected to the fourth control node CN4, a first electrode of the seventh switching transistor ST7 may be connected to the third control node CN3, and a second electrode of the seventh switching transistor ST7 may be connected to the second clock terminal CT2.

The eighth switching transistor ST8 is turned on by the gate-on voltage of the second emission clock signal input to the second clock terminal CT2 to connect the pull-down node QB to the third control node CN3. A gate electrode of the eighth switching transistor ST8 may be connected to the second clock terminal CT2, a first electrode of the eighth switching transistor ST8 may be connected to the pull-down node QB, and a second electrode of the eighth switching transistor ST8 may be connected to the third control node CN3.

The ninth switching transistor ST9 is turned on by the gate-on voltage of the first pull-up node Q1 to connect the gate-off voltage terminal VGHT to the pull-down node QB. A gate electrode of the ninth switching transistor ST9 may be connected to the first pull-up node Q1, a first electrode of the ninth switching transistor ST9 may be connected to the gate-off voltage terminal VGHT, and a second electrode of the ninth switching transistor ST9 may be connected to the pull-down node QB.

The third capacitor C3 is disposed between the third control node CN3 and the fourth control node CN4. One electrode of the third capacitor C3 may be connected to the third control node CN3, and the other electrode of the third capacitor C3 may be connected to the fourth control node CN4. Because the third capacitor C3 stores a voltage difference between the third control node CN3 and the fourth control node CN4, the voltage difference between the third control node CN3 and the fourth control node CN4 may be maintained or substantially maintained to be constant or substantially constant by the third capacitor C3.

The fourth capacitor C4 is disposed between the pull-down node QB and the gate-off voltage terminal VGHT. One electrode of the fourth capacitor C4 may be connected to the pull-down node QB, and the other electrode of the fourth capacitor C4 may be connected to the gate-off voltage terminal VGHT. Because the fourth capacitor C4 stores a voltage difference between the pull-down node QB and the gate-off voltage terminal VGHT, the voltage difference between the pull-down node QB and the gate-off voltage terminal VGHT may be maintained or substantially maintained to be constant or substantially constant by the fourth capacitor C4.

The node connection unit 1137 connects the first pull-up node Q1 and the second pull-up node Q2 to each other, and connects the first pull-up node Q1 and the third pull-up node Q3 to each other. In addition, the node connection unit 1137 connects the first control node CN1 and the fourth control node CN4 to each other. The node connection unit 1137 includes a tenth switching transistor ST10, an eleventh switching transistor ST11, and a twelfth switching transistor ST12.

The tenth switching transistor ST10 may be disposed between the first pull-up node Q1 and the second pull-up node Q2. A gate electrode of the tenth switching transistor ST10 may be connected to the gate-on voltage terminal VGLT, a first electrode of the tenth switching transistor ST10 may be connected to the first pull-up node Q1, and a second electrode of the tenth switching transistor ST10 may be connected to the second pull-up node Q2.

The eleventh switching transistor ST11 may be disposed between the first pull-up node Q1 and the third pull-up node Q3. A gate electrode of the eleventh switching transistor ST11 may be connected to the gate-on voltage terminal VGLT, a first electrode of the eleventh switching transistor ST11 may be connected to the first pull-up node Q1, and a second electrode of the eleventh switching transistor ST11 may be connected to the third pull-up node Q3.

The twelfth switching transistor ST12 may be disposed between the first control node CN1 and the fourth control node CN4. A gate electrode of the twelfth switching transistor ST12 may be connected to the gate-on voltage terminal VGLT, a first electrode of the twelfth switching transistor ST12 may be connected to the first control node CN1, and a second electrode of the twelfth switching transistor ST12 may be connected to the fourth control node CN4.

FIG. 14 shows that the first pull-up transistor PU1, the first pull-down transistor PD1, the second pull-up transistor PU2, the second pull-down transistor PD2, and the first to twelfth transistors ST1 to ST12 are formed as P-type MOSFETs. In this case, the first pull-up transistor PU1, the first pull-down transistor PD1, the second pull-up transistor PU2, the second pull-down transistor PD2, and the first to twelfth transistors ST1 to ST12 are turned on when gate low voltages are applied to the gate electrodes thereof. The gate-on voltage may be a gate low voltage, and the gate-off voltage may be a gate high voltage, but the present disclosure is not limited thereto, and the gate-on voltage and gate-off voltage may be modified according to a type of a transistor.

Any one of the first electrode and the second electrode of each of the first pull-up transistor PU1, the first pull-down transistor PD1, the second pull-up transistor PU2, the second pull-down transistor PD2, and the first to twelfth transistors ST1 to ST12 may be a source electrode, and the other of the first electrode and the second electrode of each of the first pull-up transistor PU1, the first pull-down transistor PD1, the second pull-up transistor PU2, the second pull-down transistor PD2, and the first to twelfth transistors ST1 to ST12 may be a drain electrode.

In addition, a semiconductor layer of each of the first pull-up transistor PU1, the first pull-down transistor PD1, the second pull-up transistor PU2, the second pull-down transistor PD2, and the first to twelfth transistors ST1 to ST12 may be formed of amorphous silicon (a-Si), poly silicon (Poly-Si), or an oxide semiconductor.

Figure 15:
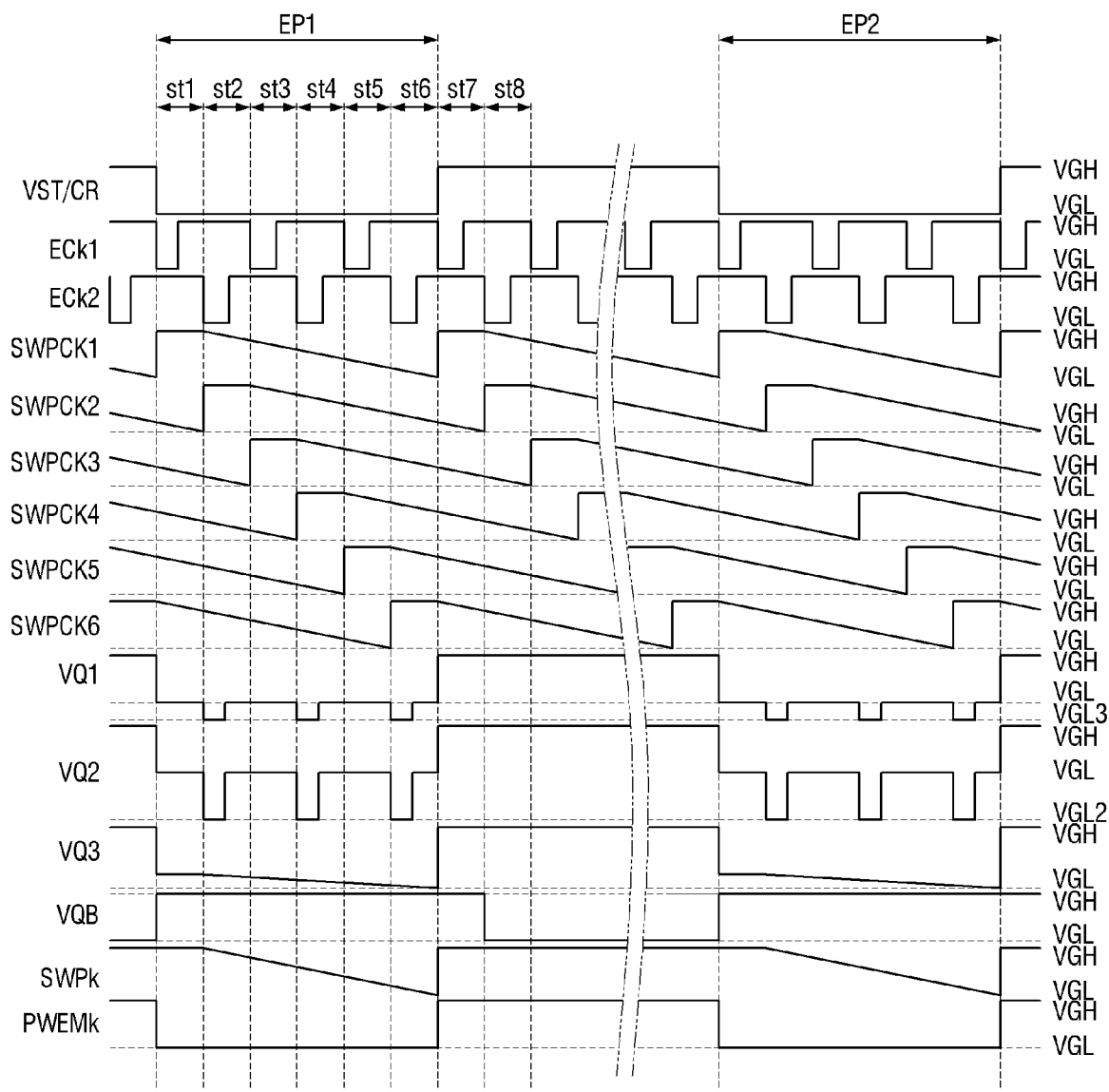
FIG. 15 is a waveform diagram illustrating a start signal or a previous-stage carry signal, a first emission clock signal, a second emission clock signal, and first to sixth sweep clock signals applied to the kth stage, a voltage of a first pull-up node, a voltage of a second pull-up node, a voltage of a third pull-up node, and a voltage of a pull-down node of the kth stage, and a kth PWM emission signal and a kth sweep signal output from the kth stage according to an embodiment.

FIG. 15 is a waveform diagram illustrating a start signal or a previous-stage carry signal, a first emission clock signal, a second emission clock signal, and first to sixth sweep clock signals that are applied to the kth stage, a voltage of a first pull-up node, a voltage of a second pull-up node, a voltage of a third pull-up node, and a voltage of a pull-down node of the kth stage, and a kth PWM emission signal and a kth sweep signal output from the kth stage according to an embodiment.

FIG. 15 illustrates a start signal VST or a previous-stage carry signal CR, a first emission clock signal ECK1, a second emission clock signal ECK2, first to sixth sweep clock signals SWPCK1 to SWPCK6, a voltage VQ1 of the first pull-up node Q1, a voltage VQ2 of the second pull-up node Q2, a voltage VQ3 of the third pull-up node Q3, and a voltage VQB of the pull-down node QB of the kth stage STAk, and the kth PWM emission signal PWEMk and the kth sweep signal SWPk in the first emission period EP1 and the second emission period EP2 of the active period ACT of the Nth frame period. In FIG. 15, first to sixth periods st1 to st6 of the first emission period EP1 and seventh and eighth periods st7 and st8 after the first emission period EP1 are shown. In addition, the first emission period EP1 and the second emission period EP2 have been illustrated in FIG. 15, but the third to nth emission periods EP3 to EPn may be the same or substantially the same as (or similar to) those shown in FIG. 15, and thus, redundant description thereof may not be repeated.

The start signal VST or the previous-stage carry signal CR may be generated as a gate-on voltage VGL during the emission periods EP1 to EPn, and may be generated as a gate-off voltage VGH during other periods. In other words, the start signal VST or the previous-stage carry signal CR may include a pulse having the gate-on voltage VGL in each of the emission periods EP1 to EPn.

The first emission clock signal ECK1 and the second emission clock signal ECK2 are clock signals having phases that are sequentially delayed. For example, the second emission clock signal ECK2 may be a signal having a phase that is delayed by one horizontal period when compared with the first emission clock signal ECK1. The first emission clock signal ECK1 and the second emission clock signal ECK2 may be repeated with two horizontal periods as a cycle. Each of the first emission clock signal ECK1 and the second emission clock signal ECK2 may include a pulse generated as a gate-on voltage VGL during a period of one horizontal period or less. FIG. 15 shows that each of the first to eighth periods st1 to st8 is equal to one horizontal period 1H. One horizontal period 1H refers to a period in which the data voltages and the PM data voltages are applied to the sub-pixels RP, GP, and BP disposed in the first row line.

The first to sixth sweep clock signals SWPCK1 to SWPCK6 are signals having phases that are sequentially delayed. For example, the second sweep clock signal SWPCK2 may be a signal having a phase that is delayed by one horizontal period when compared with the first sweep clock signal SWPCK1. The first to sixth sweep clock signals SWPCK1 to SWPCK6 may be repeated with sixth horizontal periods as a cycle. Each of the first to sixth sweep clock signals SWPCK1 to SWPCK6 may include a pulse that linearly decreases from a gate-off voltage VGH to a gate-on voltage VGL during five horizontal periods 5H.

FIGS. 16 to 19 are circuit diagrams illustrating an operation of the kth stage during first to sixth sub-periods.

Hereinafter, an operation of the kth stage STAk during the first to eighth periods st1 to st8 will be described in more detail with reference to FIGS. 15 to 19.

Figure 16:
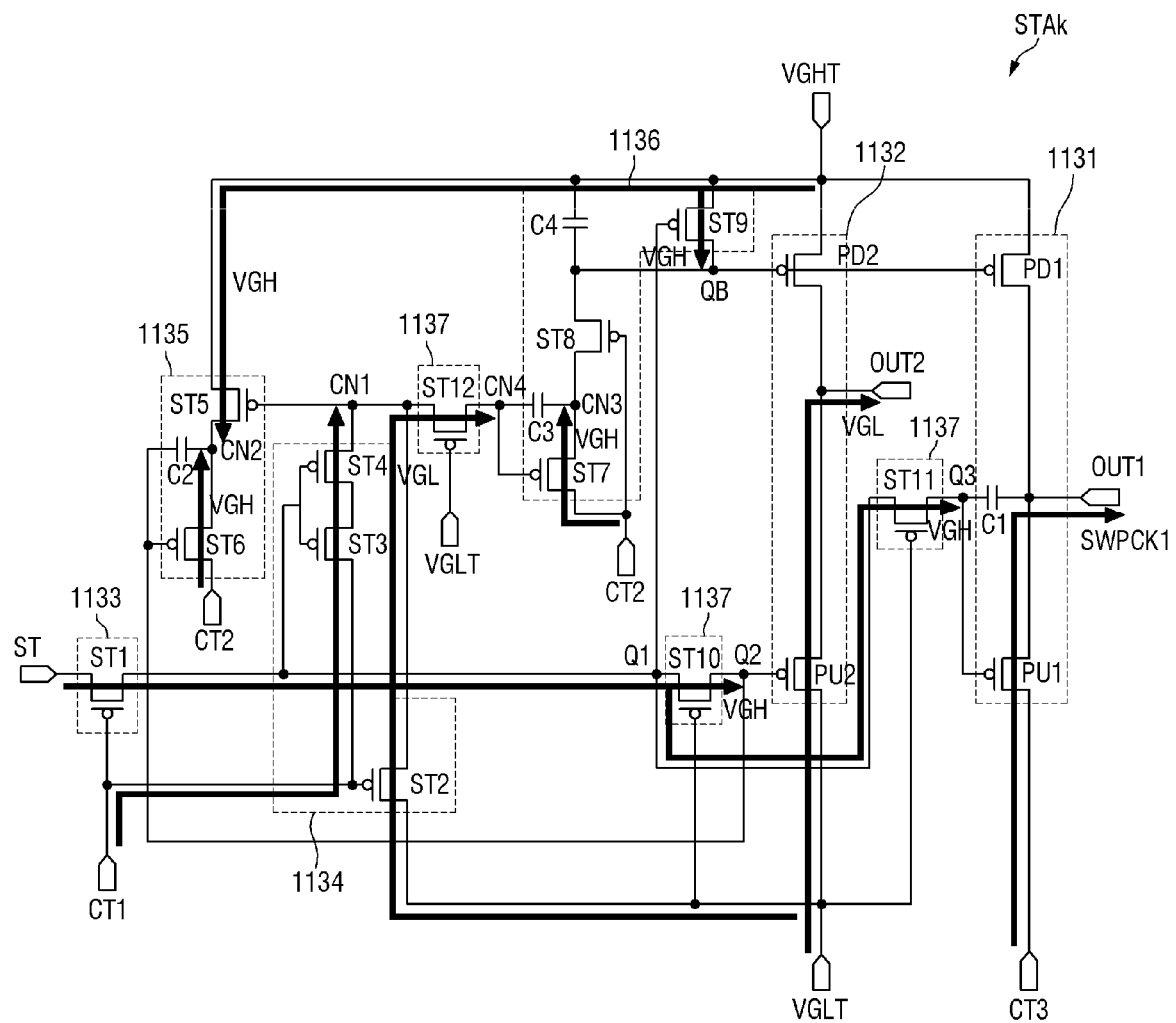
FIGS. 16-19 are circuit diagrams illustrating an operation of the kth stage during first to sixth sub-periods.

First, as illustrated in FIGS. 15 and 16, during the first period st1, the start signal VST or the previous-stage carry signal CR having the gate-on voltage VGL may be input to the start terminal ST of the kth stage STAk, the first emission clock signal ECK1 having the gate-on voltage VGL may be input to the first clock terminal CT1 of the kth stage STAk, the second emission clock signal ECK2 having the gate-off voltage VGH may be input to the second clock terminal CT2 of the kth stage STAk, and the first sweep clock signal SWPCK1 having the gate-off voltage VGH may be input to the third clock terminal CT3 of the kth stage STAk.

The first switching transistor ST1 is turned on by the first emission clock signal ECK1 having the gate-on voltage VGL to connect the first pull-up node Q1 to the start terminal ST. Accordingly, the gate-on voltage VGL of the start signal VST or the previous-stage carry signal CR may be supplied to the first pull-up node Q1.

The second switching transistor ST2 is turned on by the first emission clock signal ECK1 having the gate-on voltage VGL to connect the first control node CN1 to the gate-on voltage terminal VGLT. Accordingly, the gate-on voltage VGL of the gate-on voltage terminal VGLT may be supplied to the first control node CN1.

The third switching transistor ST3 and the fourth switching transistor ST4 are turned on by the gate-on voltage VGL of the first pull-up node Q1 to connect the first control node CN1 to the first clock terminal CT1. Accordingly, the gate-on voltage VGL of the first emission clock signal ECK1 may be supplied to the first control node CN1.

The fifth switching transistor ST5 is turned on by the gate-on voltage VGL of the first control node CN1 to connect the gate-off voltage terminal VGHT to the second control node CN2. Accordingly, the gate-off voltage VGH may be supplied to the second control node CN2.

The tenth switching transistor T10 is turned on by the gate-on voltage VGL of the gate-on voltage terminal VGLT to connect the second pull-up node Q2 to the first pull-up node Q1. Accordingly, the gate-on voltage VGL of the first pull-up node Q1 may be supplied to the second pull-up node Q2.

The sixth switching transistor ST6 is turned on by the gate-on voltage VGL of the second pull-up node Q2 to connect the second clock terminal CT2 to the second control node CN2. Accordingly, the gate-off voltage VGH of the second emission clock signal ECK2 input to the second clock terminal CT2 may be supplied to the second control node CN2.

The twelfth switching transistor ST12 is turned on by the gate-on voltage VGL of the gate-on voltage terminal VGLT to connect the fourth control node CN4 to the first control node CN1. Accordingly, the gate-on voltage VGL of the first control node CN1 may be supplied to the fourth control node CN4.

The seventh switching transistor ST7 is turned on by the gate-on voltage VGL of the fourth control node CN4 to connect the third control node CN3 to the second clock terminal CT2. Accordingly, the gate-off voltage VGH of the second emission clock signal ECK2 input to the second clock terminal CT2 may be supplied to the third control node CN3.

The ninth switching transistor ST9 is turned on by the gate-on voltage VGL of the first pull-up node Q1 to connect the pull-down node QB to the gate-off voltage terminal VGHT. Accordingly, the gate-off voltage VGH of the gate-off voltage terminal VGHT may be supplied to the pull-down node QB.

The eleventh switching transistor ST11 is turned on by the gate-on voltage VGL of the gate-on voltage terminal VGLT to connect the first pull-up node Q1 to the third pull-up node Q3. Accordingly, the gate-on voltage VGL of the first pull-up node Q1 may be supplied to the third pull-up node Q3.

The first pull-up transistor PU1 is turned on by the gate-on voltage Von of the third pull-up node Q3 to connect the first output terminal OUT1 to the third clock terminal CT3. Accordingly, the first sweep clock signal SWPCK1 input to the third clock terminal CT3 may be supplied to the first output terminal OUT1.

The second pull-up transistor PU2 is turned on by the gate-on voltage Von of the second pull-up node Q2 to connect the second output terminal OUT2 to the gate-on voltage terminal VGLT. Accordingly, the gate-on voltage VGL of the gate-on voltage terminal VGLT may be supplied to the second output terminal OUT2.

During the first period st1, the eighth switching transistor ST8, the first pull-down transistor PD1, and the second pull-down transistor PD2 may be turned off.

Figure 17:
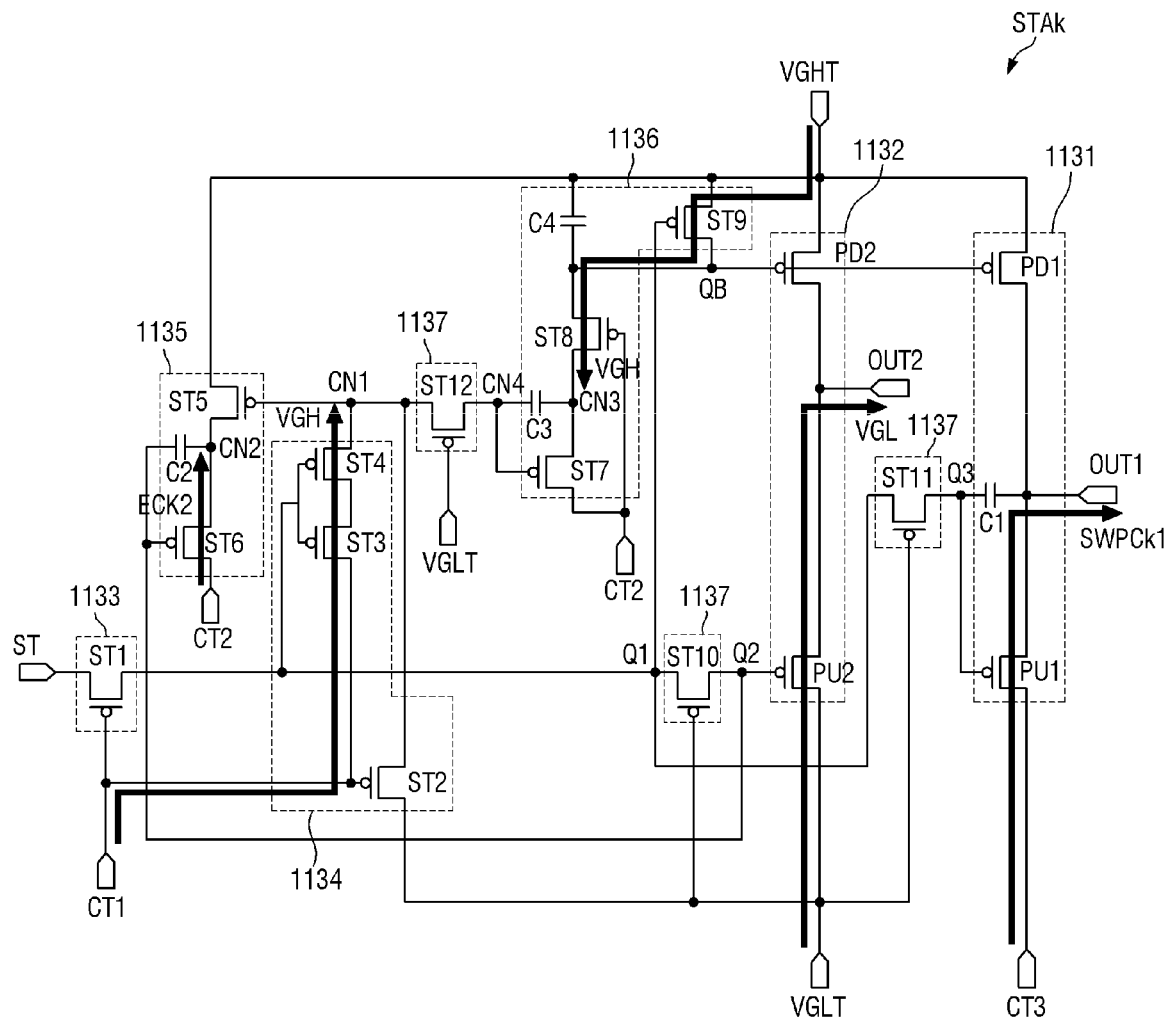

Second, as illustrated in FIGS. 15 and 17, during the second period st2, the start signal VST or the previous-stage carry signal CR having the gate-on voltage VGL may be input to the start terminal ST of the kth stage STAk, the first emission clock signal ECK1 having the gate-off voltage VGH may be input to the first clock terminal CT1 of the kth stage STAk, the second emission clock signal ECK2 having the gate-on voltage VGL may be input to the second clock terminal CT2 of the kth stage STAk, and the first sweep clock signal SWPCK1 having the gate-off voltage VGH may be input to the third clock terminal CT3 of the kth stage STAk.

The third switching transistor ST3 and the fourth switching transistor ST4 are turned on by the gate-on voltage VGL of the first pull-up node Q1 to connect the first control node CN1 to the first clock terminal CT1. Accordingly, the gate-off voltage VGH of the first emission clock signal ECK1 may be supplied to the first control node CN1.

The sixth switching transistor ST6 is turned on by the gate-on voltage VGL of the second pull-up node Q2 to connect the second clock terminal CT2 to the second control node CN2. Accordingly, the second emission clock signal ECK2 input to the second clock terminal CT2 may be supplied to the second control node CN2.

Therefore, during the second period st2, a pulse of the second emission clock signal ECK2 supplied to the second control node CN2 may be reflected in the second pull-up node Q2 through the second capacitor C2. In other words, a voltage change due to the pulse of the second emission clock signal ECK2 may be reflected in the second pull-up node Q2 through the second capacitor C2. Accordingly, the voltage of the second pull-up node Q2 may be decreased to a second gate-on voltage VGL2, and then restored to the gate-on voltage VGL during the second period st2.

Because the first pull-up node Q1 is connected to the second pull-up node Q2 through the tenth switching transistor ST10, the voltage of the first pull-up node Q1 may be decreased to a third gate-on voltage VGL3, and then restored to the gate-on voltage VGL, similar to the voltage of the second pull-up node Q2. The third pull-up node Q3 is connected to the first pull-up node Q1 through the eleventh switching transistor ST11, but the gate-on voltage VGL of the third pull-up node Q3 does not fluctuate like that of the first pull-up node Q1, such that a voltage change of the first output terminal OUT1 may be reflected in the third pull-up node Q3 by the first capacitor C1. Therefore, the voltage of the third pull-up node Q3 may be gradually decreased, similar to that of the first sweep clock signal SWPCK1.

The eighth switching transistor ST8 is turned on by the gate-on voltage VGL of the second emission clock signal ECK2 of the second clock terminal CT2 to connect the third control node CN3 to the pull-down node QB. In addition, the ninth switching transistor ST9 is turned on by the gate-on voltage VGL of the first pull-up node Q1 to connect the pull-down node QB to the gate-off voltage terminal VGHT. Accordingly, the gate-off voltage VGH of the gate-off voltage terminal VGHT may be supplied to the third control node CN3 and the pull-down node QB.

The first pull-up transistor PU1 is turned on by the gate-on voltage Von of the third pull-up node Q3 to connect the first output terminal OUT1 to the third clock terminal CT3. Accordingly, the first sweep clock signal SWPCK1 input to the third clock terminal CT3 may be supplied to the first output terminal OUT1.

The second pull-up transistor PU2 is turned on by the gate-on voltage Von of the second pull-up node Q2 to connect the second output terminal OUT2 to the gate-on voltage terminal VGLT. Accordingly, the gate-on voltage VGL of the gate-on voltage terminal VGLT may be supplied to the second output terminal OUT2.

During the second period st2, the first switching transistor ST1, the second switching transistor ST2, the fifth switching transistor ST5, the seventh switching transistor ST7, the first pull-down transistor PD1, and the second pull-down transistor PD2 may be turned off.

Operations of the kth stage STAk during the third period st3 and the fifth period st5 may be the same or substantially the same as the operation of the kth stage STAk during the first period st1. In addition, operations of the kth stage STAk during the fourth period st4 and the sixth period st6 may be the same or substantially the same as the operation of the kth stage STAk during the second period st2. Therefore, redundant description of the operations of the kth stage STAk during the third to sixth periods st3 to st6 will not be repeated.

Figure 18:
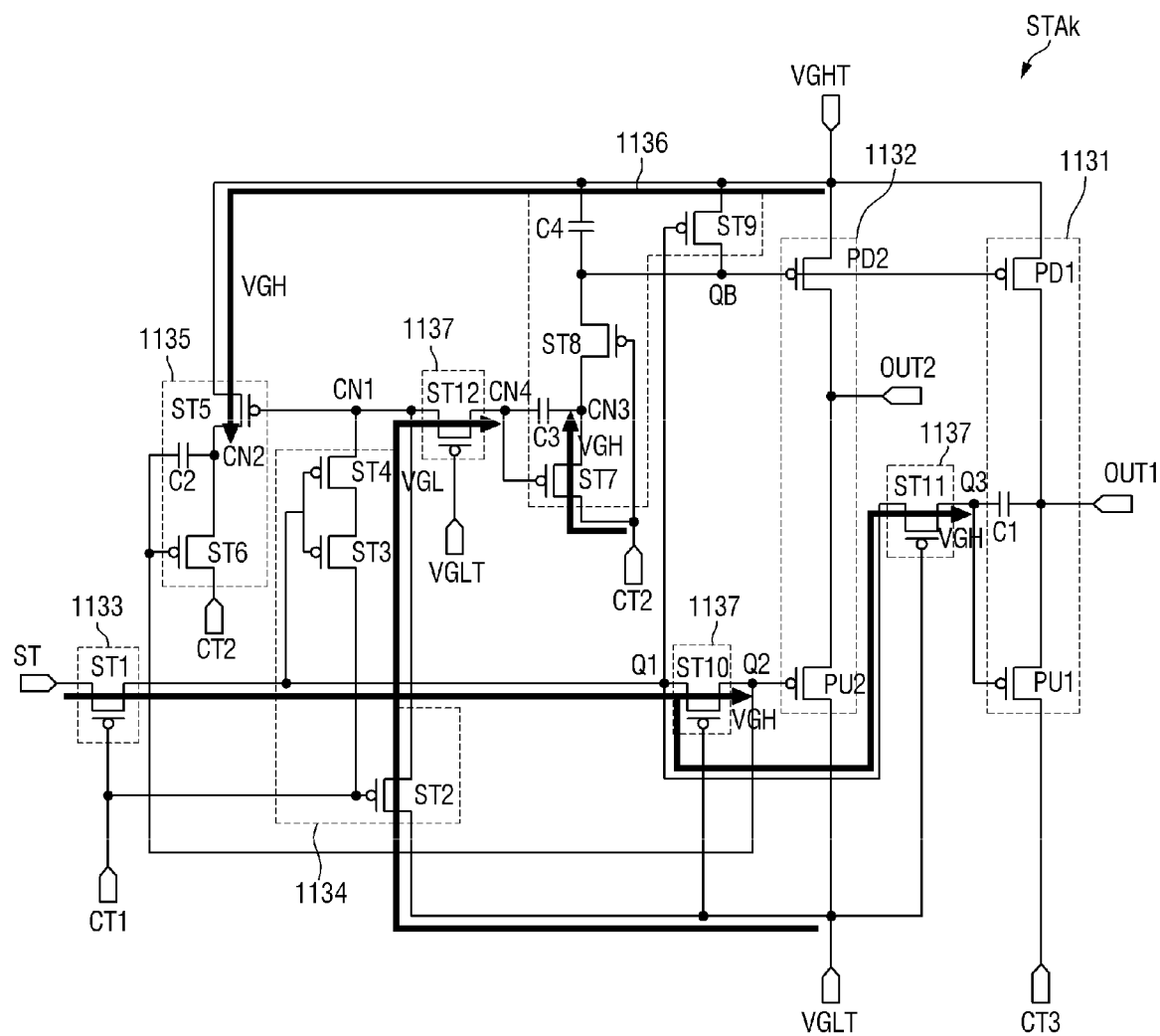

Then, as illustrated in FIGS. 15 and 18, during the seventh period st7, the start signal VST or the previous-stage carry signal CR having the gate-off voltage VGH may be input to the start terminal ST of the kth stage STAk, the first emission clock signal ECK1 having the gate-on voltage VGL may be input to the first clock terminal CT1 of the kth stage STAk, the second emission clock signal ECK2 having the gate-off voltage VGH may be input to the second clock terminal CT2 of the kth stage STAk, and the first sweep clock signal SWPCK1 having the gate-off voltage VGH may be input to the third clock terminal CT3 of the kth stage STAk.

The first switching transistor ST1 is turned on by the first emission clock signal ECK1 having the gate-on voltage VGL to connect the first pull-up node Q1 to the start terminal ST. Accordingly, the gate-off voltage VGH of the start signal VST or the previous-stage carry signal CR may be supplied to the first pull-up node Q1.

The second switching transistor ST2 is turned on by the first emission clock signal ECK1 having the gate-on voltage VGL to connect the first control node CN1 to the gate-on voltage terminal VGLT. Accordingly, the gate-on voltage VGL of the gate-on voltage terminal VGLT may be supplied to the first control node CN1.

The fifth switching transistor ST5 is turned on by the gate-on voltage VGL of the first control node CN1 to connect the gate-off voltage terminal VGHT to the second control node CN2. Accordingly, the gate-off voltage VGH may be supplied to the second control node CN2.

The tenth switching transistor T10 is turned on by the gate-on voltage VGL of the gate-on voltage terminal VGLT to connect the second pull-up node Q2 to the first pull-up node Q1. Accordingly, the gate-off voltage VGH of the first pull-up node Q1 may be supplied to the second pull-up node Q2.

The eleventh switching transistor ST11 is turned on by the gate-on voltage VGL of the gate-on voltage terminal VGLT to connect the first pull-up node Q1 to the third pull-up node Q3. Accordingly, the gate-off voltage VGH of the first pull-up node Q1 may be supplied to the third pull-up node Q3.

The twelfth switching transistor T12 is turned on by the gate-on voltage VGL of the gate-on voltage terminal VGLT to connect the fourth control node CN4 to the first control node CN1. Accordingly, the gate-on voltage VGL of the first control node CN1 may be supplied to the fourth control node CN4.

The seventh switching transistor ST7 is turned on by the gate-on voltage VGL of the fourth control node CN4 to connect the third control node CN3 to the second clock terminal CT2. Accordingly, the gate-off voltage VGH of the second emission clock signal ECK2 input to the second clock terminal CT2 may be supplied to the third control node CN3.

During the seventh period st7, the third switching transistor ST3, the fourth switching transistor ST4, the sixth switching transistor ST6, the eighth switching transistor ST8, the ninth switching transistor ST9, the first pull-up transistor PU1, the second pull-up transistor PU2, the first pull-down transistor PD1, and the second pull-down transistor PD2 may be turned off.

Figure 19:
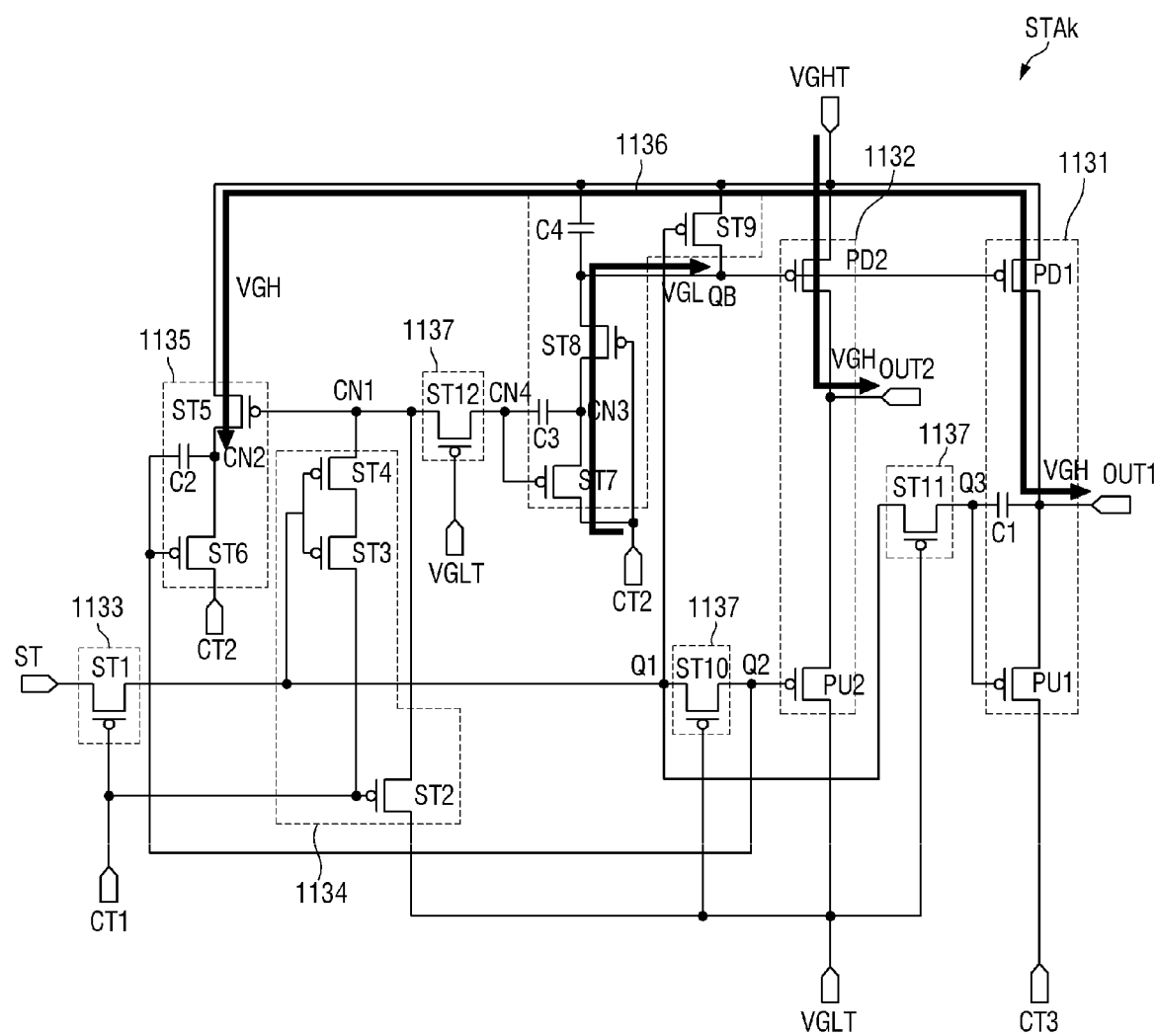

Then, as illustrated in FIGS. 15 and 19, during the eighth period st8, the start signal VST or the previous-stage carry signal CR having the gate-off voltage VGH may be input to the start terminal ST of the kth stage STAk, the first emission clock signal ECK1 having the gate-off voltage VGH may be input to the first clock terminal CT1 of the kth stage STAk, the second emission clock signal ECK2 having the gate-on voltage VGL may be input to the second clock terminal CT2 of the kth stage STAk, and the first sweep clock signal SWPCK1 having the gate-off voltage VGH may be input to the third clock terminal CT3 of the kth stage STAk.

The fifth switching transistor ST5 is turned on by the gate-on voltage VGL of the first control node CN1 to connect the gate-off voltage terminal VGHT to the second control node CN2. Accordingly, the gate-off voltage VGH may be supplied to the second control node CN2.

The seventh switching transistor ST7 is turned on by the gate-on voltage VGL of the fourth control node CN4 to connect the third control node CN3 to the second clock terminal CT2. In addition, the eighth switching transistor ST8 is turned on by the gate-on voltage VGL of the second emission clock signal ECK2 of the second clock terminal CT2 to connect the third control node CN3 to the pull-down node QB. Accordingly, the third control node CN3 and the pull-down node QB may be connected to the second clock terminal CT2. Therefore, the gate-on voltage VGL of the second emission clock signal ECK2 input to the second clock terminal CT2 may be supplied to the third control node CN3 and the pull-down node QB.

The first pull-down transistor PD1 is turned on by the gate-on voltage Von of the pull-down node QB to connect the first output terminal OUT1 to the gate-off voltage terminal VGHT. Accordingly, the gate-off voltage VGH of the gate-off voltage terminal VGHT may be supplied to the first output terminal OUT1.

The second pull-down transistor PD2 is turned on by the gate-on voltage Von of the pull-down node QB to connect the second output terminal OUT2 to the gate-off voltage terminal VGHT. Accordingly, the gate-off voltage VGH of the gate-off voltage terminal VGHT may be supplied to the second output terminal OUT2.

During the eighth period st8, the first switching transistor ST1, the second switching transistor ST2, the third switching transistor ST3, the fourth switching transistor ST4, the sixth switching transistor ST6, the first pull-up transistor PU1, and the second pull-up transistor PU2 may be turned off.

As described above, the kth stage STAk may concurrently (e.g., may simultaneously) output the kth sweep signal SWPk and the kth PWM emission signal PWMk. Accordingly, an area of the scan driver 110 may be decreased by integrating and implemented a stage for outputting the kth sweep signal SWPk and a stage for outputting the kth PWM emission signal PWMk as one stage.

Figure 20:
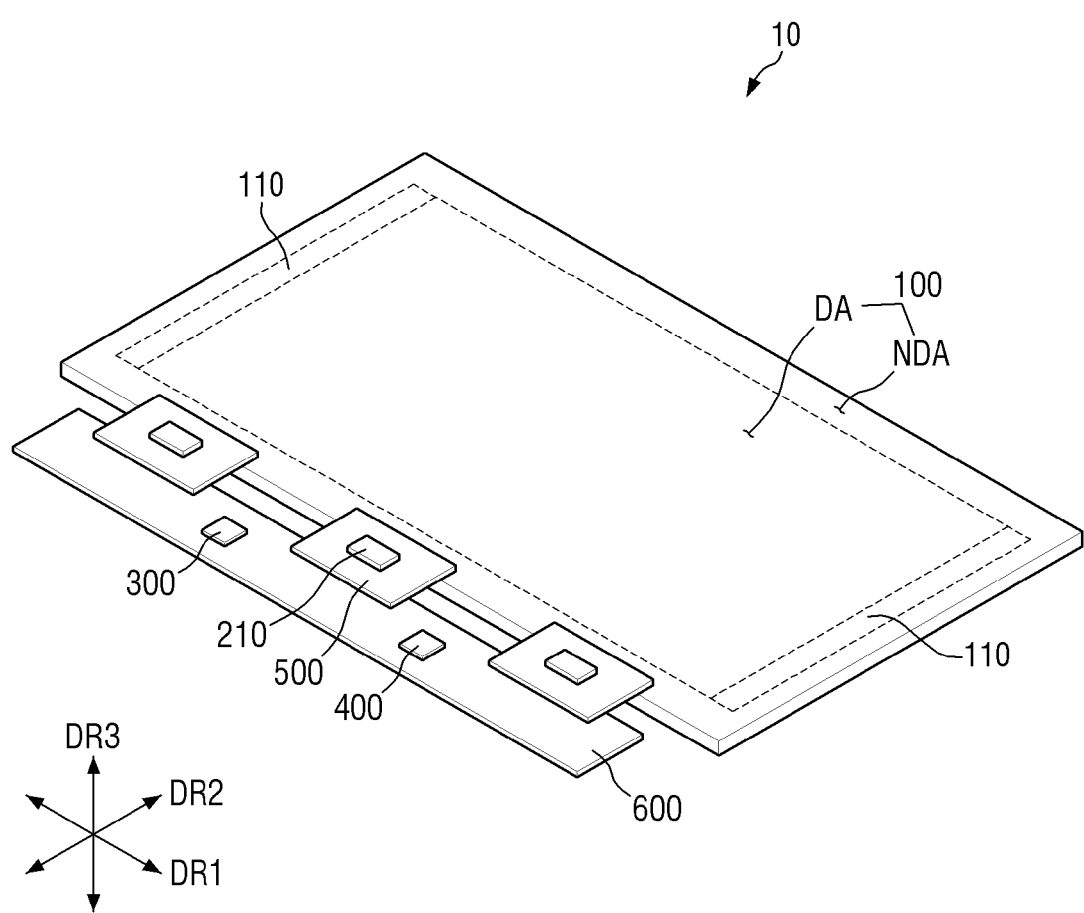
FIG. 20 is a perspective view illustrating the display device according to an embodiment.

FIG. 20 is a perspective view illustrating the display device according to an embodiment.

Referring to FIG. 20, the display device 10 is a device that displays a moving image and/or a still image, and may be used as a display screen for various suitable products, for example, such as televisions, laptop computers, monitors, billboards, and Internet of Things (IOT) devices, as well as for various suitable portable electronic devices, for example, such as mobile phones, smartphones, tablet personal computers (PCs), smart watches, watch phones, mobile communication terminals, electronic notebooks, electronic books, portable multimedia players (PMPs), navigation devices, and ultra mobile PCs (UMPCs).

The display device 10 includes a display panel 100, scan drivers 110, source driving circuits 210, and source circuit boards 500.

The display panel 100 may be formed in a rectangular shape in a plan view, and may have long sides extending in a first direction DR1 (e.g., the X-axis direction) and short sides extending in a second direction DR2 (e.g., the Y-axis direction) crossing the first direction DR1 (e.g., the X-axis direction). A corner where the long side extending in the first direction DR1 (e.g., the X-axis direction) meets the short side extending in the second direction DR2 (e.g., the Y-axis direction) may be rounded (e.g., curved) with a suitable curvature (e.g., a predetermined curvature), or may be right-angled. The shape of the display panel 100 in a plan view is not limited to the rectangular shape, and may have any suitable shape, for example, such as a polygonal shape, a circular shape, or an elliptical shape. The display panel 100 may be formed to be flat or substantially flat, but the present disclosure is not limited thereto. For example, the display panel 100 may include curved surface parts that are formed at left and right ends of the display panel 100, and having a constant curvature or a variable curvature. In addition, the display panel 100 may be formed to be flexible, such that the display panel 100 may be bent, folded, and/or rolled.

The display panel 100 may include a display area DA for displaying an image, and a non-display area NDA disposed around the display area DA. The display area DA may occupy most of the area of the display panel 100. The display area DA may be disposed at the center of the display panel 100. The sub-pixels RP, GP, and BP may be disposed at (e.g., in or on) the display area DA to display the image. Each of the sub-pixels RP, GP, and BP may include an inorganic light emitting element having an inorganic semiconductor as a light emitting element for emitting light.

The non-display area NDA may be disposed adjacent to the display area DA. The non-display area NDA may be an area outside the display area DA. For example, the non-display area NDA may be disposed to surround (e.g., around a periphery of) the display area DA. The non-display area NDA may be an edge area of the display panel 100.

The scan drivers 110 may be disposed at (e.g., in or on) the non-display area NDA. While FIG. 20 shows that the scan drivers 110 are disposed on opposite sides of the display area DA, for example, on the left side and the right side of the display area DA, the present disclosure is not limited thereto. For example, in some embodiments, the scan driver 110 may be disposed on one side of the display area DA.

In addition, display pads may be disposed at (e.g., in or on) the non-display area NDA in order to be connected to the source circuit boards 500. The display pads may be disposed on an edge of one side of the display panel 100. For example, the display pads may be disposed on an edge of a lower side of the display panel 100.

The source circuit boards 500 may be disposed on the display pads that are disposed on the edge of one side of the display panel 100. The source circuit boards 500 may be attached to the display pads using a conductive adhesive member, for example, such as an anisotropic conductive film. Accordingly, the source circuit boards 500 may be electrically connected to signal lines of the display panel 100. Each of the source circuit boards 500 may be a flexible film, for example, such as a flexible printed circuit board, a printed circuit board, or a chip on film.

The source driver 200 may include the source driving circuits 210. The source driving circuits 210 may generate data voltages, and may supply the data voltages to the display panel 100 through the source circuit boards 500.

Each of the source driving circuits 210 may be formed as an integrated circuit (IC), and may be attached onto the source circuit board 500. The source driving circuits 210 may be attached onto the display panel 100 in a chip on glass (COG) manner, a chip on plastic (COP) manner, or an ultrasonic bonding manner.

A control circuit board 600 may be attached to the source circuit boards 500 through a conductive adhesive member, for example, such as an anisotropic conductive film. The control circuit board 600 may be electrically connected to the source circuit boards 500. The control circuit board 600 may be a flexible printed circuit board or a printed circuit board.

Each of the timing controller 300 and the power supply unit 400 may be formed as an integrated circuit (IC), and may be attached onto the control circuit board 600. The timing controller 300 may supply the digital video data DATA and the timing signals TS to the source driving circuits 210. The power supply unit 400 may generate and output voltages for driving the sub-pixels of the display panel 100 and the source driving circuits 210.

Figure 21:
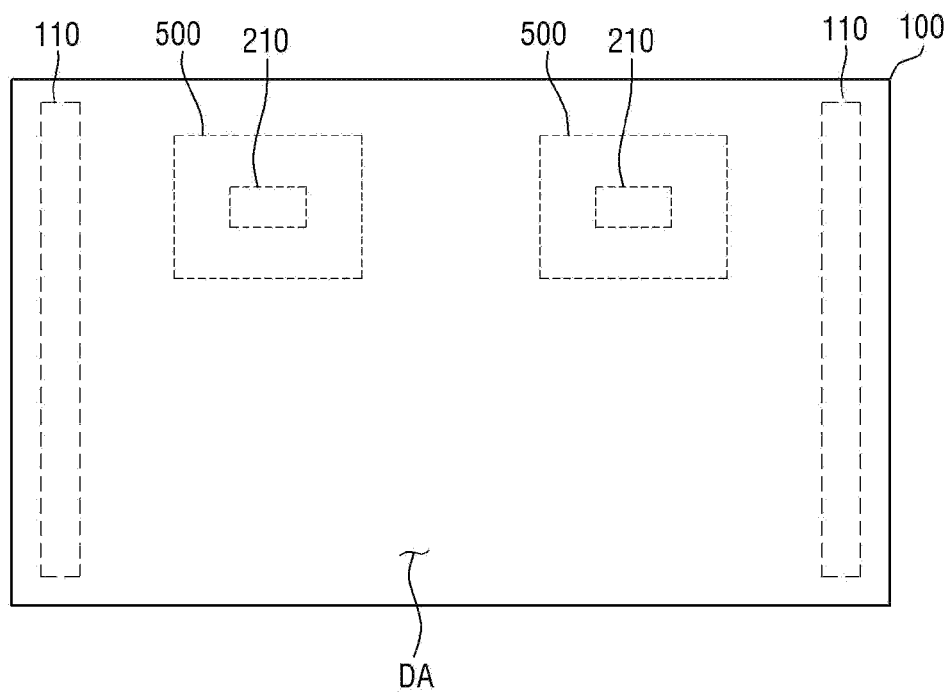
FIG. 21 is a plan view illustrating a display device according to another embodiment.

FIG. 21 is a plan view illustrating a display device according to another embodiment.

A display device according to another embodiment shown in FIG. 21 may be different from the display device according to the embodiment shown in FIG. 20, in that in FIG. 21, the display panel 100 does not include the non-display area NDA, such that the scan drivers 110 may be disposed at (e.g., in or on) the display area DA, and the source circuit boards 500 on which the source driving circuits 210 are mounted may be disposed on a rear surface of the display panel 100. Accordingly, the differences between the embodiments of FIG. 20 and FIG. 21 may be mainly described in more detail hereinafter, and redundant description thereof may not be repeated.

Referring to FIG. 21, the scan drivers 110 may be disposed at (e.g., in or on) the display area DA. The scan drivers 110 may not overlap with the sub-pixels RP, GP, and BP, and may be disposed between the sub-pixels RP, GP, and BP.

The source circuit boards 500 may be disposed on the rear surface of the display panel 100. In this case, the display pads connected to the source circuit boards 500 may be disposed on the rear surface of the display panel 100. In addition, pad connection electrodes penetrating through the display panel 100 and respectively connected to the display pads may be disposed at (e.g., in or on) the display area DA of the display panel 100.

Figure 22:
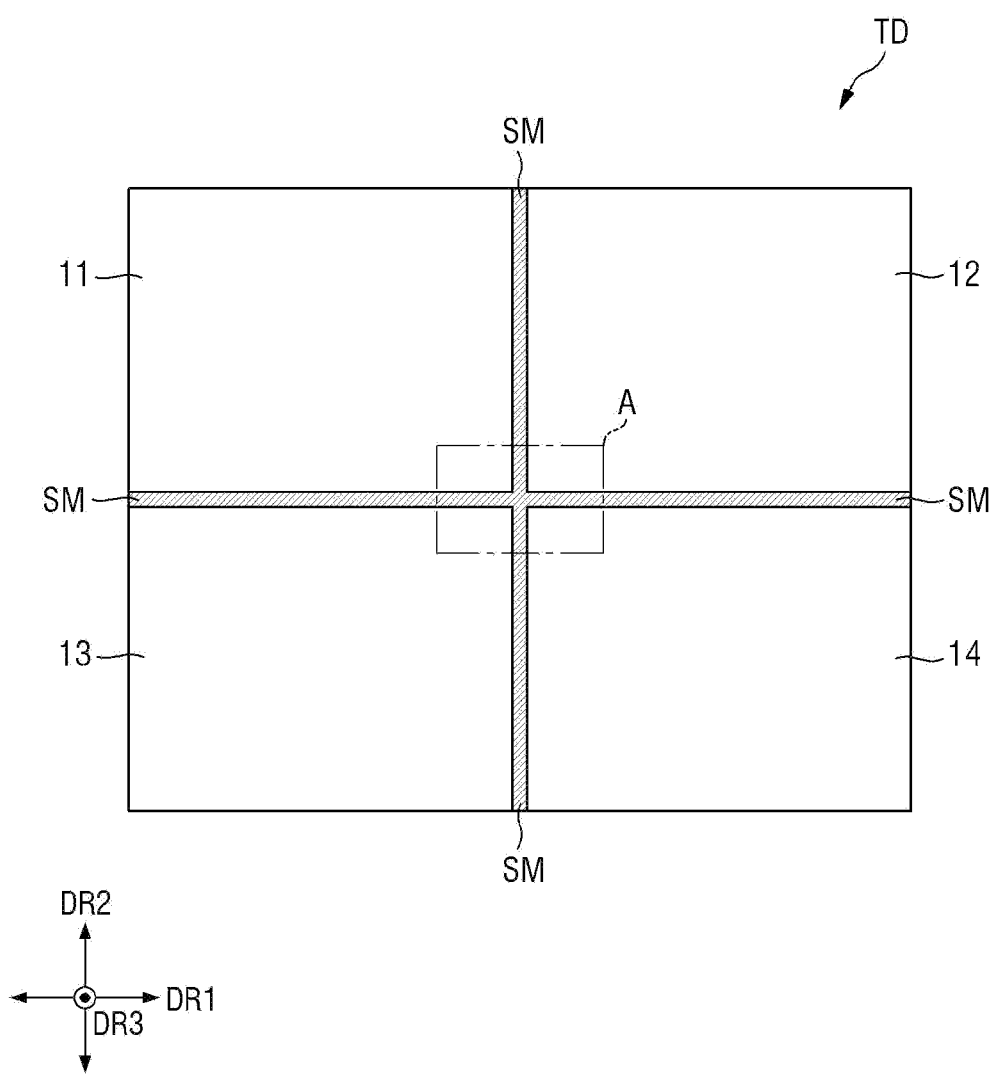
FIG. 22 is a plan view illustrating a tile-type display device including the display device illustrated in FIG. 21.

FIG. 22 is a plan view illustrating a tile-type display device including the display device illustrated in FIG. 21.

Referring to FIG. 22, a tile-type display device TD may include a plurality of display devices 11, 12, 13, and 14. For example, the tile-type display device TD may include a first display device 11, a second display device 12, a third display device 13, and a fourth display device 14.

The plurality of display devices 11, 12, 13, and 14 may be arranged in a lattice shape. For example, the first display device 11 and the second display device 12 may be disposed along the first direction DR1. The first display device 11 and the third display device 13 may be disposed along the second direction DR2. The third display device 13 and the fourth display device 14 may be disposed along the first direction DR1. The second display device 12 and the fourth display device 14 may be disposed along the second direction DR2.

The number and arrangement of the plurality of display devices 11, 12, 13, and 14 in the tiled display device TD are not limited to those illustrated in FIG. 22. The number and arrangement of the display devices 11, 12, 13, and 14 in the tile-type display device TD may be determined according to a size of each of the display devices 11, 12, 13, and 14, and a size and shape of the tile-type display device TD.

The plurality of display devices 11, 12, 13, and 14 may have the same or substantially the same size as each other, but the present disclosure is not limited thereto. For example, the plurality of display devices 11, 12, 13, and 14 may have different sizes from one another.

Each of the plurality of display devices 11, 12, 13, and 14 may have a rectangular shape (e.g., in a plan view) having long sides and short sides. The plurality of display devices 11, 12, 13, and 14 may be disposed with the long sides or the short sides connected to each other. Some or all of the plurality of display devices 11, 12, 13, and 14 may be disposed at edges of the tile-type display device TD, and may form one side of the tile-type display device TD. At least one of the plurality of display devices 11, 12, 13, and 14 may be disposed at at least one corner of the tile-type display device TD, and may form two adjacent sides of the tile-type display device TD. At least one of the plurality of display devices 11, 12, 13, and 14 may be surrounded (e.g., around a periphery thereof) by the other display devices.

The tile-type display device TD may include seam parts SM disposed between the plurality of display devices 11, 12, 13, and 14. For example, the seam parts SM may be disposed between the first display device 11 and the second display device 12, between the first display device 11 and the third display device 13, between the second display device 12 and the fourth display device 14, and between the third display device 13 and the fourth display device 14.

The seam parts SM may include coupling members or adhesive members. In this case, the plurality of display devices 11, 12, 13, and 14 may be connected to each other through the coupling members or the adhesive members of the seam parts SM.

When the scan drivers 110 are disposed at (e.g., in or on) the display area DA as illustrated in FIG. 21, and the source circuit boards 500 are disposed on the rear surface of the display panel 100, the non-display area NDA at (e.g., in or on) which the sub-pixels RP, GP, and BP are not disposed may be removed or reduced in each of the plurality of display devices 11, 12, 13, and 14, and thus, visual recognition of the seam parts SM in the tile-type display device TD may be reduced (e.g., minimized) or prevented. Accordingly, it may be possible to prevent or substantially prevent images of the plurality of display devices 11, 12, 13, and 14 from being discontinuously viewed regardless of the seam parts SM, and thus, it may be possible to increase a feeling of immersion of the images of the tile-type display device.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A sweep signal driver comprising:
    a plurality of stages configured to sequentially output emission signals to emission lines, and sequentially output sweep signals to sweep signal lines,
    wherein the plurality of stages comprises a kth stage configured to output a kth emission signal to a kth emission line, and output a kth sweep signal to a kth sweep signal line, where k is a natural number, the kth stage comprising:

a first pull-up node;
a second pull-up node;
a third pull-up node;
a node connection circuit between the first pull-up node and the second pull-up node, and between the first pull-up node and the third pull-up node;
a first output circuit configured to output a sweep clock signal of a sweep clock terminal to a first output terminal connected to the kth sweep signal line when the third pull-up node has a gate-on voltage; and
a second output circuit configured to output a gate-on voltage to a second output terminal connected to the kth emission line when the second pull-up node has a gate-on voltage, and
wherein a pulse of the kth sweep signal linearly changes from a gate-off voltage to the gate-on voltage.

2. The sweep signal driver of claim 1, wherein a pulse width of the kth emission signal is greater than a pulse width of the kth sweep signal.

3. The sweep signal driver of claim 1, wherein the kth stage further comprises a pull-down node electrically disconnected from the first pull-up node, the second pull-up node, and the third pull-up node, and
wherein each of the first output circuit and the second output circuit is configured to output a gate-off voltage when the pull-down node has a gate-on voltage.

4. The sweep signal driver of claim 3, wherein the first output circuit comprises:
a first pull-up transistor including a gate electrode connected to the third pull-up node, a first electrode connected to the first output terminal, and a second electrode connected to the sweep clock terminal;
a first pull-down transistor including a gate electrode connected to the pull-down node, a first electrode connected to a gate-off voltage terminal configured to receive the gate-off voltage, and a second electrode connected to the first output terminal; and
a first capacitor between the third pull-up node and the first output terminal.

5. The sweep signal driver of claim 3, wherein the second output circuit comprises:
a second pull-up transistor including a gate electrode connected to the second pull-up node, a first electrode connected to the second output terminal, and a second electrode connected to a gate-on voltage terminal configured to receive the gate-on voltage; and
a second pull-down transistor including a gate electrode connected to the pull-down node, a first electrode connected to a gate-off voltage terminal configured to receive the gate-off voltage, and a second electrode connected to the second output terminal.

6. The sweep signal driver of claim 3, wherein the kth stage further comprises a pull-up node control circuit configured to supply a start signal or a carry signal of a start terminal to the first pull-up node according to a first emission clock signal input to a first emission clock terminal.

7. The sweep signal driver of claim 6, wherein the pull-up node control circuit comprises a first transistor including a gate electrode connected to the first emission clock terminal, a first electrode connected to the first pull-up node, and a second electrode connected to the start terminal.

8. The sweep signal driver of claim 6, wherein the kth stage further comprises a first control node control circuit configured to supply the gate-on voltage to a first control node according to the first emission clock signal, and supply a gate-off voltage of the first emission clock signal to the first control node according to a voltage of the first pull-up node.

9. The sweep signal driver of claim 8, wherein the first control node control circuit comprises:
a second transistor including a gate electrode connected to the first emission clock terminal, a first electrode connected to the first control node, and a second electrode connected to a gate-on voltage line configured to receive the gate-on voltage;
a third transistor including a gate electrode connected to the first pull-up node, a first electrode connected to the first emission clock terminal, and a second electrode; and
a fourth transistor including a gate electrode connected to the first pull-up node, a first electrode connected to the second electrode of the third transistor, and a second electrode connected to the first control node.

10. The sweep signal driver of claim 8, wherein the kth stage further comprises a second control node control circuit configured to supply a gate-off voltage to a second control node when the first control node has a gate-on voltage, and supply a second emission clock signal of a second emission clock terminal to the second control node when the second pull-up node has a gate-on voltage.

11. The sweep signal driver of claim 10, wherein the second control node control circuit comprises:
a fifth transistor including a gate electrode connected to the first control node, a first electrode connected to a gate-off voltage terminal configured to receive the gate-off voltage, and a second electrode connected to the second control node;
a sixth transistor including a gate electrode connected to the second pull-up node, a first electrode connected to the second control node, and a second electrode connected to the second emission clock terminal; and
a second capacitor between the second pull-up node and the second control node.

12. The sweep signal driver of claim 10, wherein the node connection circuit is located between the first control node and a third control node, and
wherein the kth stage further comprises a pull-down node control circuit configured to supply a gate-on voltage of the second emission clock signal to the pull-down node when the third control node has a gate-on voltage and the second emission clock signal of the second emission clock terminal has the gate-on voltage.

13. The sweep signal driver of claim 12, wherein the pull-down node control circuit is configured to supply a gate-off voltage to the pull-down node when the first pull-up node has a gate-on voltage.

14. The sweep signal driver of claim 13, wherein the pull-down node control circuit comprises:
a seventh transistor including a gate electrode connected to the third control node, a first electrode connected to the second emission clock terminal, and a second electrode connected to a fourth control node;
an eighth transistor including a gate electrode connected to the second emission clock terminal, a first electrode connected to the fourth control node, and a second electrode connected to the pull-down node;
a ninth transistor including a gate electrode connected to the first pull-up node, a first electrode connected to a gate-off voltage terminal configured to receive the gate-off voltage, and a second electrode connected to the pull-down node;
a third capacitor between the third control node and the fourth control node; and
a fourth capacitor between the pull-down node and the gate-off voltage terminal.

15. The sweep signal driver of claim 12, wherein the node connection circuit comprises:
a tenth transistor including a gate electrode connected to a gate-off voltage terminal configured to receive the gate-off voltage, a first electrode connected to the first pull-up node, and a second electrode connected to the second pull-up node;
an eleventh transistor including a gate electrode connected to a gate-on voltage terminal, a first electrode connected to the first pull-up node, and a second electrode connected to the third pull-up node; and
a twelfth transistor including a gate electrode connected to the gate-on voltage terminal, a first electrode connected to the third control node, and a second electrode connected to the first control node.

16. A display device comprising:
a display panel comprising:
data lines;
sweep signal lines and pulse width modulation (PWM) emission lines crossing the data lines; and
sub-pixels connected to the data lines, the sweep signal lines, and the PWM emission lines;
a source driver configured to apply data voltages to the data lines; and
a sweep signal driver comprising a plurality of stages configured to sequentially output PWM emission signals to the PWM emission lines, and sequentially output sweep signals to the sweep signal lines,
wherein:
the plurality of stages comprises a kth stage configured to output a kth PWM emission signal to a kth PWM emission line, and output a kth sweep signal to a kth sweep signal line, where k is a natural number;
a pulse of the kth PWM emission signal includes a gate-on voltage;
a pulse of the kth sweep signal linearly changes from a gate-off voltage to the gate-on voltage;
a pulse width of the kth PWM emission signal is greater than a pulse width of the kth sweep signal; and
an end of the pulse of the kth PWM emission signal and an end of the pulse of the kth sweep signal are synchronized with each other.

17. A display device comprising:
a display panel comprising:
data lines;
sweep signal lines and pulse width modulation (PWM) emission lines crossing the data lines; and
sub-pixels connected to the data lines, the sweep signal lines, and the PWM emission lines;
a source driver configured to apply data voltages to the data lines;
a sweep signal driver comprising a plurality of stages configured to sequentially output PWM emission signals to the PWM emission lines, and sequentially output sweep signals to the sweep signal lines,
wherein:
the plurality of stages comprises a kth stage configured to output a kth PWM emission signal to a kth PWM emission line, and output a kth sweep signal to a kth sweep signal line, where k is a natural number;
a pulse of the kth PWM emission signal includes a gate-on voltage;
a pulse of the kth sweep signal linearly changes from a gate-off voltage to the gate-on voltage; and
a pulse width of the kth PWM emission signal is greater than a pulse width of the kth sweep signal; and
an emission signal driver configured to sequentially output pulse amplitude modulation (PAM) emission signals to PAM emission lines that cross the data lines,
wherein a pulse of a kth PAM emission signal output to a kth PAM emission line of the PAM emission lines includes a gate-on voltage, and
a pulse width of the kth PAM emission signal is the same as the pulse width of the kth sweep signal.

18. The display device of claim 17, wherein the pulse of the kth PWM emission signal overlaps with the pulse of the kth sweep signal and the pulse of the kth PAM emission signal.

19. The display device of claim 17, wherein the kth stage comprises:
a first pull-up node, a second pull-up node, and a third pull-up node;
a node connection circuit between the first pull-up node and the second pull-up node, and between the first pull-up node and the third pull-up node;
a first output circuit configured to output a sweep clock signal of a sweep clock terminal to a first output terminal connected to the kth sweep signal line when the third pull-up node has a gate-on voltage; and
a second output circuit configured to output a gate-on voltage to a second output terminal connected to the kth PWM emission line when the second pull-up node has a gate-on voltage.

20. The display device of claim 19, wherein the kth stage further comprises a pull-down node electrically disconnected from the first pull-up node, the second pull-up node, and the third pull-up node, and
each of the first output circuit and the second output circuit is configured to output a gate-off voltage when the pull-down node has a gate-on voltage.

* * * * *